(12) United States Patent
Sato et al.

(10) Patent No.: US 10,304,828 B2
(45) Date of Patent: May 28, 2019

(54) IMAGING DEVICE AND MANUFACTURING METHOD THEREOF

(71) Applicant: Panasonic Intellectual Property Management Co., Ltd., Osaka (JP)

(72) Inventors: Yoshihiro Sato, Osaka (JP); Ryota Sakaida, Toyama (JP); Satoshi Shibata, Osaka (JP); Taiji Noda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/698,019

(22) Filed: Sep. 7, 2017

(65) Prior Publication Data

US 2018/0083004 A1 Mar. 22, 2018

(30) Foreign Application Priority Data

Sep. 20, 2016 (JP) .................................. 2016-183389

(51) Int. Cl.
*H01L 27/092* (2006.01)
*H01L 27/146* (2006.01)

(52) U.S. Cl.
CPC .... *H01L 27/0922* (2013.01); *H01L 27/14612* (2013.01); *H01L 27/14621* (2013.01); *H01L 27/14643* (2013.01)

(58) Field of Classification Search
None
See application file for complete search history.

(56) References Cited

U.S. PATENT DOCUMENTS 5,744,823 A * 4/1998 Harkin .................... H01L 27/12
257/300
2009/0179293 A1 7/2009 Shim et al.
2014/0043510 A1 2/2014 Kasuga et al.
2015/0109503 A1* 4/2015 Mori ................. H01L 27/14603
348/300

(Continued)

FOREIGN PATENT DOCUMENTS

JP 2009-164604 7/2009
JP 2010-045292 2/2010

(Continued)

*Primary Examiner* — William A Harriston
(74) *Attorney, Agent, or Firm* — McDermott Will & Emery LLP

(57) ABSTRACT

An imaging device includes: a semiconductor substrate; a first insulating layer covering a surface of the semiconductor substrate, the first insulating layer including first and second portions, a thickness of the first portion being greater than a thickness of the second portion; and an imaging cell. The imaging cell includes: a first transistor including a first gate insulating layer and an impurity region in the semiconductor substrate as one of a source and a drain; a second transistor including a gate electrode and a second gate insulating layer; and a photoelectric converter electrically connected to the gate electrode and the impurity region. The first portion covers a portion of the impurity region, the portion being exposed to the surface of the semiconductor substrate. The first gate insulating layer is a part of the first portion. The second gate insulating layer is a part of the second portion.

20 Claims, 45 Drawing Sheets

(56) References Cited

U.S. PATENT DOCUMENTS

2016/0156817 A1    6/2016  Tezuka et al.
2017/0250216 A1*   8/2017  Sato ................ H01L 27/14665

FOREIGN PATENT DOCUMENTS

| JP | 2012-151369 | 8/2012 |
| JP | 2016-103615 | 6/2016 |
| WO | 2012/147302 | 11/2012 |
| WO | 2014/002330 | 1/2014 |

* cited by examiner

IMAGING DEVICE AND MANUFACTURING METHOD THEREOF

BACKGROUND

1. Technical Field

The present disclosure relates to an imaging device.

2. Description of the Related Art

Charge coupled device (CCD) image sensors and complementary metal oxide semiconductor (CMOS) image sensors are widely used in digital cameras and the like. As is well known, each of these image sensors includes photodiodes formed in a semiconductor substrate.

In the meantime, there has been proposed a structure in which a photoelectric converter including a photoelectric conversion layer is placed above a semiconductor substrate (see International Publications Nos. WO 2014/002330 and WO 2012/147302, for example). An imaging device having the above-mentioned structure is occasionally called a stacked type imaging device. In the stacked type imaging device, electric charges generated by photoelectric conversion are accumulated in a charge accumulation region (which is called a "floating diffusion"). A signal corresponding to an amount of charges accumulated in the charge accumulation region is read out through a CCD circuit or a CMOS circuit formed in the semiconductor substrate.

SUMMARY

In the stacked type imaging device, a leakage current (which may be referred to as a "dark current" as appropriate) from the charge accumulation region or to the charge accumulation region may cause deterioration of an obtained image. Hence, reduction of the leakage current is beneficial for the imaging device.

One non-limiting and exemplary embodiment of the present disclosure provides the following imaging device.

In one general aspect, the techniques disclosed here feature an imaging device including: a semiconductor substrate; a first insulating layer covering a surface of the semiconductor substrate, the first insulating layer including a first portion and a second portion, a thickness of the first portion being greater than a thickness of the second portion; and an imaging cell including: a first transistor including a first gate electrode and a first gate insulating layer, the first gate insulating layer being located between the first gate electrode and the surface of the semiconductor substrate, the first transistor further including a first impurity region in the semiconductor substrate as one of a source and a drain of the first transistor; a second transistor including a second gate electrode and a second gate insulating layer, the second gate insulating layer being located between the second gate electrode and the surface of semiconductor substrate; and a photoelectric converter electrically connected to the second gate electrode and the first impurity region. The first portion covers a portion of the first impurity region, the portion being exposed to the surface of the semiconductor substrate. The first gate insulating layer is a part of the first portion, and the second gate insulating layer is a part of the second portion.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Knowledge of Inventors)

Figure 1:
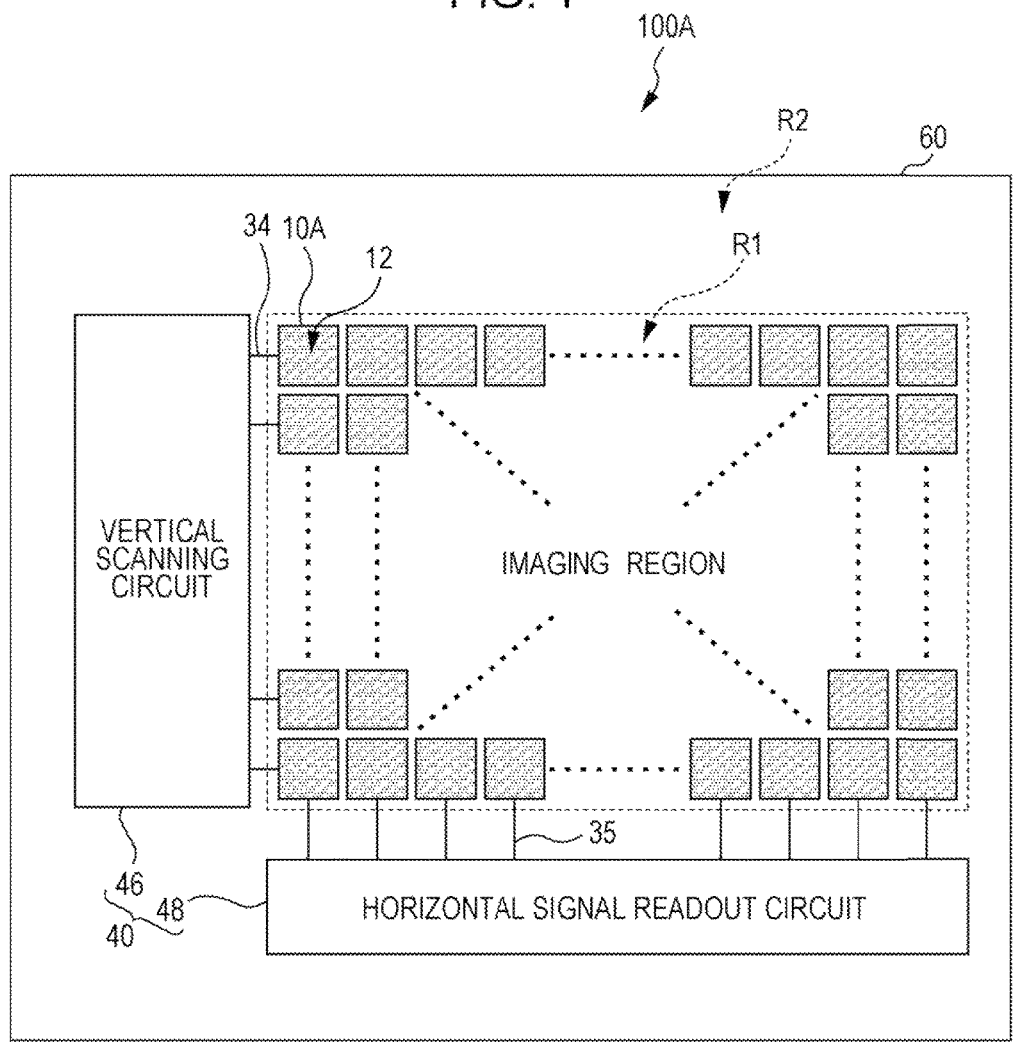
FIG. 1 is a diagram showing an exemplary configuration of an imaging device according to a first embodiment of the present disclosure.

In general, a stacked type imaging device has a device structure in which a photoelectric converter placed above a semiconductor substrate is electrically connected to a readout circuit formed on the semiconductor substrate. For example, in a structure shown in FIG. 2A of International Publication No. WO 2014/002330 mentioned above, a contact 33 is connected to a charge accumulation region 14 formed in a semiconductor substrate, and a photoelectric conversion layer 13 is electrically connected to the charge accumulation region 14 through the contact 33.

A portion around a contact point between the semiconductor substrate and the contact may include various p-n junctions. A depleted layer is formed in the vicinity of each of these p-n junctions. Charge recombination in the depleted layer in the vicinity of the p-n junction may cause occurrence of a leakage current. Particularly, a depleted layer in the vicinity of a surface of the semiconductor substrate has a large impact on the occurrence of the leakage current.

The inventors involved in the present disclosure focused on impacts of formation of various circuits including the readout circuit, on the surface of the semiconductor substrate. According to the examination conducted by the inventors, the semiconductor substrate is damaged by etching (dry etching, in particular), and a leakage current is increased due to an increase of crystal defects (which may also be referred to as an interface state) around the contact on the surface of the semiconductor substrate. The examination by the inventors also reveals that the damage on the semiconductor substrate by the etching is likely to occur even when the surface of the semiconductor substrate is not exposed.

The inventors have conducted earnest investigation in view of the above-mentioned examination results. As a consequence, the inventors have reached a conclusion that a leakage current attributed to damage on a semiconductor substrate due to etching can be suppressed by providing an insulating layer on the semiconductor substrate, and rendering a portion of the insulating layer being placed on an impurity region of the semiconductor substrate for temporarily holding signals charges relatively thicker.

Outlines of aspects of the present disclosure are as described below.

[Item 1]

An imaging device including:

a semiconductor substrate;

a first insulating layer covering a surface of the semiconductor substrate, the first insulating layer including a first portion and a second portion, a thickness of the first portion being greater than a thickness of the second portion; and an imaging cell including:

a first transistor including a first gate electrode and a first gate insulating layer, the first gate insulating layer being located between the first gate electrode and the surface of the semiconductor substrate, the first transistor further including a first impurity region in the semiconductor substrate as one of a source and a drain of the first transistor;

a second transistor including a second gate electrode and a second gate insulating layer, the second gate insulating layer being located between the second gate electrode and the surface of semiconductor substrate; and a photoelectric converter electrically connected to the second gate electrode and the first impurity region, wherein the first portion covers a portion of the first impurity region, the portion being exposed to the surface of the semiconductor substrate, the first gate insulating layer is a part of the first portion, and the second gate insulating layer is a part of the second portion.

According to this configuration, there is provided the imaging device capable of shooting an image at high image quality while suppressing an effect of a dark current.

[Item 2]

The imaging device according to Item 1, wherein the imaging cell includes a first plug electrically connected to the photoelectric converter, the first plug penetrating the first portion and being directly connected to the first impurity region, the first impurity region includes a first region and a second region, an impurity concentration of the second region being greater than an impurity concentration of the first region, and the first plug is directly connected to the second region.

According to this configuration, contact resistance can be reduced.

[Item 3]

The imaging device according to any Item described above, wherein the imaging cell includes a second impurity region in the semiconductor substrate, the first transistor includes the second impurity region as the other of the source and the drain of the first transistor, the first portion covers a portion of the second impurity region, and the second portion covers another portion of the second impurity region.

[Item 4]

The imaging device according to any Item described above, wherein an implantation depth of a portion of the second impurity region overlapping the first portion in a plan view is smaller than an implantation depth of a portion of the second impurity region overlapping the second portion in the plan view.

[Item 5]

The imaging device according to any Item described above, wherein the imaging cell includes a third impurity region in the semiconductor substrate, the second transistor includes the third impurity region as one of a source and a drain of the second transistor, and an implantation depth of the first impurity region is greater than implantation depths of the second impurity region and the third impurity region.

[Item 6]

The imaging device according to any Item described above, wherein the imaging cell includes a third transistor electrically connected between one of a source and a drain of the second transistor and the other of the source and the drain of the first transistor.

[Item 7]

The imaging device according to any Item described above, further including:

an inverting amplifier electrically connected between the third transistor and the other of the source and the drain of the first transistor.

[Item 8]

The imaging device according to any Item described above, wherein an implantation depth of the first impurity region is greater than an implantation depth of the second impurity region.

[Item 9]

The imaging device according to any Item described above, wherein the imaging cell includes, in the semiconductor substrate, a second impurity region adjacent to the first impurity region, a conductive type of second impurity region being different from a conductive type of the first impurity region, and the first portion covers a portion of the second impurity region, the portion being exposed to the surface of the semiconductor substrate.

[Item 10]

The imaging device according to any Item described above, wherein the semiconductor substrate includes an imaging region where the imaging cell is located, and a peripheral region where a peripheral circuit is located, the peripheral circuit being electrically connected to the imaging cell, the peripheral circuitry includes a third transistor including a third gate electrode and a third gate insulating layer, the third gate insulating layer being located between the third gate electrode and the surface of the semiconductor substrate, the third transistor further including the second impurity region in the semiconductor substrate as one of a source and a drain of the third transistor, and the third gate insulating layer is a part of the second portion.

According to this configuration, the transistor having a high current driving capability can be placed in the peripheral circuitry.

[Item 11]

The imaging device according to any Item described above, wherein at least one of the second impurity region and the third gate electrode includes a metal silicide layer, and neither the first impurity region nor the first gate electrode includes a metal silicide layer.

According to this configuration, in the imaging region, diffusion of the metal from the silicide to the impurity region in the semiconductor substrate can be prevented.

[Item 12]

The imaging device according to any Item described above, further including:

a second insulating layer covering the surface of the semiconductor substrate and the first insulating layer, wherein the second insulating layer includes a third portion spaced from the other portion of the second insulating layer, the third portion covering a side surface of the third gate electrode, the second impurity region includes a first region and a second region, an impurity concentration of the second region being greater than an impurity concentration of the first region, the first region is located between the second region and the third gate electrode in a plan view, and the third portion overlaps the first region in the plan view, the third portion not overlapping the second region and the third gate electrode in the plan view.

[Item 13]

The imaging device according to any Item described above, wherein the second insulating layer includes a fourth portion covering an upper surface and a side surface of the first gate electrode.

[Item 14]

The imaging device according to any Item described above, wherein the imaging cell includes a first plug directly connected to the first gate electrode of the first transistor, wherein the fourth portion covers an upper surface and a side surface of the first plug.

[Item 15]

The imaging device according to any Item described above, wherein the imaging cell further includes a first plug penetrating the first portion and being directly connected to the first impurity region, wherein a distance between the first gate electrode and the first plug is equal to or less than twice a thickness of the second insulating layer in a direction perpendicular to the surface of the semiconductor substrate, and the second insulating layer includes a fourth portion located between the first gate electrode and the first plug in the plan view.

[Item 16]

The imaging device according to any Item described above, further including:

an intermediate insulating layer located between the first insulating layer and the second insulating layer, wherein the intermediate insulating layer is located between the third portion and the third gate electrode, and between the third portion and the first insulating layer.

[Item 17]

The imaging device according to any Item described above, further including:

an intermediate insulating layer located between the first insulating layer and the second insulating layer, wherein the intermediate insulating layer covers an upper surface and a side surface of the first gate electrode.

[Item 18]

The imaging device according to any Item described above, wherein an implantation depth of the second region is greater than an implantation depth of the first region.

According to this configuration, it is possible to use the third region as an extension or a lightly doped drain (LDD).

[Item 19]

The imaging device according to any Item described above, wherein the imaging cell includes, in the semiconductor substrate, a second impurity region located between the first transistor and the second transistor, second impurity region functioning as an element isolation region, the first portion covers a portion of the second impurity region, the second portion covers another portion of the second impurity region, and an implantation depth of a portion of the second impurity region overlapping the first portion in a plan view is smaller than an implantation depth of a portion of the second impurity region overlapping the second portion in the plan view.

According to this configuration, it is possible to reduce a strength of an electric field attributed to a p-n junction around the impurity region functioning as a part of a charge accumulation region, while further ensuring electrical isolation between the elements.

[Item 20]

A manufacturing method of an imaging device including:

(A) preparing a semiconductor substrate provided with a circuit including a first transistor and a second transistor;

(B) forming an interlayer insulating layer on the semiconductor substrate so as to cover the circuit; and (C) placing a photoelectric converter on the interlayer insulating layer, wherein the (A) includes (Aa) forming a first impurity region in the semiconductor substrate, the first impurity region functioning as one of a source and a drain of the first transistor, (Ab) forming a first insulating layer on the semiconductor substrate, the first insulating layer including a first portion covering the first impurity region, the first portion having a greater area than an area of the first impurity region, and a second portion thinner than the first portion, (Ac) forming a first electrode functioning as a gate electrode of the first transistor and a second electrode functioning as a gate electrode of the second transistor on a first portion and a second portion of the first insulating layer, respectively, (Ad) forming a second impurity region and a third impurity region in the semiconductor substrate by ion implantation, the second impurity region functioning as one of a source and a drain of the second transistor, and the third impurity region functioning as the other of the source and the drain of the first transistor, (Ae) forming a second insulating layer covering the first electrode, the second electrode, and the first insulating layer, (Af) forming a first contact hole, a second contact hole, a third contact hole, and a fourth contact hole in the first insulating layer and the second insulating layer at portions above a part of the first impurity region, above a part of the third impurity region, above a part of the first electrode, and above a part of the second electrode, respectively, and (Ag) forming a first plug connected to the first impurity region through the first contact hole, a second plug connected to the third impurity region through the second contact hole, a third plug connected to the first electrode through the third contact hole, and a fourth plug connected to the second electrode through the fourth contact hole, the (B) includes (Ba) forming in the interlayer insulating layer, a first connecting portion including a fifth plug with one end connected to the third plug, and a sixth plug with one end connected to the fourth plug, a seventh plug with one end connected to the first plug, and an eighth plug with one end connected to the second plug, the (C) includes (Ca) electrically connecting the photoelectric converter to the first connecting portion, the first transistor involves a part of the first portion of the first insulating layer as a gate insulating layer, and the second transistor involves a part of the second portion of the first insulating layer as a gate insulating layer.

[Item 21]

The manufacturing method of an imaging device according to Item 20, wherein the (Af) includes (Af1) forming a fifth contact hole in the first insulating layer and the second insulating layer at a portion above a part of the second impurity region, and the (A) includes (Af2), to be carried out between the (Af1) and the (Ag), forming regions having a relatively high impurity concentration in the first impurity region, the third impurity region, and the second impurity region through the first contact hole, the second contact hole, and the fifth contact hole, respectively.

[Item 22]

The manufacturing method of an imaging device according to Item 20 or 21, wherein the (Ae) includes (Ae1) forming the second insulating layer by stacking two or more insulating layers.

[Item 23]

The manufacturing method of an imaging device according to any one of Items 20 to 22, wherein the (Ab) includes (Ab1) selectively forming a third insulating layer on a region of the surface of the semiconductor substrate overlapping at least the first impurity region, and (Ab2) forming the first insulating layer including the third insulating layer as a part of the first insulating layer, as well as including the first portion and the second portion, on the surface by oxidation of the surface.

[Item 24]

The manufacturing method of an imaging device according to any one of Items 20 to 23, wherein the circuit includes a peripheral circuitry placed in a peripheral region of the semiconductor substrate placed on the outside of a region overlapping the photoelectric converter, the peripheral circuitry including a third transistor, the (Ab) includes (Ab3) forming the second portion of the first insulating layer in the peripheral region of the semiconductor substrate, the (Ac) includes (Ac1) forming a third electrode functioning as a gate electrode of the third transistor on the second portion of the first insulating layer formed in the peripheral region, the (Ad) includes (Ad1) forming a fourth impurity region and a fifth impurity region in the semiconductor substrate while using the third electrode as a mask, the (Ae) includes (Ae2) covering the third electrode and the first insulating layer in the peripheral region with the second insulating layer, and the third transistor involves a part of the first portion of the first insulating layer as a gate insulating layer.

[Item 25]

The manufacturing method of an imaging device according to Item 24, wherein the (A) includes (Ah), to be carried out after the process (Ag), selectively removing the first insulating layer and the second insulating layer from above the fourth impurity region and above the fifth impurity region except in the vicinity of the third electrode, and selectively removing the second insulating layer from above the third electrode.

[Item 26]

The manufacturing method of an imaging device according to Item 25, wherein the (A) includes (Ai), to be carried out after the process (Ah), forming a first region and a second region having a relatively high impurity concentration in the fourth impurity region and the fifth impurity region, respectively, while using the first insulating layer and the second insulating layer collectively as a mask.

[Item 27]

The manufacturing method of an imaging device according to Item 26, wherein the (A) includes (Aj), to be carried out after the (Ai), forming a metal silicide layer on the first region, the second region, and a portion of the third electrode located opposite from the semiconductor substrate.

[Item 28]

The manufacturing method of an imaging device according to Item 24, wherein the (A) includes (Ah), to be carried out after the (Ag), forming a fourth insulating layer covering the first electrode, the second electrode, the third electrode, and the second insulating layer.

[Item 29]

The manufacturing method of an imaging device according to Item 28, wherein the (A) includes (Ai), to be carried out after the process (Ah), selectively removing the first insulating layer, the second insulating layer, and the fourth insulating layer from above the fourth impurity region and above the fifth impurity region except in the vicinity of the third electrode, and selectively removing the second insulating layer and the fourth insulating layer from above the third electrode.

[Item 30]

The manufacturing method of an imaging device according to Item 29, wherein the first plug is placed at a distance from the first electrode being equal to or below twice a deposition thickness of the fourth insulating layer, in the (Ag), and the (Ai) includes (Ai1) removing the fourth insulating layer from above the first plug and above the first electrode, and selectively leaving the fourth insulating layer between the first plug and the first electrode.

[Item 31]

The manufacturing method of an imaging device according to Item 29 or 30, wherein the (A) includes (Aj), to be carried out after the process (Ai), forming a first region and a second region having a relatively high impurity concentration in the fourth impurity region and the fifth impurity region, respectively, while using the first insulating layer and the second insulating layer collectively as a mask.

[Item 32]

The manufacturing method of an imaging device according to Item 31, wherein the (A) includes (Ak), to be carried out after the process (Aj), forming a metal silicide layer on the first region, the second region, and a portion of the third electrode located opposite from the semiconductor substrate.

[Item 33]

The manufacturing method of an imaging device according to Item 32, wherein the (A) includes (Al), to be carried out between the (Ah) and the (Ai), selectively removing the fourth insulating layer on a region of the semiconductor substrate other than the peripheral region.

Now, embodiments of the present disclosure will be described below in detail with reference to the drawings. Note that each of the embodiments described below shows a general or a specific example. Numerical values, shapes, materials, constituents, arrangements as well as connection conditions of the constituents, steps, the order of the steps, and so forth described in the following embodiments are mere examples and are not intended to limit the present disclosure. Various aspects described in this specification may be carried out in combination as long as such a combination is consistent. Meanwhile, among the constituents of the following embodiments, a constituent not described in an independent claim that represents the broadest concept will be explained as an optional constituent. In the following description, constituents having substantially the same functions will be denoted by the same reference numerals and overlapping explanations thereof may be omitted as appropriate.

First Embodiment

FIG. 1 shows an exemplary configuration of an imaging device according to a first embodiment of the present disclosure. An imaging device 100A shown in FIG. 1 includes imaging cells 10A and a peripheral circuitry 40 which are formed on a semiconductor substrate 60. Each imaging cell 10A includes a photoelectric converter 12 placed above the semiconductor substrate 60. In other words, a stacked type imaging device is shown as an example of the imaging device 100A herein. Note that in this specification, terms "above", "below", an "upper surface", a "lower surface", and the like are used only for specifying geometry between components and are not intended to limit orientations thereof when the imaging device is in use.

In the example shown in FIG. 1, the imaging cells 10A are arranged in a matrix with m rows and n columns (each of m and n is an integer equal to or above 2). The imaging cells 10A form an imaging region R1 by being arranged on the semiconductor substrate 60 two-dimensionally, for instance. As mentioned above, each imaging cell 10A includes the photoelectric converter 12 placed above the semiconductor substrate 60. Accordingly, the imaging region R1 is deemed to be defined as a region on the semiconductor substrate 60 covered with the photoelectric converters 12. Note that FIG. 1 illustrates the photoelectric converters 12 of the respective imaging cells 10A which are spatially separated from one another. However, this illustration is made only for the convenience of explanation and the photoelectric converters 12 of the imaging cells 10A may be placed on the semiconductor substrate 60 without any spaces in between.

The number and the arrangement of the imaging cells 10A are not limited by the illustrated example. For instance, the imaging device 100A may consist of one imaging cell 10A. In this example, the centers of the imaging cells 10A are placed on lattice points of a square lattice. However, regarding the arrangement of the imaging cells 10A, the imaging cells 10A may be arranged such that the centers thereof are placed on lattice points of a triangular lattice, a hexagonal lattice, and the like. Meanwhile, the imaging device 100A can be used as a line sensor by one-dimensionally arranging the imaging cells 10A.

In the configuration exemplarily shown in FIG. 1, the peripheral circuitry 40 includes a vertical scanning circuit (which is also called a "row scanning circuit") 46 and a horizontal signal readout circuit (which is also called a "column scanning circuit") 48. The vertical scanning circuit 46 is connected to address signal lines 34 provided corresponding to the respective rows of the imaging cells 10A. The horizontal signal readout circuit 48 is connected to vertical signal lines 35 provided corresponding to the respective columns of the imaging cells 10A. As schematically shown in FIG. 1, these circuits are placed in a peripheral region R2 placed on the outside of the imaging region R1. The peripheral circuitry 40 may further include a signal processing circuit, an output circuit, a control circuit, a power supply to supply a given voltage to each imaging cell 10A, and so forth. A part of the peripheral circuitry 40 may be placed on a different substrate from the semiconductor substrate 60 on which the imaging cells 10A are formed.

Figure 2:
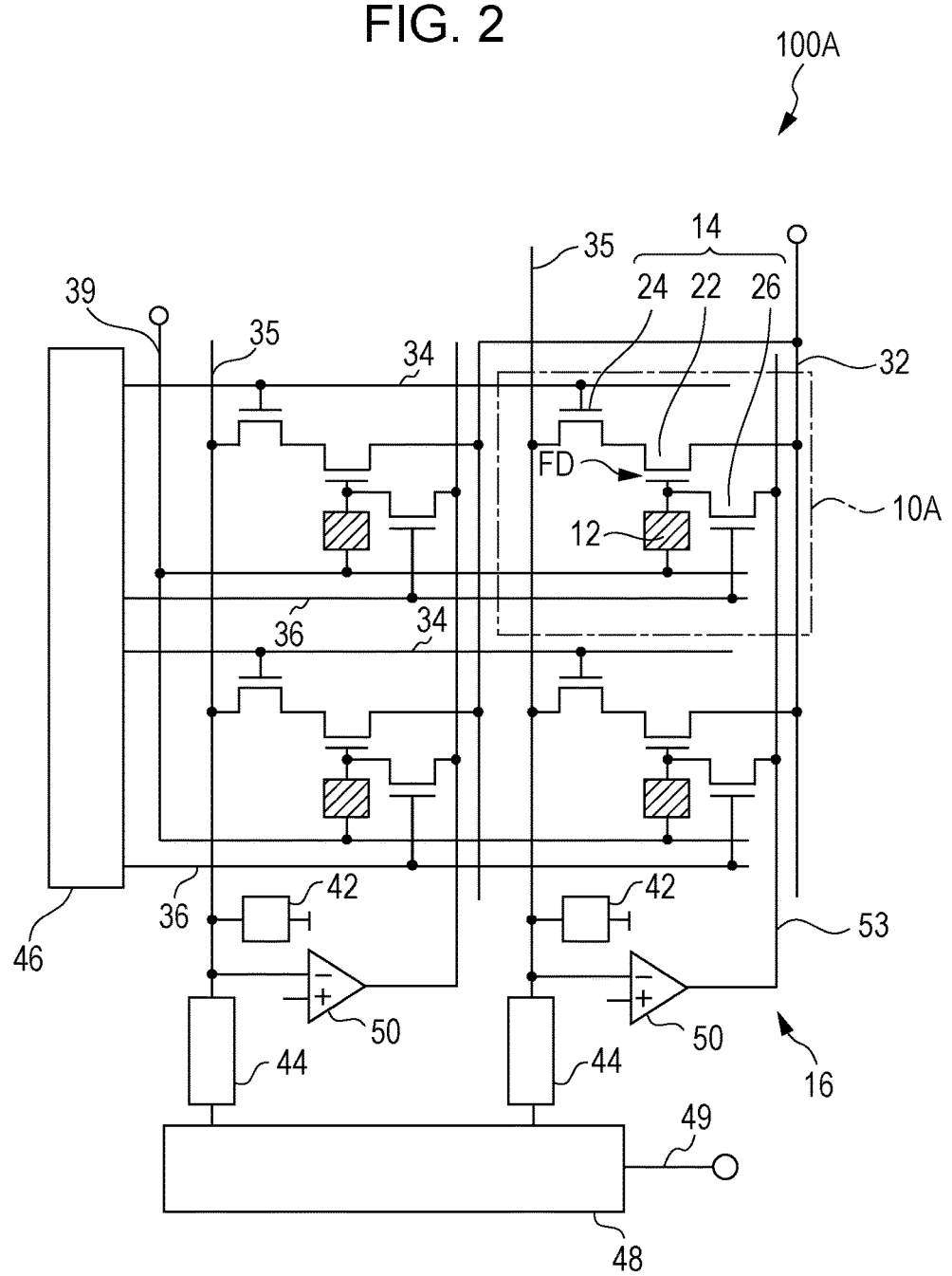
FIG. 2 is a diagram showing an exemplary circuit configuration of the imaging device according to the first embodiment of the present disclosure.

FIG. 2 shows an exemplary circuit configuration of the imaging device according to the first embodiment of the present disclosure. To avoid complication of the illustration, FIG. 2 representatively shows four imaging cells 10A arranged in two rows and two columns among those shown in FIG. 1.

The photoelectric converter 12 of each imaging cell 10A receives incident light and generates positive and negative charges (more typically, hole-electron pairs). The photoelectric converter 12 of each imaging cell 10A is connected to an accumulation control line 39. When the imaging device 100A is in operation, a given voltage is applied to the accumulation control line 39. For example, when the positive charges out of the positive and negative charges generated by the photoelectric conversion are used as signal charges, a positive voltage (about 10 V, for instance) is applied to the accumulation control line 39 during operating of the imaging device 100A. By applying the given positive voltage to the accumulation control line 39, the positive charges (such as holes) out of the positive and negative charges generated by the photoelectric conversion can be selectively accumulated in a charge accumulation region. In the following, the case in which the positive charges out of the positive and negative charges generated by the photoelectric conversion are used as the signal charges will be described as an example.

Each imaging cell 10A includes a signal detection circuit 14 which is electrically connected to the photoelectric converter 12. In the configuration exemplarily shown in FIG. 2, the signal detection circuit 14 includes an amplification transistor 22 (which is also called a "readout transistor") and a reset transistor 26. In this example, the signal detection circuit 14 further includes an address transistor (which is also called a "row selection transistor") 24. As described later in detail with reference to the drawings, each of the amplification transistor 22, the reset transistor 26, and the address transistor 24 in the signal detection circuit 14 is typically a field effect transistor (FET) formed in the semiconductor substrate 60 that supports the photoelectric converter 12. In the following, an example of using n-channel MOS as the transistors will be explained unless otherwise stated.

As schematically shown in FIG. 2, a gate of the amplification transistor 22 is electrically connected to the photoelectric converter 12. The charges generated by the photoelectric converter 12 are accumulated in the charge accumulation region. Here, the charge accumulation region includes a charge accumulation node (which is also called a "floating diffusion node") FD between the photoelectric converter 12 and the amplification transistor 22.

A drain of the amplification transistor 22 is connected to a power supply line (a source follower power supply) 32, which supplies a prescribed (about 3.3 V, for example) power supply voltage VDD to each imaging cell 10A when the imaging device 100A is in operation. The amplification transistor 22 amplifies a voltage applied to the gate by receiving the power supply voltage VDD supplied to its drain. In other words, the amplification transistor 22 outputs a signal voltage corresponding to an amount of the signal charges generated by the photoelectric converter 12. A source of the amplification transistor 22 is connected to a drain of the address transistor 24.

One of the vertical signal lines 35 is connected to a source of the address transistor 24. As shown in FIG. 2, each vertical signal line 35 is provided to each column of the imaging cells 10A, and a load circuit 42 and a column signal processing circuit (which is also called a "row signal accumulation circuit") 44 are connected to each vertical signal line 35. The load circuit 42 forms a source follower circuit in conjunction with the amplification transistor 22.

One of the address signal lines 34 is connected to a gate of the address transistor 24. Each address signal line 34 is provided to each row of the imaging cells 10A. The address signal lines 34 are connected to the vertical scanning circuit 46, and the vertical scanning circuit 46 applies a row selection signal that controls on and off of the address transistor 24 to the corresponding address signal line 34. Thus, a row to be read out is scanned in the vertical direction (in a column direction) whereby the appropriate row is selected. The vertical scanning circuit 46 controls on and off of the address transistor 24 through the address signal line 34, and can thus read an output from the amplification transistor 22 of the selected imaging cell 10A out to the corresponding vertical signal line 35. Note that the arrangement of the address transistor 24 is not limited to the example shown in FIG. 2. The address transistor 24 may be located between the drain of the amplification transistor 22 and the power supply line 32.

The signal voltage from the imaging cell 10A outputted to the vertical signal line 35 through the address transistor 24 is inputted to the corresponding column signal processing circuit 44 among the column signal processing circuits 44, each of which is provided to each column of the imaging cells 10A so as to correspond to the vertical signal line 35. The column signal processing circuit 44 and the load circuit 42 may be a part of the above-described peripheral circuitry 40.

Each column signal processing circuit 44 performs noise suppression signal processing as typified by correlative double sampling, analog-digital conversion (A-D conversion), and the like. The column signal processing circuit 44 is connected to the horizontal signal readout circuit 48. The horizontal signal readout circuit 48 sequentially reads signals from the column signal processing circuits 44 out to a horizontal shared signal line 49.

In the configuration exemplarily shown in FIG. 2, the signal detection circuit 14 includes the reset transistor 26 with its drain connected to the charge accumulation node FD. A reset signal line 36 coupled to the vertical scanning circuit 46 is connected to a gate of the reset transistor 26. Each reset signal line 36 is provided to each row of the imaging cells 10A as with the address signal line 34. The vertical scanning circuit 46 can select the row of the imaging cells 10A to be reset by applying the row selection signal to the corresponding address signal line 34. In the meantime, the vertical scanning circuit 46 can turn on the reset transistors 26 on the selected row by applying a reset signal to control on and off of the reset transistors 26 to the gates of the reset transistors 26 through the reset signal line 36. As the reset transistors 26 are turned on, electric potentials of the corresponding charge accumulation nodes FD are reset.

In this example, a source of each reset transistor 26 is connected to one of feedback lines 53, each of which is provided to each column of the imaging cells 10A. Specifically, in this example, a voltage on the feedback line 53 is supplied to the corresponding charge accumulation node FD as a reset voltage to initialize the charges in the photoelectric converter 12. Here, the above-mentioned feedback line 53 is connected to an output terminal of a corresponding one of inverting amplifiers 50, each of which is provided to each column of the imaging cells 10A. Each inverting amplifier 50 may be a part of the above-described peripheral circuitry 40.

Now, attention is drawn to one of the columns of the imaging cells 10A. As illustrated in FIG. 2, an inverting input terminal of the inverting amplifier 50 is connected to the vertical signal line 35 of the corresponding column. Meanwhile, the output terminal of the inverting amplifier 50 is connected to one or more of the imaging cells 10A belonging to the column through the feedback line 53. When the imaging device 100A is in operation, a given voltage (such as 1 V and a positive voltage around 1V) Vref is supplied to a non-inverting input terminal of the inverting amplifier 50. By selecting one out of the one or more imaging cells 10A belonging to the column and turning on the address transistor 24 and the reset transistor 26, it is possible to form a feedback path to obtain a negative feedback of an output from the selected imaging cell 10A. By the formation of the feedback path, the voltage on the vertical signal line 35 converges to the input voltage Vref to the non-inverting input terminal of the inverting amplifier 50. In other words, by the formation of the feedback path, the voltage at the charge accumulation node FD is reset to such a voltage that renders the voltage on the vertical signal line 35 equal to the voltage Vref. A voltage at any magnitude in a range from the power supply voltage (such as 3.3 V) to the ground voltage (0 V) can be used as the voltage Vref. The inverting amplifier 50 may also be referred to as a feedback amplifier. As described above, the imaging device 100A includes a feedback circuit 16 that includes the inverting amplifier 50 as a part of the feedback path.

As is well known, thermal noise called kTC noise is generated along with turning the transistors on and off. Noise generated along with turning the reset transistor on and off is called reset noise. After resetting the electric potential in the charge accumulation region, the reset noise occurring along with turning the reset transistor off remains in the charge accumulation region before accumulating the signal charges. However, the reset noise occurring along with turning the reset transistor off can be reduced by use of the feedback. Details of suppression of the reset noise using the feedback have been described in International Publication No. WO 2012/147302. The entire contents disclosed in International Publication No. WO 2012/147302 are incorporated in this specification by reference.

In the configuration exemplarily shown in FIG. 2, an alternating-current component in the thermal noise is fed back to the source of the reset transistor 26 by forming the feedback path. In the configuration exemplarily shown in FIG. 2, the feedback path is formed just before turning off the reset transistor 26. Accordingly, it is possible to reduce the reset noise occurring along with turning the reset transistor 26 off.

(Device Structure of Imaging Cell 10A)

Figure 3:
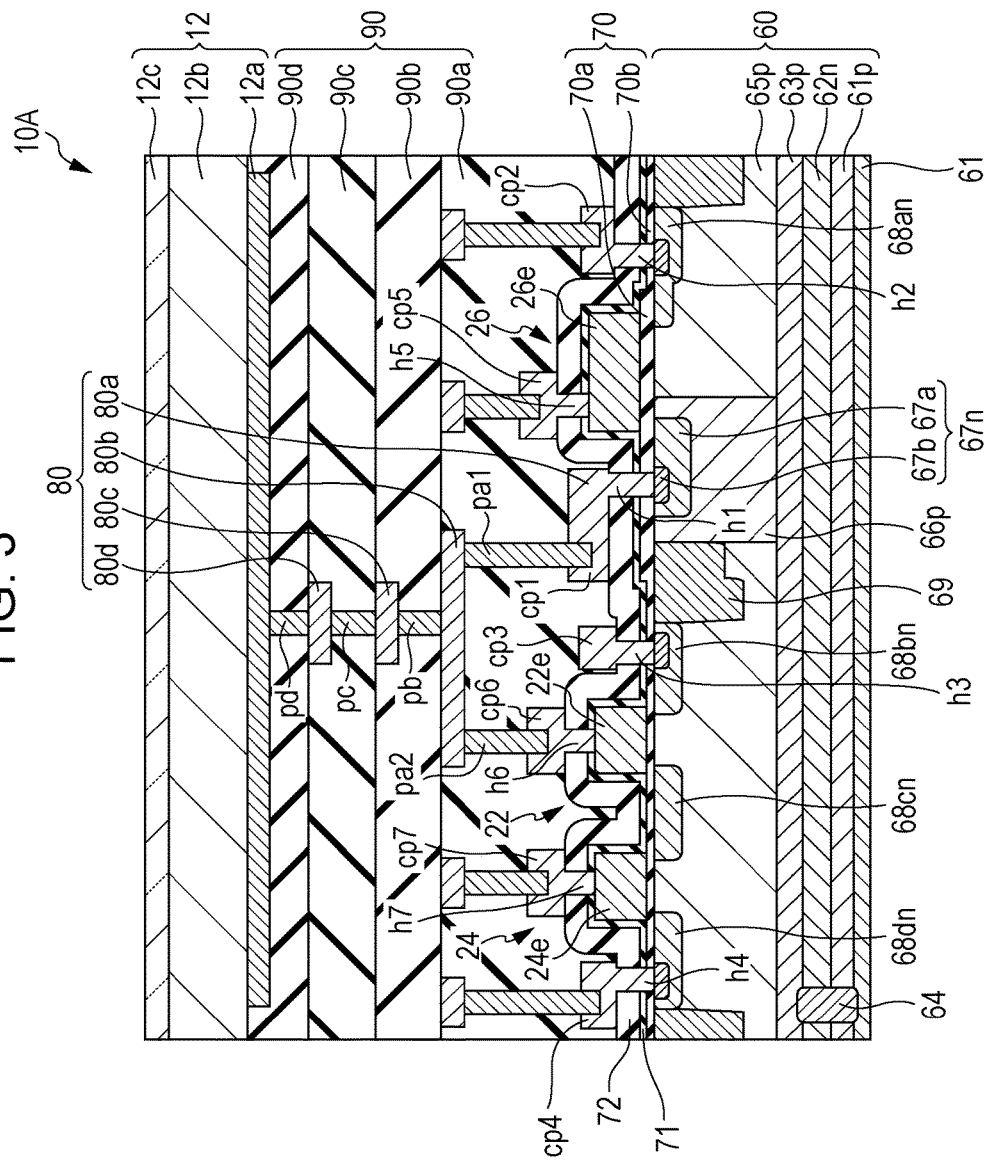
FIG. 3 is a schematic cross-sectional view showing a typical example of a device structure of an imaging cell.
Figure 4:
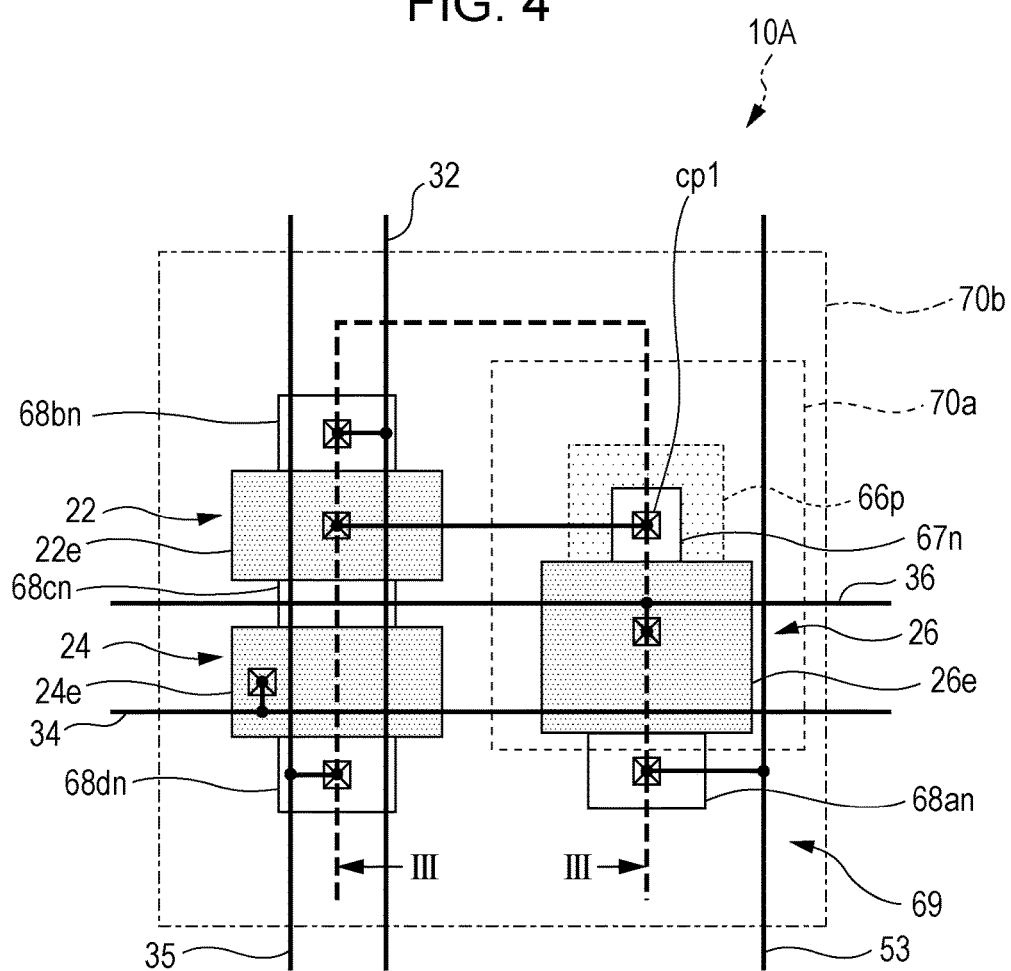
FIG. 4 is a plan view showing an example of a layout of elements in the imaging cell.

FIG. 3 shows a typical example of a device structure of the imaging cell 10A. FIG. 4 shows an example of a layout of elements in the imaging cell 10A. FIG. 4 schematically shows an arrangement of the elements (the amplification transistor 22, the address transistor 24, the reset transistor 26, and so forth) formed on the semiconductor substrate 60 when the imaging cell 10A shown in FIG. 3 is viewed in a normal direction of the semiconductor substrate 60. Here, the amplification transistor 22 and the address transistor 24 are linearly arranged in a vertical direction of the sheet surface. A cross section shown in FIG. 3 is obtained by cutting and developing the imaging cell 10A along the III-III line in FIG. 4.

As schematically shown in FIG. 3, the imaging cell 10A generally includes the semiconductor substrate 60, the photoelectric converter 12 placed above the semiconductor substrate 60, and a wiring structure 80. The wiring structure 80 is placed in an interlayer insulating layer 90 formed between the photoelectric converter 12 and the semiconductor substrate 60, and includes a structure to electrically connect the amplification transistor 22 and the photoelectric converter 12 formed on the semiconductor substrate 60 to each other as a part of the wiring structure 80. Here, the interlayer insulating layer 90 has a stacked structure including four insulating layers 90a, 90b, 90c, and 90d. The wiring structure 80 includes four wiring layers 80a to 80d, and plugs pa1, pa2, pb, pc, and pd, each of which is placed between a corresponding pair of the above-mentioned wiring layers. It is needless to say that the number of the insulating layers in the interlayer insulating layer 90 and the number of the wiring layers in the wiring structure 80 are not limited to the aforementioned examples and can be set to any numbers.

The photoelectric converter 12 is placed on the interlayer insulating layer 90. The photoelectric converter 12 includes a pixel electrode 12a formed on the interlayer insulating layer 90, a transparent electrode 12c located opposite from the pixel electrode 12a, and a photoelectric conversion layer 12b located between these electrodes. The photoelectric conversion layer 12b of the photoelectric converter 12 is made of either an organic material or an inorganic material such as amorphous silicon, and generates positive and negative charges by means of photoelectric conversion while receiving light incident through the transparent electrode 12c. The photoelectric conversion layer 12b is typically formed across the imaging cells 10A. The photoelectric conversion layer 12b may include both a layer made of an organic material and a layer made of an inorganic material.

The transparent electrode 12c is made of a transparent conductive material such as ITO, and is placed on an acceptance surface side of the photoelectric conversion layer 12b. As with the photoelectric conversion layer 12b, the transparent electrode 12c is typically formed across the imaging cells 10A. Though not illustrated in FIG. 3, the transparent electrode 12c is connected to the aforementioned accumulation control line 39. When the imaging device 100A is in operation, an electric potential of the transparent electrode 12c is set higher than an electric potential of the pixel electrode 12a by controlling an electric potential of the accumulation control line 39. Thus, the signal charges (such as the holes) generated by the photoelectric conversion can be collected by using the pixel electrode 12a.

The pixel electrode 12a is an electrode made of any of a metal such as aluminum and copper, a metal nitride, polycrystalline silicon provided with conductivity by being doped with an impurity, and the like. Each pixel electrode 12a is spatially separated from a pixel electrode 12a of another imaging cell 10A adjacent thereto, and is thus electrically isolated from the pixel electrode 12a of the other imaging cell 10A.

The semiconductor substrate 60 includes a supporting substrate 61, and one or more semiconductor layers formed on the supporting substrate 61. Here, a p-type silicon (Si) substrate is shown as an example of the supporting substrate 61. In this example, the semiconductor substrate 60 includes a p-type semiconductor layer 61p on the supporting substrate 61, an n-type semiconductor layer 62n on the p-type semiconductor layer 61p, a p-type semiconductor layer 63p on the n-type semiconductor layer 62n, and a p-type semiconductor layer 65p on the p-type semiconductor layer 63p. The p-type semiconductor layer 63p is formed over the entire surface of the supporting substrate 61. The p-type semiconductor layer 65p includes a p-type impurity region 66p having a lower impurity concentration, an n-type impurity region 67n formed in the p-type impurity region 66p, n-type impurity regions 68an, 68bn, 68cn, and 68dn, and element isolation regions 69.

Each of the p-type semiconductor layer 61p, the n-type semiconductor layer 62n, the p-type semiconductor layer 63p, and the p-type semiconductor layer 65p is formed typically by ion implantation of the impurity into the semiconductor layer formed by epitaxial growth. Impurity concentrations of the p-type semiconductor layer 63p and the p-type semiconductor layer 65p are substantially equal to each other, and are higher than an impurity concentration of the p-type semiconductor layer 61p. The n-type semiconductor layer 62n located between the p-type semiconductor layer 61p and the p-type semiconductor layer 63p suppresses inflow of a minority carrier from the supporting substrate 61 or the peripheral circuitry 40 into the charge accumulation region which accumulates the signal charges. When the imaging device 100A is in operation, an electric potential of the n-type semiconductor layer 62n is controlled through a well contact (not shown) provided on the outside of the imaging region R1 (see FIG. 1).

Moreover, in this example, the semiconductor substrate 60 includes a p-type region 64 provided between the p-type semiconductor layer 63p and the supporting substrate 61 in such a way as to penetrate the p-type semiconductor layer 61p and the n-type semiconductor layer 62n. The p-type region 64 has a higher impurity concentration than those of the p-type semiconductor layer 63p and the p-type semiconductor layer 65p, and electrically connects the p-type semiconductor layer 63p to the supporting substrate 61. When the imaging device 100A is in operation, electric potentials of the p-type semiconductor layer 63p and the supporting substrate 61 are controlled through a substrate contact (not shown) provided on the outside of the imaging region R1. By placing the p-type semiconductor layer 65p to come into contact with the p-type semiconductor layer 63p, an electric potential of the p-type semiconductor layer 65p can also be controlled through the p-type semiconductor layer 63p when the imaging device 100A is in operation.

The amplification transistor 22, the address transistor 24, and the reset transistor 26 are formed in the semiconductor substrate 60. The reset transistor 26 includes the n-type impurity regions 67n and 68an, a part of an insulating layer 70 formed on the semiconductor substrate 60, and a gate electrode 26e on the insulating layer 70. The n-type impurity regions 67n and 68an function as a drain region and a source region of the reset transistor 26, respectively. The n-type impurity region 67n function as a part of a charge accumulation region which temporarily accumulates the signal charges generated by the photoelectric converter 12.

As schematically shown in FIG. 3, the insulating layer 70 includes a relatively thick first portion 70a and a second portion 70b that is continuous with the first portion 70a and is thinner than the first portion 70a. The gate electrode 26e of the reset transistor 26 is placed on a part of the relatively thick first portion 70a of the insulating layer 70. In other words, a part of the first portion 70a of the insulating layer 70 functions as a gate insulating layer of the reset transistor 26.

As schematically shown in FIG. 4, the first portion 70a of the insulating layer 70 is formed to cover not only a portion immediately below the gate electrode 26e of the reset transistor 26 but also the n-type impurity region 67n formed in the semiconductor substrate 60. To be more precise, the first portion 70a of the insulating layer 70 is formed to cover a portion of a depleted layer emerging on a surface of the semiconductor substrate 60, the depleted layer being formed by a p-n junction between a first region 67*a* of the n-type impurity region 67*n* and the p-type impurity region 66*p*. In this example, the first portion 70*a* of the insulating layer 70 is formed wide to reach the outside of the n-type impurity region 67*n* so as to encompass the p-type impurity region 66*p* as well.

Of the insulating layer 70 on the semiconductor substrate 60, the first portion 70*a* which at least covers the n-type impurity region 67*n* functioning as a part of the charge accumulation region is made thicker than the remaining portion (the second portion 70*b*). Thus, damage on the surface of the semiconductor substrate 60 and to a depth of several hundred nanometers from the surface attributed to various etching processes to be executed after formation of the insulating layer 70 can be reduced as compared to damage on a region covered with the second portion 70*b*. As a consequence, a leakage current attributed to crystal defects in the vicinity of a surface of the n-type impurity region 67*n* is suppressed. The thickness of the second portion 70*b* of the insulating layer 70 may be about 10 nm, for example. On the other hand, the thickness of the first portion 70*a* of the insulating layer 70 may be about 20 nm, for example.

Note that the aforementioned International Publication No. WO 2014/002330 discloses the concept of providing a thick gate oxide film 36 of a reset transistor 16 as compared to a gate oxide film 25 of am amplification transistor 15. However, this concept aims to apply a high gate voltage to a gate electrode 46 of the reset transistor 16 when the reset transistor 16 is turned off, but does not have the viewpoint of covering the impurity region functioning as a part of the charge accumulation region with the relatively thick portion of the insulating layer having the portions with different thicknesses. According to the configuration exemplarily shown in FIG. 3 of the present disclosure, a part of the first portion 70*a* of the insulating layer 70, which is relatively thick, is used as the gate insulating layer of the reset transistor 26. Thus, it is also possible to apply a voltage having a large absolute value to the gate electrode 26*e* when the reset transistor 26 is turned off, and to obtain an effect to reduce the leakage current when the reset transistor 26 is turned off as with International Publication No. WO 2014/002330.

Of the surface of the semiconductor substrate 60, the first portion 70*a* of the insulating layer 70 is formed over a region immediately below the gate electrode 26*e* of the reset transistor 26 and a region on the n-type impurity region 67*n*. On the other hand, the second portion 70*b* of the insulating layer 70 is placed on the remaining region on the surface of the semiconductor substrate 60. As described later, the second portion 70*b* of the insulating layer 70 is also formed on the peripheral region R2 (see FIG. 1). It is to be noted that the thickness of the second portion 70*b* does not have to be constant over the entirety of the region on the surface of the semiconductor substrate 60 other than the region immediately below the gate electrode 26*e* of the reset transistor 26 and the region on the n-type impurity region 67*n*.

Reference is made to FIG. 3 again. The amplification transistor 22 of the signal detection circuit 14 includes the n-type impurity regions 68*bn* and 68*cn*, a part of the insulating layer 70, and a gate electrode 22*e* on the insulating layer 70. The n-type impurity regions 68*bn* and 68*cn* function as a drain region and a source region of the amplification transistor 22, respectively. Here, as seen in FIG. 3, the gate electrode 22*e* of the amplification transistor 22 is placed on a part of the relatively thin second portion 70*b* of the insulating layer 70. In other words, a gate insulating layer of the amplification transistor 22 is formed of a part of the second portion 70*b* of the insulating layer 70.

An element isolation region 69 is placed between the n-type impurity region 68*bn* and the n-type impurity region 67*n*. The element isolation region 69 is a p-type impurity diffusion region, for example. The amplification transistor 22 and the reset transistor 26 are electrically isolated from each other by the element isolation region 69. In this example, the element isolation region 69 between the amplification transistor 22 and the reset transistor 26 is covered in part with the first portion 70*a* of the insulating layer 70, and the remaining part thereof is covered with the second portion 70*b* of the insulating layer 70. As schematically shown in FIG. 3, an implantation depth at a portion of the element isolation region 69 covered with the first portion 70*a* of the insulating layer 70 is smaller than an implantation depth at a portion of the element isolation region 69 covered with the second portion 70*b* thereof. As described above, strength of an electric field formed by the p-n junction can be reduced by providing the relatively small implantation depth on the side close to the n-type impurity region 67*n* that functions as a part of the charge accumulation region. In the meantime, the electrical isolation between the elements can be made more reliable by providing the large implantation depth on the side away from the n-type impurity region 67*n*.

Another element isolation region 69 is also placed between the adjacent imaging cells 10A, which electrically isolates the signal detection circuits 14 therebetween. Here, the element isolation region 69 is provided around the set of the amplification transistor 22 and the address transistor 24 and around the reset transistor 26 (see FIG. 4).

The address transistor 24 includes the n-type impurity regions 68*cn* and 68*dn*, a part of the insulating layer 70, and a gate electrode 24*e* on the insulating layer 70. In this example, the address transistor 24 is electrically connected to the amplification transistor 22 by sharing the n-type impurity region 68*cn* with the amplification transistor 22. The n-type impurity region 68*cn* functions as a drain region of the address transistor 24, and the n-type impurity region 68*dn* functions as a source region of the address transistor 24. The gate electrode 24*e* of the address transistor 24 is placed on a part of the relatively thin second portion 70*b* of the insulating layer 70 as with the amplification transistor 22. Specifically, a gate insulating layer of the address transistor 24 is formed of a part of the second portion 70*b* of the insulating layer 70. Here, the thickness of the portion (which corresponds to the gate insulating layer of the address transistor 24) of the second portion 70*b* of the insulating layer 70 located between the gate electrode 24*e* and the semiconductor substrate 60 may be equal to or different from the thickness of the portion (which corresponds to the gate insulating layer of the amplification transistor 22) of the second portion 70*b* of the insulating layer 70 located between the gate electrode 22*e* and the semiconductor substrate 60.

In this example, an insulating layer 72 is provided to cover the gate electrode 26*e* of the reset transistor 26, the gate electrode 22*e* of the amplification transistor 22, and the gate electrode 24*e* of the address transistor 24. The insulating layer 72 is a silicon nitride (SiN) layer, for instance. In this example, an insulating layer 71 is interposed between the insulating layer 72 and each of the gate electrode 26*e*, the gate electrode 22*e*, and the gate electrode 24*e*. The insulating layer 71 is a silicon dioxide ($SiO_2$) layer formed by using tetraethoxysilane (TEOS), for instance. The insulating layer 71 may have a stacked structure including two or more insulating layers. Likewise, the aforementioned insulating layer 72 may also have a stacked structure including two or more insulating layers.

A stacked structure formed of the insulating layer 72 and the insulating layer 71 includes contact holes. Here, contact holes h1 to h7 are provided in the insulating layer 72 and the insulating layer 71. The contact holes h1 to h4 are formed at positions overlapping the n-type impurity regions 67*n*, 68*an*, 68*bn*, and 68*dn*, respectively. Contact plugs cp1 to cp4 are placed at the positions of the contact holes h1 to h4, respectively. The contact holes h5 to h7 are formed at positions overlapping the gate electrode, 26*e*, the gate electrode 22*e*, and the gate electrode 24*e*, respectively. Contact plugs cp5 to cp7 are placed at the positions of the contact holes h5 to h7, respectively.

In the configuration exemplarily shown in FIG. 3, a wiring layer 80*a* placed closest to the semiconductor substrate 60 is a layer including the contact plugs cp1 to cp7, which is typically a polycrystalline silicon layer doped with an n-type impurity. A wiring layer 80*b* and the plugs pa1 and pa2 are placed in the insulating layer 90*a*. The plug pa1 connects the contact plug cp1 to the wiring layer 80*b* while the plug pa2 connects the contact plug cp6 to the wiring layer 80*b*. In other words, the n-type impurity region 67*n* and the gate electrode 22*e* of the amplification transistor 22 are electrically connected to each other through the contact plugs cp1 and cp6, the plugs pa1 and pa2, and the wiring layer 80*b*.

The wiring layer 80*b* is placed in the insulating layer 90*a*, and the vertical signal line 35, the address signal line 34, the power supply line 32, the reset signal line 36, the feedback line 53, and the like mentioned above may be included as a part of the wiring layer 80*b*. The vertical signal line 35 is connected to the n-type impurity region 68*dn* through the contact plug cp4. The address signal line 34 is connected to the gate electrode 24*e* through the contact plug cp7. The power supply line 32 is connected to the n-type impurity region 68*bn* through the contact plug cp3. The reset signal line 36 is connected to the gate electrode 26*e* through the contact plug cp5. The feedback line 53 is connected to the n-type impurity region 68*an* through the contact plug cp2.

The plug pb placed in the insulating layer 90*b* connects the wiring layer 80*b* to the wiring layer 80*c*. Likewise, the plug pc placed in the insulating layer 90*c* connects the wiring layer 80*c* to the wiring layer 80*d*. The plug pd placed in the insulating layer 90*d* connects the wiring layer 80*d* to the pixel electrode 12*a* of the photoelectric converter 12. Each of the wiring layers 80*b* to 80*d* as well as the plugs pa1, pa2, and pb to pd is typically made of a metal (or a metal compound such as a metal nitride and a metal oxide) of copper, tungsten, or the like.

The plugs pa1, pa2, and pb to pd, the wiring layers 80*b* to 80*d*, and the contact plugs cp1 and cp6 electrically connect the photoelectric converter 12 to the signal detection circuit 14 formed on the semiconductor substrate 60. The plugs pa1, pa2, and pb to pd, the wiring layers 80*b* to 80*d*, the contact plugs cp1 and cp6, the pixel electrode 12*a* of the photoelectric converter 12, the gate electrode 22*e* of the amplification transistor 22, and the n-type impurity region 67*n* function as at least a part of the charge accumulation region that accumulates the signal charges (the holes in this case) generated by the photoelectric converter 12.

Here, attention is drawn to the n-type impurity regions formed in the semiconductor substrate 60. Of the n-type impurity regions formed in the semiconductor substrate 60, the n-type impurity region 67*n* is placed in the p-type impurity region 66*p* formed in the p-type semiconductor layer 65*p* serving as a p-well. The n-type impurity region 67*n* is formed in the vicinity of the surface of the semiconductor substrate 60, and at least a part of the n-type impurity region 67*n* is located on the surface of the semiconductor substrate 60. Junction capacitance formed by the p-n junction between the p-type impurity region 66*p* and the n-type impurity region 67*n* functions as capacitance that accumulates at least a part of the signal charges, thereby constituting a part of the charge accumulation region.

In the configuration exemplarily shown in FIG. 3, the n-type impurity region 67*n* includes the first region 67*a* and a second region 67*b*. An impurity concentration of the first region 67*a* of the n-type impurity region 67*n* is lower than those of the n-type impurity regions 68*an*, 68*bn*, 68*cn*, and 68*dn*. The second region 67*b* in the n-type impurity region 67*n* is formed in the first region 67*a* and has a higher impurity concentration than that of the first region 67*a*. Meanwhile, the contact hole h1 is located on the second region 67*b*, and the contact plug cp1 is connected to the second region 67*b* through the contact hole h1.

As described above, by placing the p-type semiconductor layer 65*p* adjacent to the p-type semiconductor layer 63*p*, it is possible to control the electric potential of the p-type semiconductor layer 65*p* through the p-type semiconductor layer 63*p* when the imaging device 100A is in operation. The adoption of the above-described structure makes it possible to arrange regions (the first region 67*a* of the n-type impurity region 67*n* and the p-type impurity region 66*p* in this case) having relatively low impurity concentrations around a portion (the second region 67*b* of the n-type impurity region 67*n* in this case) where the semiconductor substrate 60 comes into contact with the contact plug cp1 that is electrically connected to the photoelectric converter 12. The formation of the second region 67*b* in the n-type impurity region 67*n* is not essential. Nevertheless, an effect to suppress expansion of the depleted layer (depletion) around the portion where the contact plug cp1 and the semiconductor substrate 60 are in contact with each other is obtained by setting the relatively high impurity concentration of the second region 67*b* being the contact portion between the contact plug cp1 and the semiconductor substrate 60. By suppressing the expansion of the depleted layer around the portion where the contact plug cp1 and the semiconductor substrate 60 are in contact with each other, it is possible to suppress a leakage current attributed to crystal defects (which may also be referred to as an interface state) of the semiconductor substrate 60 on an interface between the contact plug cp1 and the semiconductor substrate 60. Moreover, an effect to reduce contact resistance is obtained by connecting the contact plug cp1 to the second region 67*b* having the relatively high impurity concentration.

Furthermore, in this example, the first region 67*a* having the lower impurity concentration than that of the second region 67*b* is interposed between the second region 67*b* of the n-type impurity region 67*n* and the p-type impurity region 66*p*, and the first region 67*a* is also interposed between the second region 67*b* of the n-type impurity region 67*n* and the p-type semiconductor layer 65*p*. By placing the first region 67*a* having the relatively low impurity concentration around the second region 67*b*, it is possible to relax the strength of the electric field formed by the p-n junction between the n-type impurity region 67*n* and the p-type semiconductor layer 65*p* (or the p-type impurity region 66*p*). As a consequence of relaxation of the strength of the electric field formed by the p-n junction, the leakage current attributed to the electric field formed by the p-n junction is suppressed.

Figure 5:
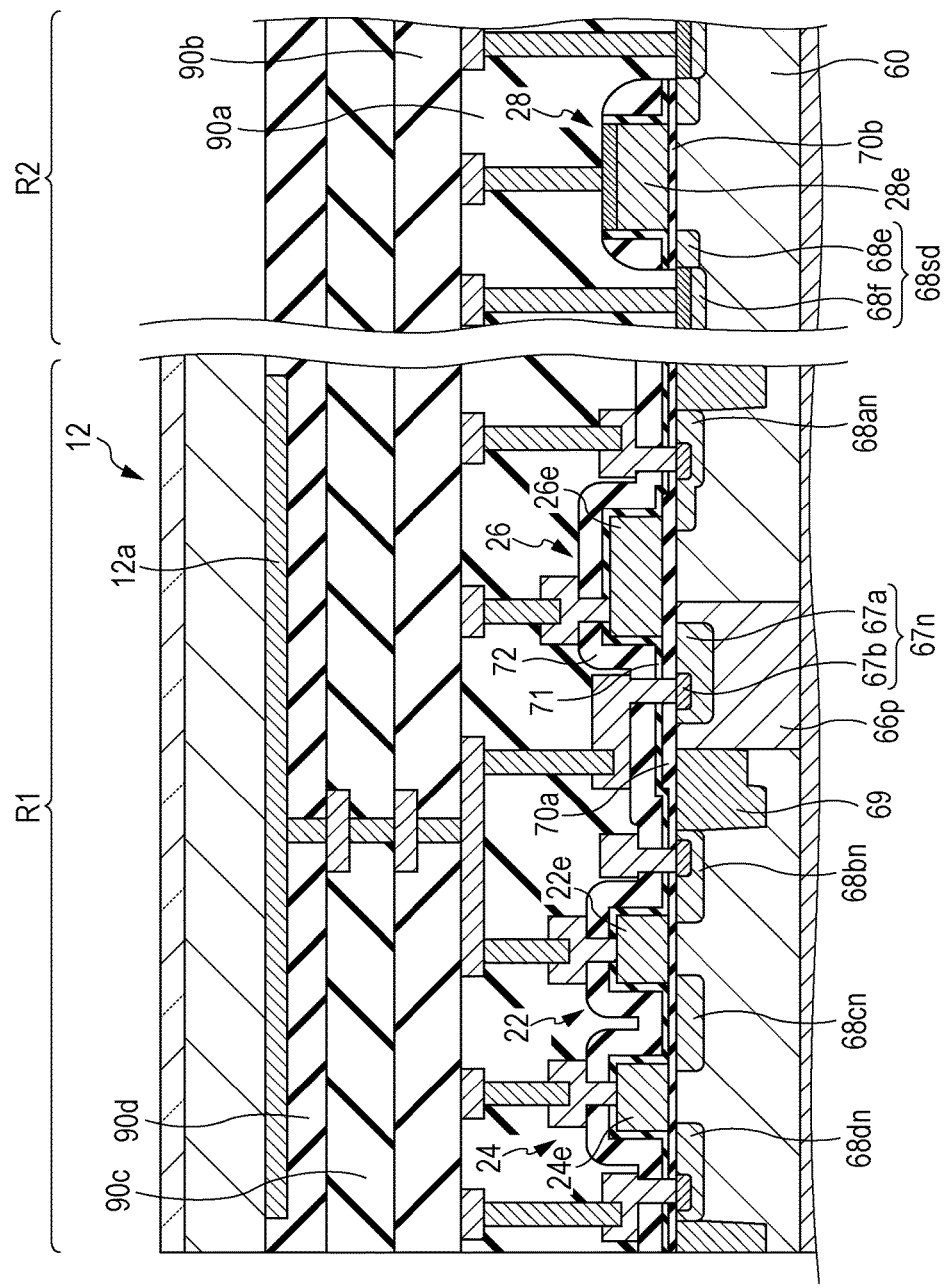
FIG. 5 is a schematic cross-sectional view showing the device structure of the imaging cell together with a transistor formed in a peripheral region of a semiconductor substrate.

FIG. 5 shows the device structure of the imaging cell 10A together with a transistor formed in the peripheral region R2 of the semiconductor substrate 60. A transistor 28 (which is typically a part of complementary metal-oxide semiconductor (CMOS)) placed in the peripheral region R2 of the semiconductor substrate 60 is shown on the right side in FIG. 5. The transistor 28 represents the transistors (such as load transistors in the load circuit 42) included in the peripheral circuitry 40. Here, as schematically shown in FIG. 5, the photoelectric converter 12 is not placed in the region other than the imaging region R1. In other words, the imaging region R1 on the semiconductor substrate can be defined as a region having overlap with the photoelectric converter 12 while the peripheral region R2 on the semiconductor substrate can be defined as a region on the outside of the imaging region R1.

The transistor 28 includes a gate electrode 28e and an n-type impurity region 68sd. The n-type impurity region 68sd includes a first region 68e and a second region 68f having impurity concentrations different from each other. The first region 68e is a region having the impurity concentration lower than that of the second region 68f. As schematically shown in FIG. 5, the first region 68e is located between the second region 68f doped at a high concentration and the gate electrode 28e.

The transistor 28 further includes a part of the second portion 70b of the insulating layer 70 as a gate insulating layer, which is placed between the gate electrode 28e and the semiconductor substrate 60. A thickness of a part of the second portion 70b of the insulating layer 70 functioning as the gate insulating layer of the transistor 28 may be equal to or different from the thickness of a part of the second portion 70b of the insulating layer 70 corresponding to the gate insulating layer of the amplification transistor 22.

Figure 6:
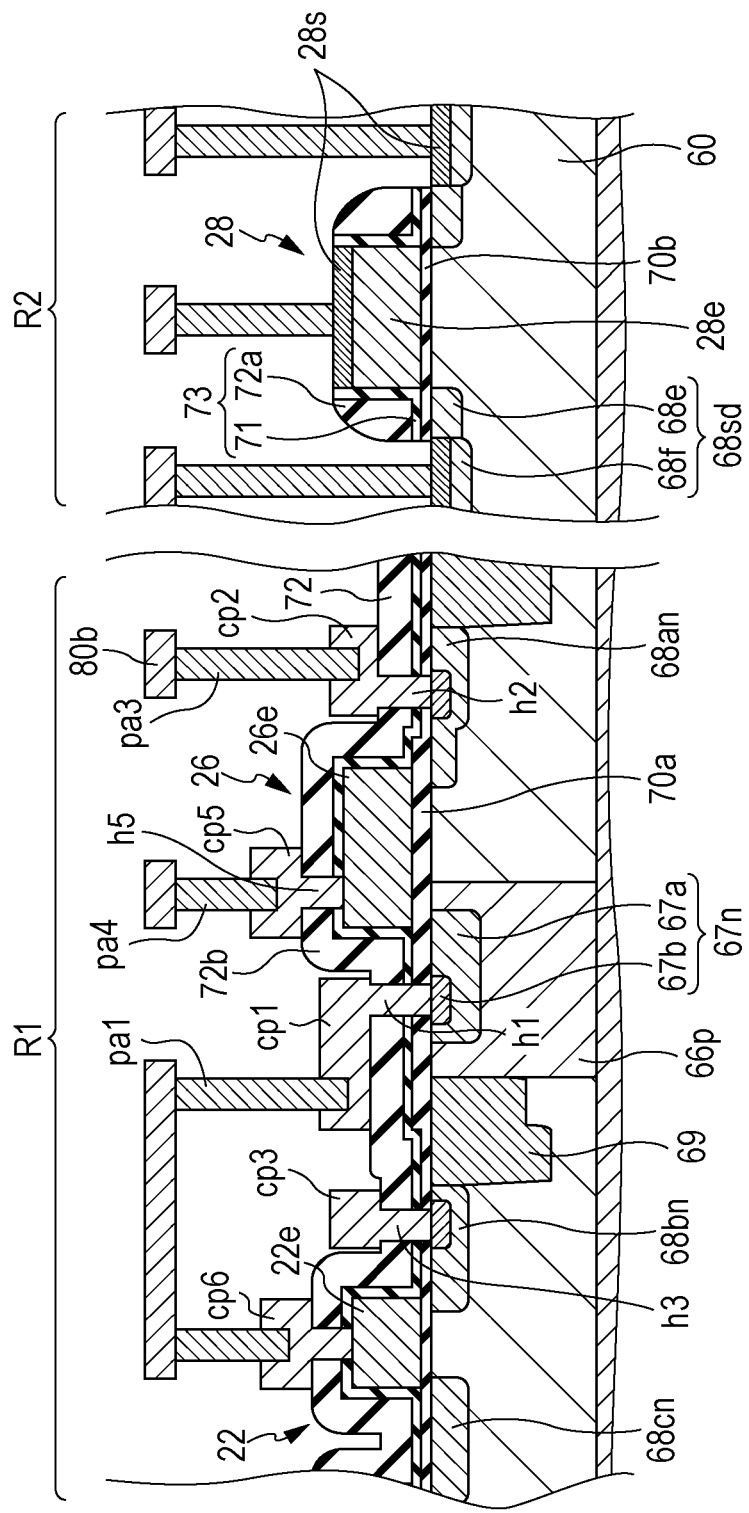
FIG. 6 is a schematic cross-sectional view showing extraction of a portion around an n-type impurity region of the imaging cell and of a portion around a transistor placed in the peripheral region.

FIG. 6 shows extraction of a portion around the n-type impurity region 67n of the imaging cell 10A and of a portion around the transistor 28 placed in the peripheral region R2. As schematically shown in FIG. 6, an insulating structure 73 is placed beside the gate electrode 28e of the transistor 28. This insulating structure 73 is formed at a position overlapping the first region 68e of the n-type impurity region 68sd. In this example, the insulating structure 73 includes a first portion 72a which is a part of the insulating layer 72, and a part of the insulating layer 71. In the insulating structure 73, the insulating layer 71 is interposed between the first portion 72a of the insulating layer 72 and the gate electrode 28e as well as between the first portion 72a of the insulating layer 72 and the second portion 70b of the insulating layer 70.

In the configuration exemplarily shown in FIG. 6, the transistor 28 includes metal silicide layers 28s, which are placed on an upper surface of each second region 68f of the n-type impurity region 68sd functioning as a drain region (or a source region) and on an upper surface of the gate electrode 28e. As illustrated in FIG. 6, contact plugs on the source region, the drain region, and the gate electrode 28e of the transistor 28 are connected to the metal silicide layers 28s. The contact resistance can be reduced by connecting the contact plugs onto the metal silicide layers 28s. In the transistor 28 in the peripheral region R2, improvement in current driving capability is given priority over noise reduction. Accordingly, in the transistor 28, the formation of the metal silicide layers 28s has an advantage in view of the improvement in current driving capability.

On the other hand, as shown on the left side in FIG. 6, no metal silicide layers are formed on the source regions and the drain regions of the transistors placed in the imaging region R1. When focusing on the n-type impurity region 67n, for example, no metal silicide layer is formed on the n-type impurity region 67n (the second region 67b in this case), and the contact plug cp1 is directly connected thereto. An increase in noise can be avoided by providing no metal silicide layers in the source regions and the drain regions of the transistors included in the imaging cell 10A. Meanwhile, an upper surface of the contact plug cp1 is not provided with a metal silicide layer. According to the investigation by the inventors involved in the present disclosure, formation of a metal silicide layer on a contact plug connected to an impurity region functioning as a part of a charge accumulation region leads to an increase in noise due to diffusion of the metal into the impurity region in the semiconductor substrate 60. As described in this example, by connecting the plug pa1 directly to the contact plug cp1 without interposing the metal silicide layer therebetween, it is possible to prevent diffusion of the metal (such as nickel) into the n-type impurity region 67n, and thus to suppress the noise.

Likewise, no metal silicide layer is formed on the n-type impurity region 68an functioning as the source region of the reset transistor 26, and the contact plug cp2 is directly connected thereto via the contact hole h2. Moreover, an upper surface of the contact plug cp2 is not provided with a metal silicide layer, and a plug pa3 to electrically connect the contact plug cp2 and the wiring layer 80b to each other is directly connected to the contact plug cp2.

Meanwhile, no metal silicide layers are basically formed on the gate electrodes (typically polycrystalline silicon electrodes) of the transistors placed in the imaging region R1 either. For example, the contact plug cp5 is connected to the gate electrode 26e of the reset transistor 26. In this example, a portion 72b of the insulating layer 72 covers the gate electrode 26e except a portion on the surface of the gate electrode 26e connected to the contact plug cp5 and a portion opposed to the gate insulating layer (the first portion 70a of the insulating layer 70 in this case). The contact plug cp5 is directly connected to the gate electrode 26e via the contact hole h5 provided in the portion 72b of the insulating layer 72. An upper surface of the contact plug cp5 is not provided with a metal silicide layer either, and a plug pa4 is directly connected to the contact plug cp5. The plug pa4 electrically connects the contact plug cp5 and the wiring layer 80b to each other.

The inventors involved in the present disclosure have confirmed that conduction can be secured between a contact plug (such as the contact plug cp5) and a plug (such as the plug pa4) directly connected to the contact plug even in the case of not providing the metal silicide layer on the contact plug. In the embodiment of the present disclosure, the transistors placed in the imaging region R1 are not provided with any metal silicide layers while the transistors placed in the peripheral region R2 are selectively provided with the metal silicide layers. As a consequence, it is possible to obtain a noise reduction effect on each transistor in the imaging region R1, to which leakage reduction is given priority over the current driving capacity, while securing the current driving capacity of each transistor in the peripheral region R2.

Here, attention is drawn to impurity profiles of the respective impurity regions formed in the semiconductor substrate 60. As described later in detail, the respective impurity regions in the semiconductor substrate 60 are typically formed by ion implantation. As schematically shown in FIG. 6, the first region 67a of the n-type impurity region 67n may have a greater implantation depth that those of the n-type impurity regions 68an, 68bn, and 68cn (and also that of the n-type impurity region 68dn which is not shown in FIG. 6).

Figure 7:
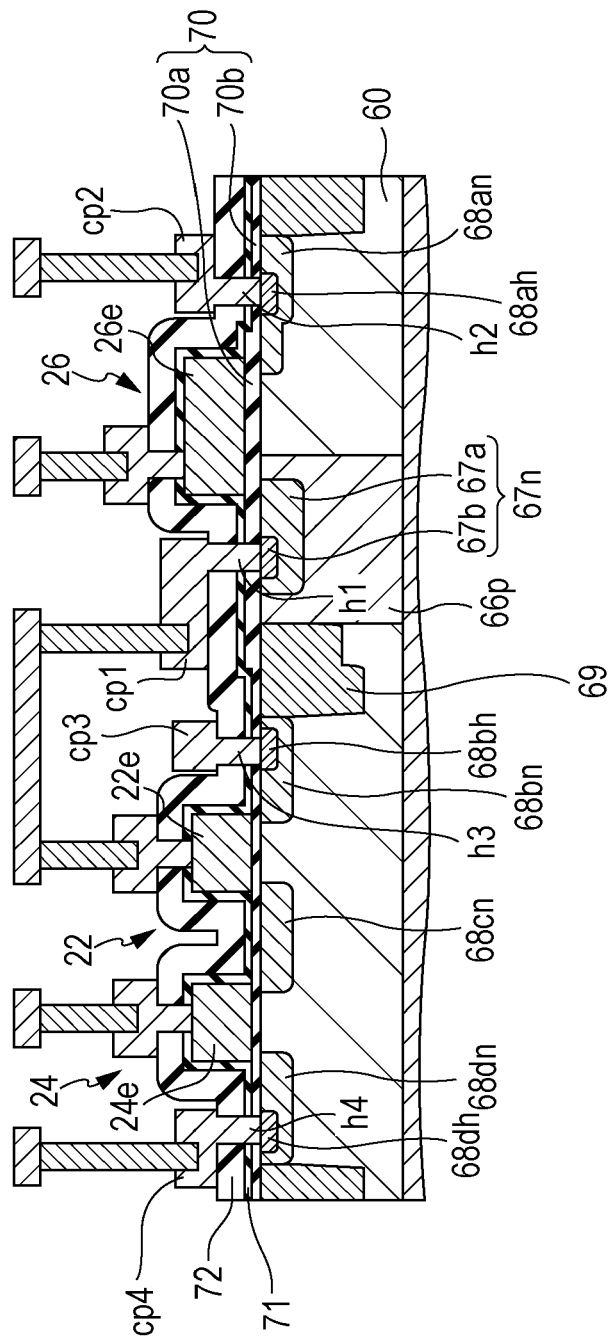
FIG. 7 is a view showing extraction of a portion in the vicinity of a surface of the semiconductor substrate in the device structure shown in FIG. 3.

FIG. 7 shows extraction of a portion in the vicinity of the surface of the semiconductor substrate 60 in the device structure shown in FIG. 3. In the example shown in FIG. 7, as with the n-type impurity region 67*n*, a high-concentration doped region 68*ah* is formed in the n-type impurity region 68*an* serving as the source region of the reset transistor 26. Meanwhile, a high-concentration doped region 68*bh* is formed in the n-type impurity region 68*bn* serving as the drain region of the amplification transistor 22. In the meantime, a high-concentration doped region 68*dh* is formed in the n-type impurity region 68*dn* serving as the source region of the address transistor 24. The high-concentration doped region 68*ah* is provided at a position overlapping the contact hole h2, and the contact plug cp2 is connected to the high-concentration doped region 68*ah*. Meanwhile, the high-concentration doped region 68*bh* is provided at a position overlapping the contact hole h3, and the contact plug cp3 is connected to the high-concentration doped region 68*bh*. In the meantime, the high-concentration doped region 68*dh* is provided at a position overlapping the contact hole h4, and the contact plug cp4 is connected to the high-concentration doped region 68*dh*.

As described above, the region having the relatively high impurity concentration may be provided in the source region and/or the drain region of the corresponding transistor in the imaging region R1. An effect to reduce the contact resistance is obtained by connecting the contact plug to the region doped at the high concentration. Meanwhile, punch-through is suppressed since the region doped at the high concentration is surrounded by the region having the relatively low impurity concentration. As described above, in the source region and/or the drain region of the transistor in the imaging region R1, where the noise reduction is given priority over the improvement in current driving capability, the region doped at the high concentration is placed in the region having the relatively low impurity concentration. On the other hand, when focusing on the drain region (and the source region) of the transistor 28 placed in the peripheral region R2 (see FIG. 6), the first region 68*e* having the relatively low impurity concentration is provided adjacent to the second region 68*f*, and an implantation depth of the second region 68*f* is greater than an implantation depth of the first region 68*e*.

Figure 8:
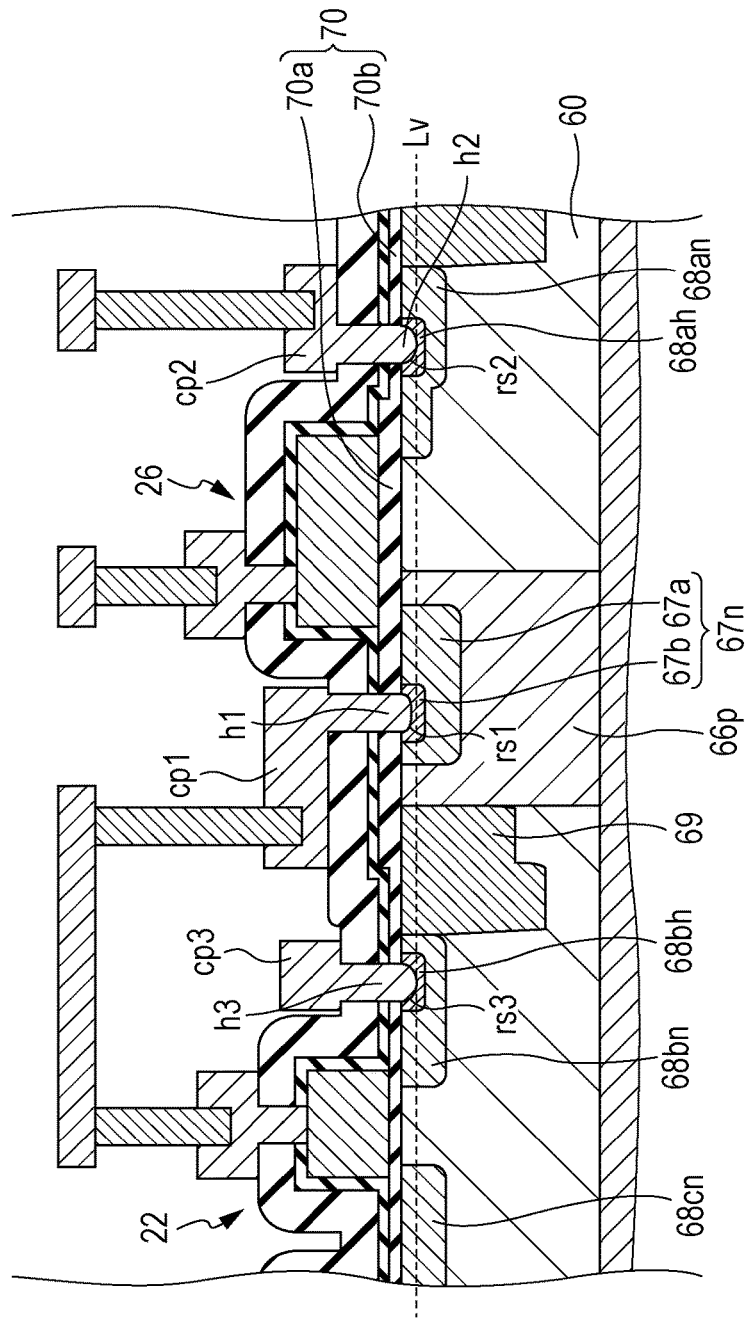
FIG. 8 is an enlarged schematic cross-sectional view showing a portion around a reset transistor and an amplification transistor.

FIG. 8 is an enlarged view showing a portion around the reset transistor 26 and the amplification transistor 22. In the configuration exemplarily shown in FIG. 8, the n-type impurity region 68*an* functioning as the source region of the reset transistor 26 is partially covered with the first portion 70*a* of the insulating layer 70, and the remaining portion thereof is covered with the second portion 70*b* of the insulating layer 70. Here, as schematically shown in FIG. 8, an implantation depth of the portion of the n-type impurity region 68*an* covered with the first portion 70*a* of the insulating layer 70 is smaller than an implantation depth of the portion covered with the second portion 70*b* of the insulating layer 70.

In this example, the contact hole h2 is located above the high-concentration doped region 68*ah* in the n-type impurity region 68*an*, and the contact plug cp2 is electrically connected to the high-concentration doped region 68*ah* through the contact hole h2. As with the contact hole h2, the contact hole h3 is located above the high-concentration doped region 68*bh* in the n-type impurity region 68*bn*, and the contact plug cp3 is electrically connected to the high-concentration doped region 68*bh* through the contact hole h3.

The surface of the semiconductor substrate 60 may be provided with recesses at junctions between the semiconductor substrate 60 and the contact plugs. In the configuration exemplarily shown in FIG. 8, the surface of the semiconductor substrate 60 abutting on the insulating layer 70 includes a first recess rs1 at a connecting part between the n-type impurity region 67*n* and the contact plug cp1, and a second recess rs2 at a connecting part between the n-type impurity region 68*ah* and the contact plug cp2. As schematically indicated with a dashed line Lv in FIG. 8, the second recess rs2 is deeper than the first recess rs1. Likewise, in this configuration, the surface of the semiconductor substrate 60 abutting on the insulating layer 70 includes a third recess rs3 at a connecting part between the n-type impurity region 68*bh* and the contact plug cp3. The third recess rs3 is deeper than the first recess rs1 due to the following reason. Specifically, when etching is used to form the contact holes h1 to h3, an over-etched portion on the n-type impurity region 67*n* becomes smaller than other portions because the first portion 70*a* of the insulating layer 70 covering the n-type impurity region 67*n* is thicker than the second portion 70*b* covering the n-type impurity regions 68*an* and 68*bn*. However, there may be a case where the depth of the first recess rs1 becomes substantially equal to zero, or in other words, there may be a case where no recess is made at the connecting part between the n-type impurity region 67*n* and the contact plug cp1. Meanwhile, although FIG. 8 shows as if the second recess rs2 and the third recess rs3 have the same depth, these recesses need not have the same depth.

(Manufacturing Method)

Now, an exemplary manufacturing method of an imaging device according to the first embodiment will be described with reference to FIGS. 9 to 25. FIGS. 9 to 25 are views for explaining the exemplary manufacturing method of an imaging device according to the first embodiment. In each of FIGS. 9 to 25, a combination of the imaging region R1 and the peripheral region R2 is illustrated in one drawing.

Figure 9:
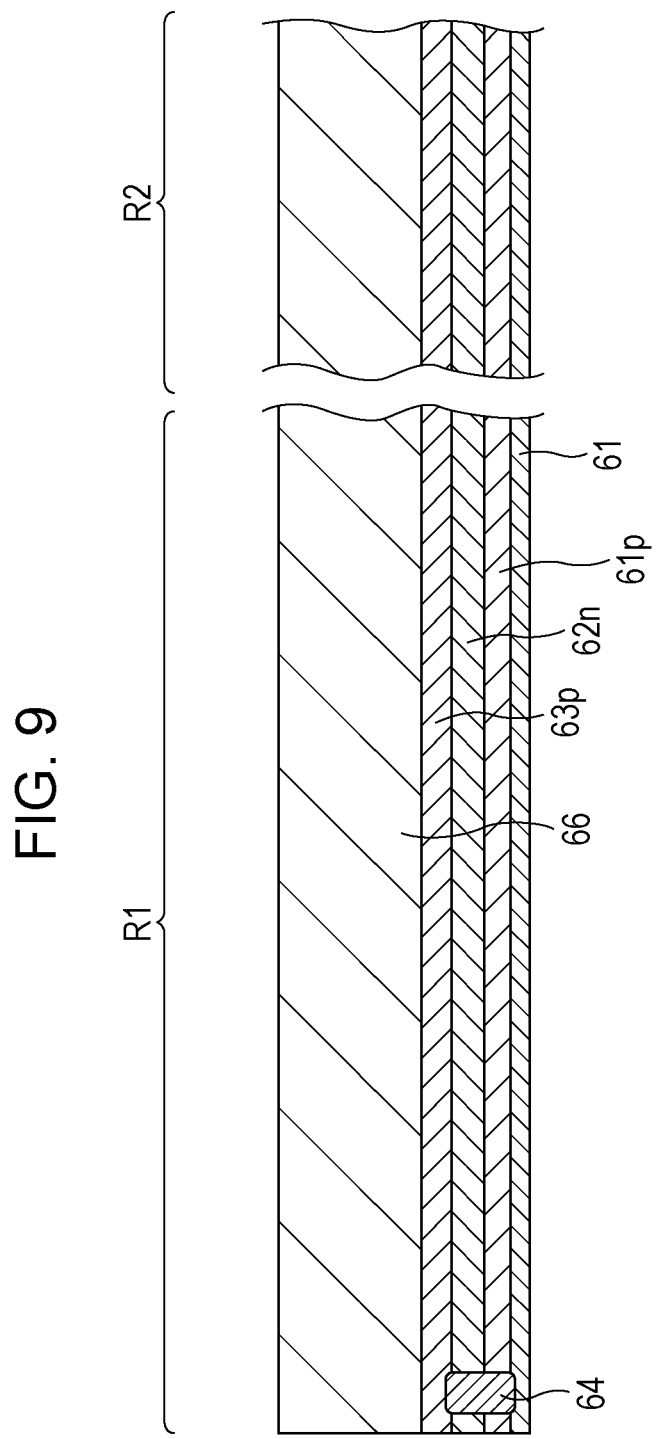
FIG. 9 is a schematic cross-sectional view for explaining an exemplary manufacturing method of an imaging device according to the first embodiment.

First, a semiconductor substrate is prepared by forming the signal detection circuits and the peripheral circuitries for the respective imaging cells thereon. Here, the p-type semiconductor layer 61*p*, the n-type semiconductor layer 62*n*, and the p-type semiconductor layer 63*p* are sequentially formed on the supporting substrate 61 (which is a p-type Si substrate in this case) by using an epitaxy method and ion implantation (FIG. 9). At this time, the p-type region 64 to electrically connect the p-type semiconductor layer 63*p* and the supporting substrate 61 to each other is also formed. Thereafter, a p-type impurity layer 66 doped at a low concentration is formed on the p-type semiconductor layer 63*p*.

Figure 10:
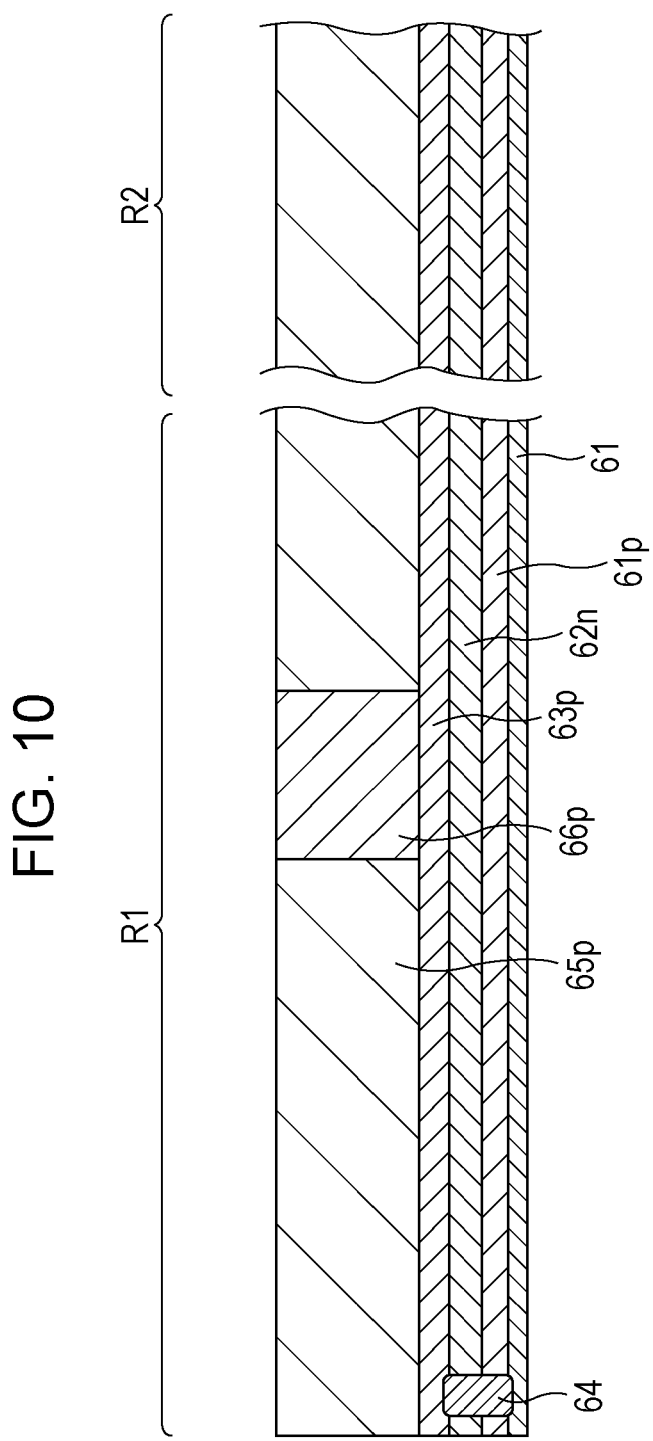
FIG. 10 is a schematic cross-sectional view for explaining the exemplary manufacturing method of an imaging device according to the first embodiment.
Figure 11:
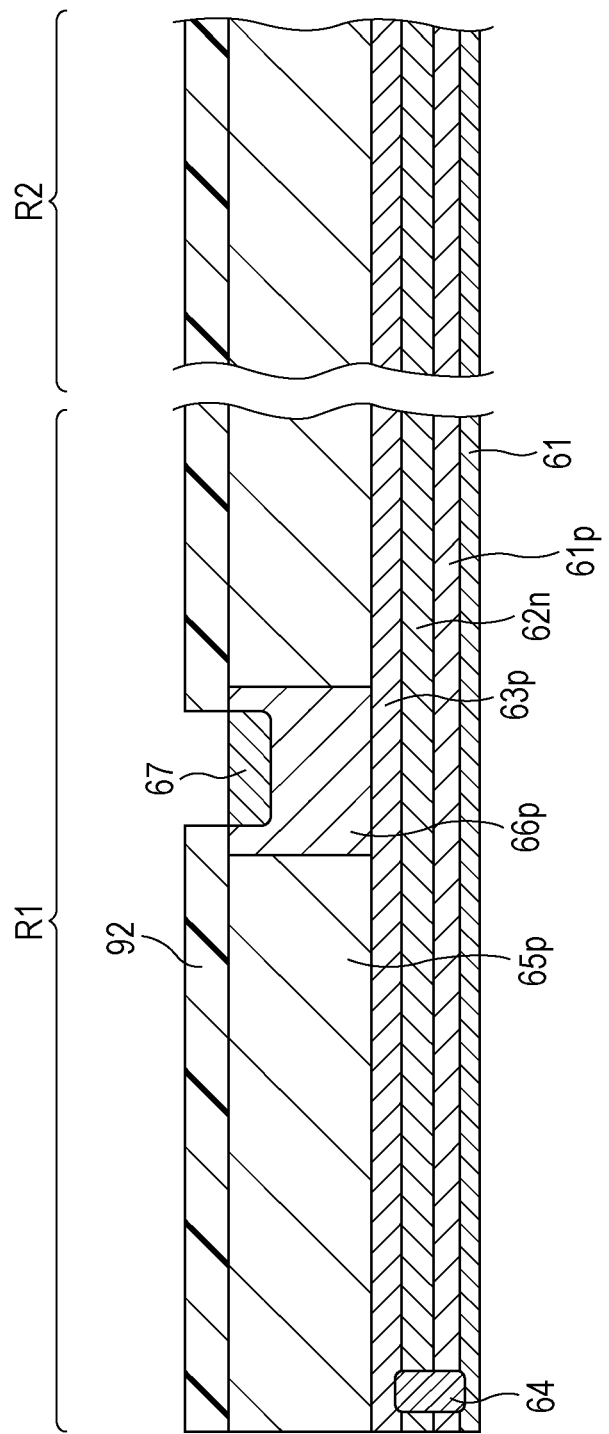
FIG. 11 is a schematic cross-sectional view for explaining the exemplary manufacturing method of an imaging device according to the first embodiment.

Next, a resist mask (not shown in FIG. 10) is formed on a part of the p-type impurity layer 66, then an impurity is selectively implanted into a region not covered with the resist mask, thus forming the p-type semiconductor layer 65*p* including the p-type impurity region 66*p* having a relatively low impurity concentration (FIG. 10). Then, an upper part of the p-type semiconductor layer 65*p* except a partial region on the p-type impurity region 66*p* is covered with a resist 92, and an n-type impurity region 67 is formed in the p-type impurity region 66*p* by ion implantation (FIG. 11).

Figure 12:
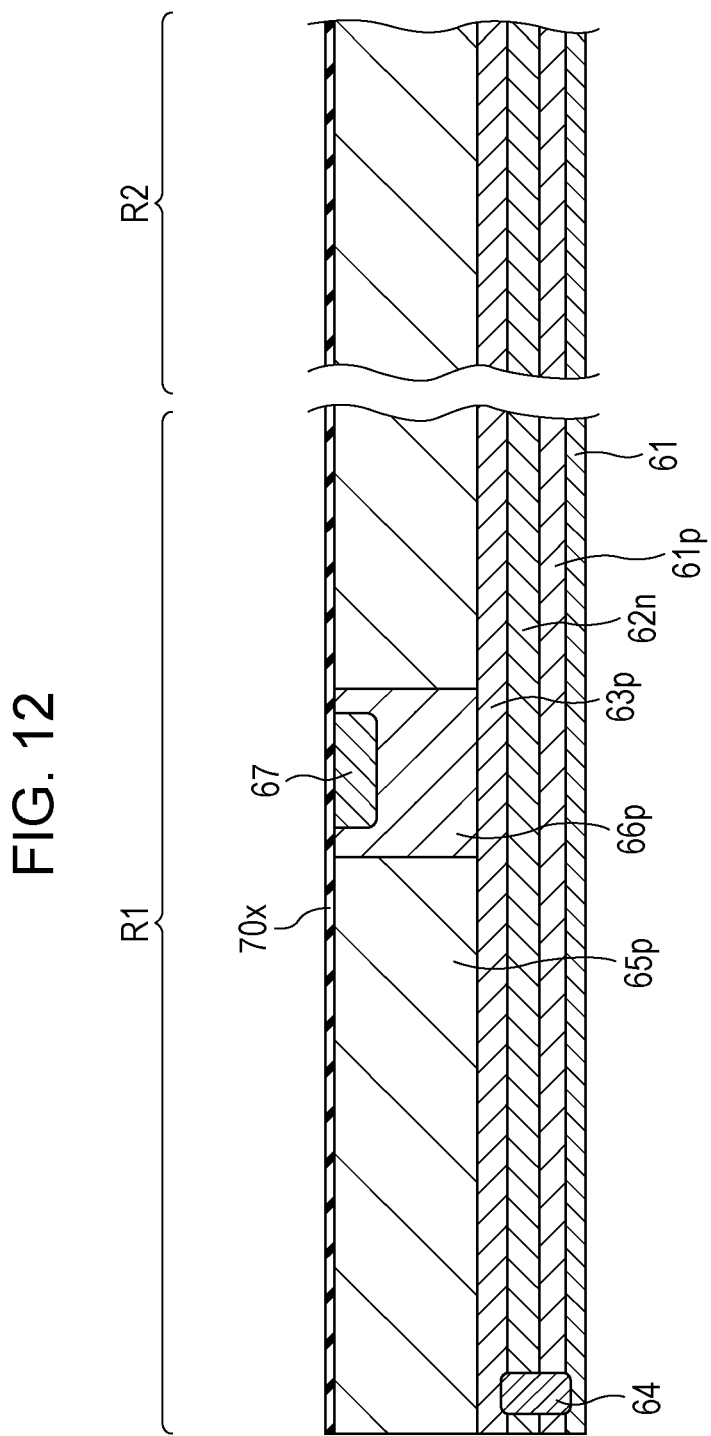
FIG. 12 is a schematic cross-sectional view for explaining the exemplary manufacturing method of an imaging device according to the first embodiment.
Figure 13:
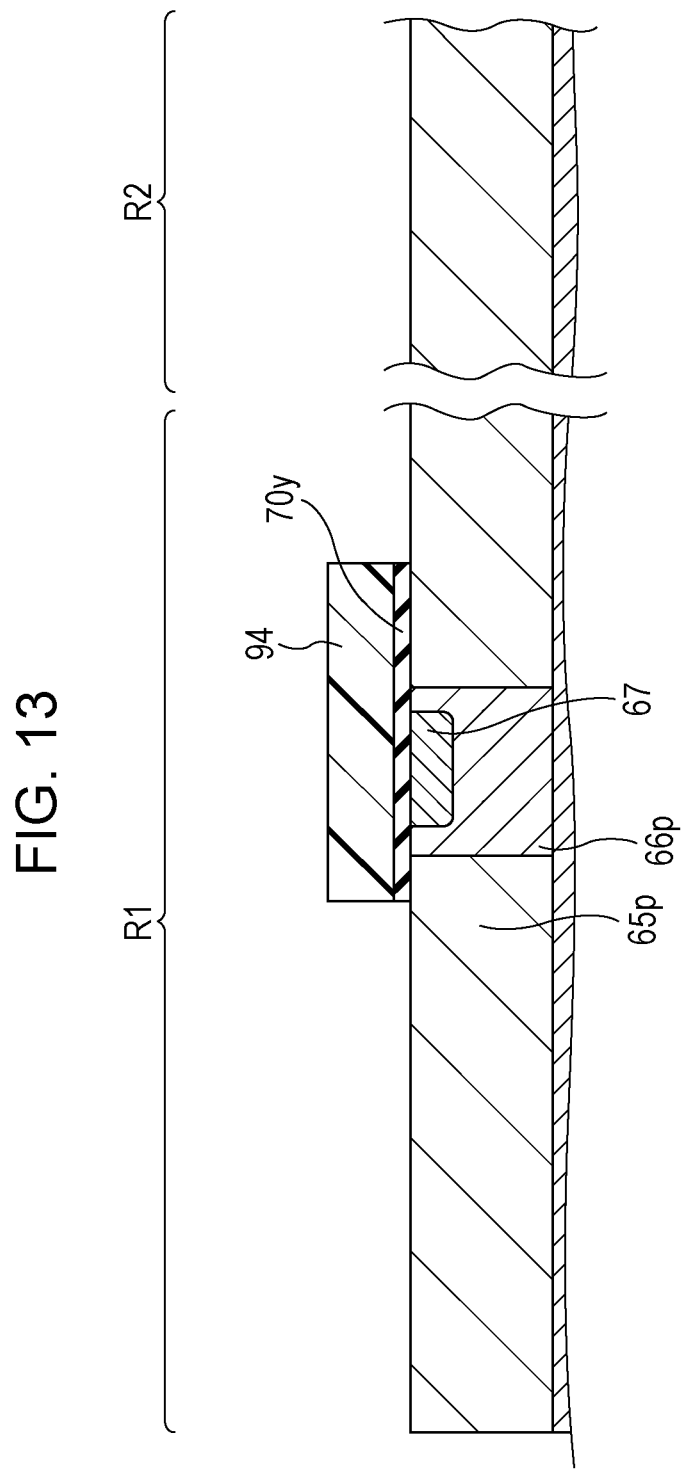
FIG. 13 is a schematic cross-sectional view for explaining the exemplary manufacturing method of an imaging device according to the first embodiment.

After the resist 92 is removed, an insulating layer 70*x* (which is a SiO$_2$ layer in this case) is formed on the entire surface of the p-type semiconductor layer 65*p* by thermal oxidation, for example (FIG. 12). In addition, a resist 94 patterned in such a way as to cover the p-type impurity region 66p is formed on the insulating layer 70x, and the insulating layer 70x is removed from above such regions other than the portion covered with the resist 94. Thus, an insulating layer 70y covering at least the n-type impurity region 67 is selectively formed on the p-type impurity region 66p (FIG. 13).

Figure 14:
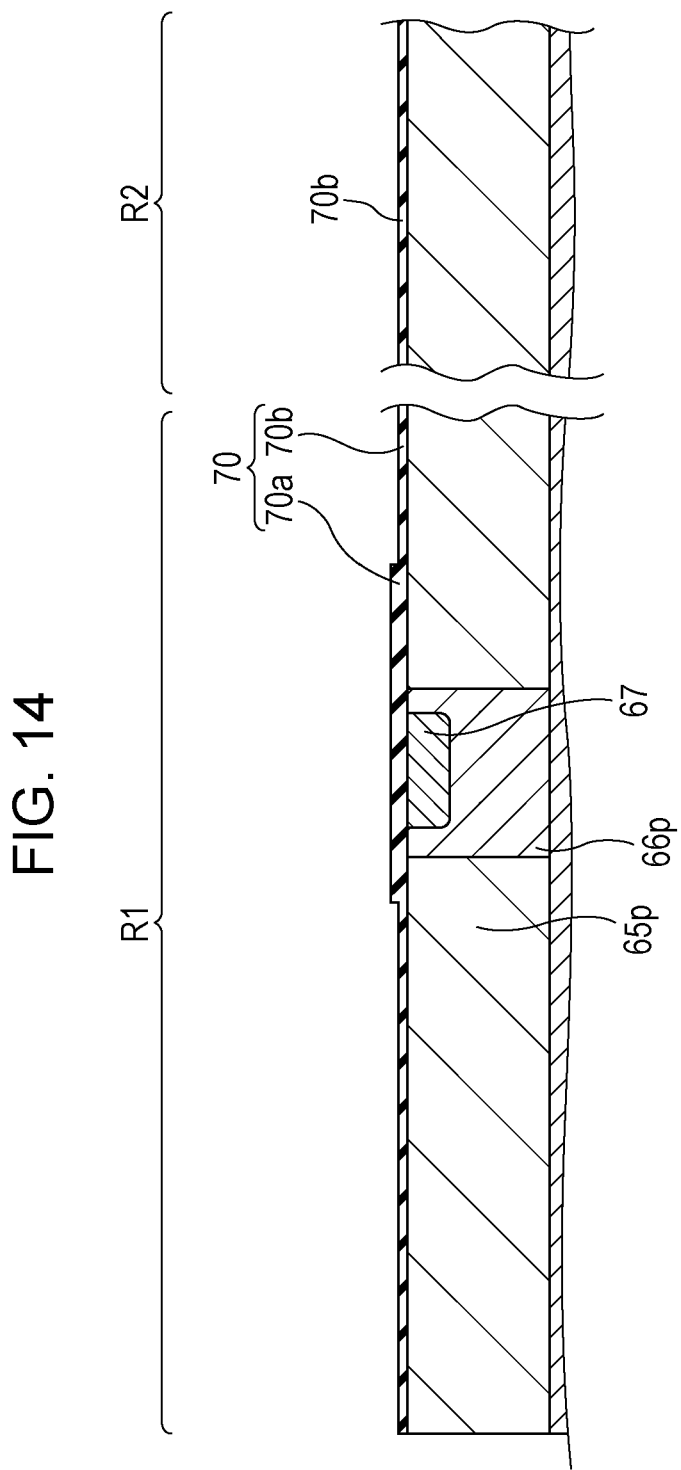
FIG. 14 is a schematic cross-sectional view for explaining the exemplary manufacturing method of an imaging device according to the first embodiment.

After the resist 94 is removed, a thermal oxidation film is formed on a surface of the p-type impurity region 66p by thermal oxidation, for example. Thus, the insulating layer 70 containing the above-described insulating layer 70y as a part while covering the entire surface of the p-type semiconductor layer 65p can be formed on the p-type semiconductor layer 65p (FIG. 14). The insulating layer 70 includes the relatively thick first portion 70a that covers the n-type impurity region 67, and the second portion 70b thinner than the first portion 70a. As schematically shown in FIG. 14, the first portion 70a of the insulating layer 70 has a greater area than the n-type impurity region 67, and spreads to the outside of the p-type impurity region 66p in this case. Of the p-type semiconductor layer 65p, the portion located in the peripheral region R2 is covered with the second portion 70b of the insulating layer 70. As has been described previously, while the second portion 70b of the insulating layer 70 has the thickness of about 10 nm, the first portion 70a may have the thickness of about 20 nm.

Figure 15:
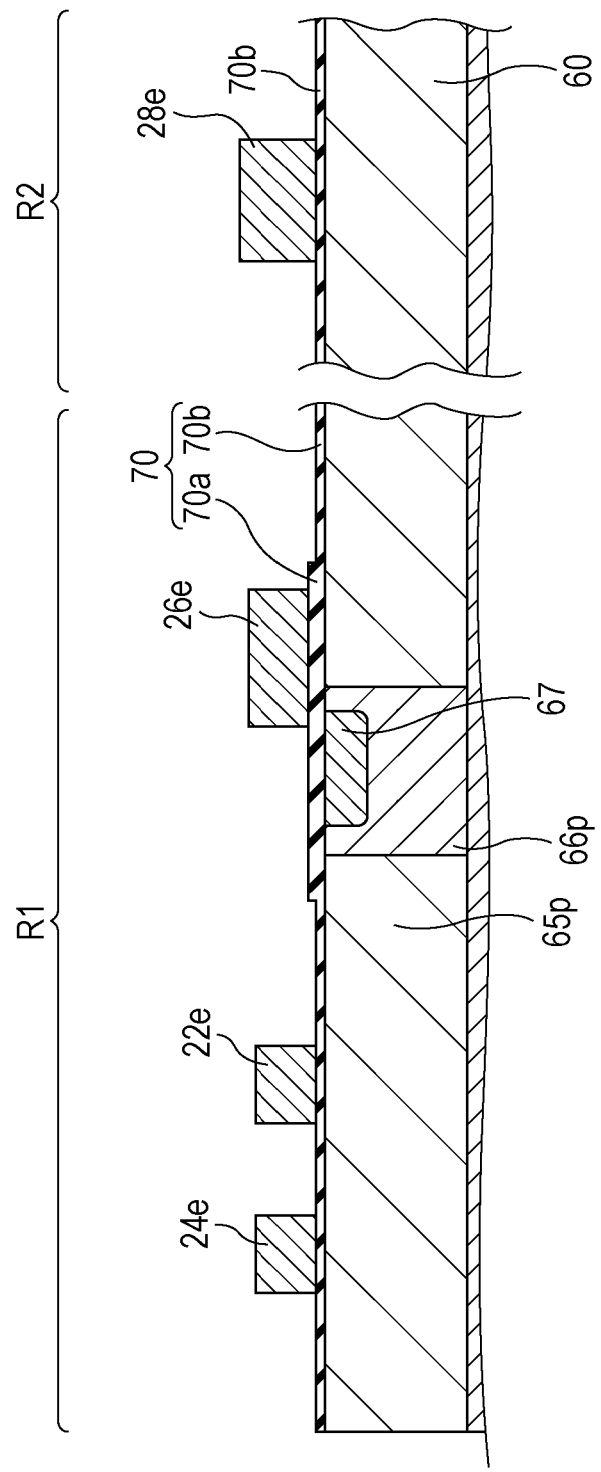
FIG. 15 is a schematic cross-sectional view for explaining the exemplary manufacturing method of an imaging device according to the first embodiment.

Thereafter, the gate electrodes 26e, 22e, 24e, and 28e are formed at such positions on the insulating layer 70 to place the reset transistor 26, the amplification transistor 22, the address transistor 24, and the transistor 28 in the peripheral region R2 (FIG. 15). Here, polycrystalline silicon is deposited on the insulating layer 70 by LP (low-pressure)-CVD. After implanting the impurity into the deposited polycrystalline silicon, annealing is carried out to diffuse the impurity into the polycrystalline silicon layer. To be more precise, in a region where an n-channel MOS is to be placed, phosphorus (P) is implanted while covering the remaining region with a resist. After removing the resist, another resist is formed to cover a portion other than the region where a p-channel MOS is to be placed, then boron (B) is implanted and this resist is removed. Thereafter, an unnecessary portion of the polycrystalline silicon layer is removed by dry etching while applying photolithography. Thus, the polycrystalline silicon electrode can be selectively formed on the insulating layer 70. At this time, since the n-type impurity region 67n is covered with the relatively thick first portion 70a of the insulating layer 70. As a consequence, it is possible to reduce damage on the n-type impurity region 67n and the periphery thereof at the time of etching the polycrystalline silicon as compared to damage on other regions covered with the second portion 70b. Here, as shown in FIG. 15, the gate electrode 26e is placed on the first portion 70a of the insulating layer 70. On the other hand, the gate electrodes 22e, 24e, and 28e are placed on the second portion 70b of the insulating layer 70.

Figure 16:
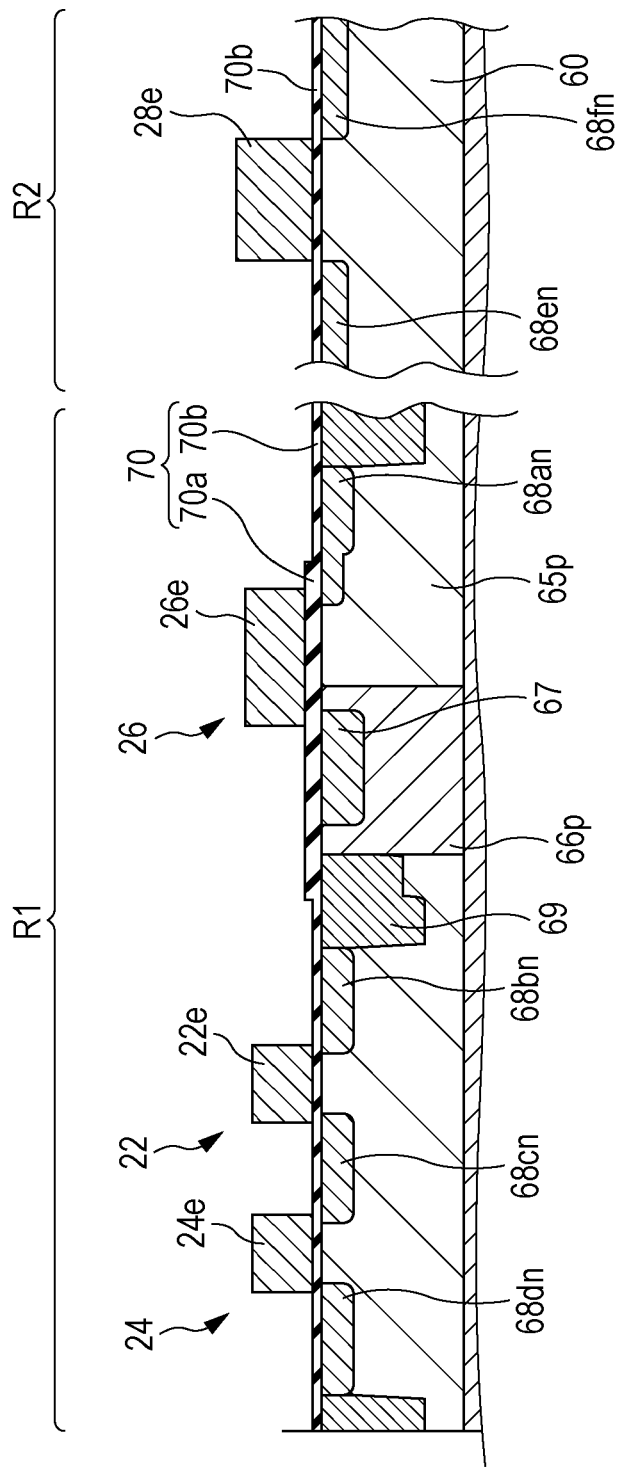
FIG. 16 is a schematic cross-sectional view for explaining the exemplary manufacturing method of an imaging device according to the first embodiment.

Next, a desired resist pattern is formed on the insulating layer 70, and the n-type impurity regions 68an, 68bn, 68cn, and 68dn are formed in the imaging region R1 and n-type impurity regions 68en and 68fn are formed in the peripheral region R2, respectively, by ion implantation while using the resist, the gate electrodes 26e, 22e, 24e, and 28e collectively as a mask (FIG. 16). Annealing may be executed after the ion implantation. Each of the n-type impurity regions 68an, 68bn, 68cn, 68dn, 68en, and 68fn is typically a diffused region. In this way, the reset transistor 26, the amplification transistor 22, and the address transistor 24 are formed in the semiconductor substrate 60. As schematically shown in FIG. 16, the reset transistor 26 includes a part of the first portion 70a of the insulating layer 70 as the gate insulating layer, while each of the amplification transistor 22 and the address transistor 24 includes a part of the second portion 70b of the insulating layer 70 as the gate insulating layer. Note that the n-type impurity regions 68en and 68fn are regions corresponding to the source region and the drain region of the above-mentioned transistor 28, respectively.

Meanwhile, the element isolation regions 69 are formed around the set of the amplification transistor 22 and the address transistor 24 and around the reset transistor 26. For example, the element isolation regions 69 can be formed by forming a desired resist pattern on the insulating layer 70 and performing ion implantation of boron, for instance, under given implantation conditions. In the configuration shown in FIG. 16, the element isolation region 69 between the reset transistor 26 and the amplification transistor 22 overlaps a part of the first portion 70a pf the insulating layer 70 and a part of the second portion 70b thereof. Since the first portion 70a is thicker than the second portion 70b, in the element isolation region 69 between the reset transistor 26 and the amplification transistor 22, the implantation depth on the reset transistor 26 side is smaller than the implantation depth on the amplification transistor 22 side. Here, it is to be noted that the n-type impurity region 68an also overlaps a part of the first portion 70a of the insulating layer 70 and a part of the second portion 70b thereof as with the element isolation region 69 between the reset transistor 26 and the amplification transistor 22. In this case, as shown in FIG. 16, the implantation depth of the n-type impurity region 68an immediately below the first portion 70a is smaller than the implantation depth thereof immediately below the second portion 70b.

Figure 17:
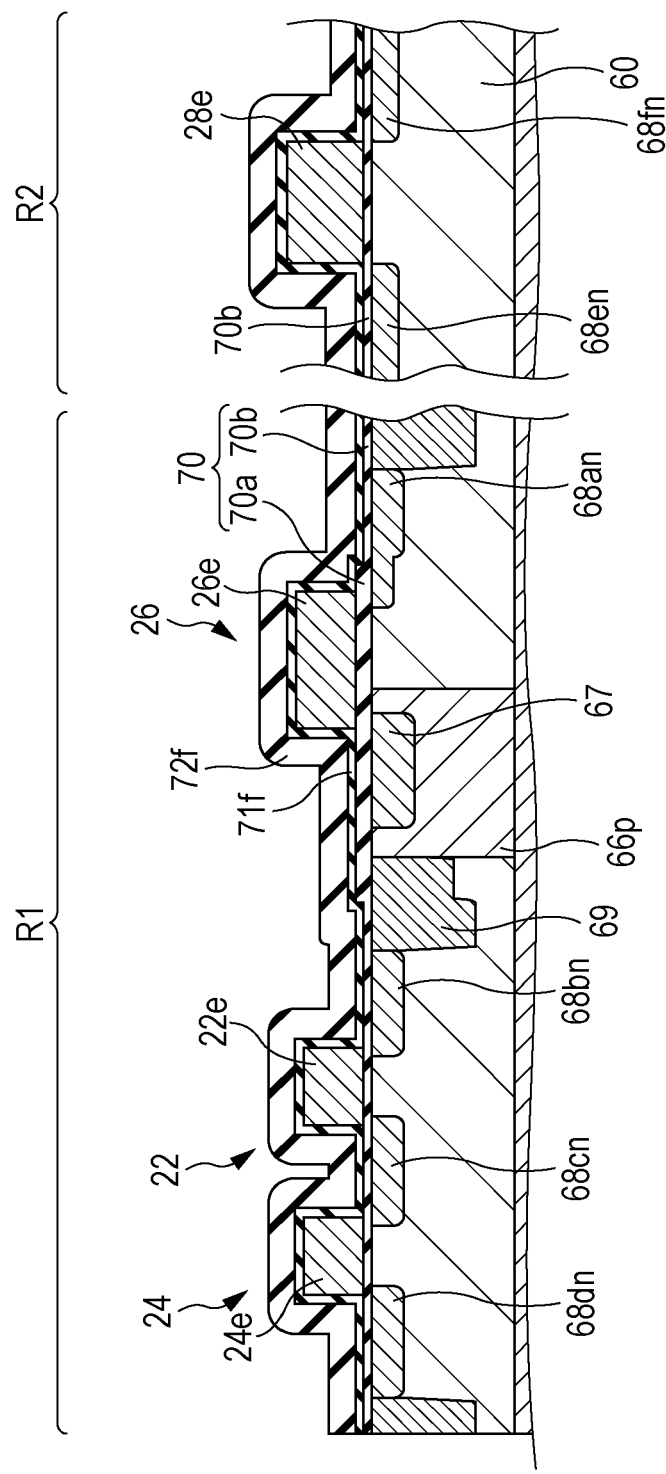
FIG. 17 is a schematic cross-sectional view for explaining the exemplary manufacturing method of an imaging device according to the first embodiment.

Next, an insulating film is formed to cover the insulating layer 70 as well as the gate electrodes 22e, 24e, 26e, and 28e on the insulating layer 70. Here, a stacked structure of an insulating film 71f and an insulating film 72f is formed by sequentially depositing insulating materials that are different from each other (FIG. 17). For example, the insulating film 71f and the insulating film 72f are a SiO₂ film and a SiN film formed by the LP-CVD, respectively.

Figure 18:
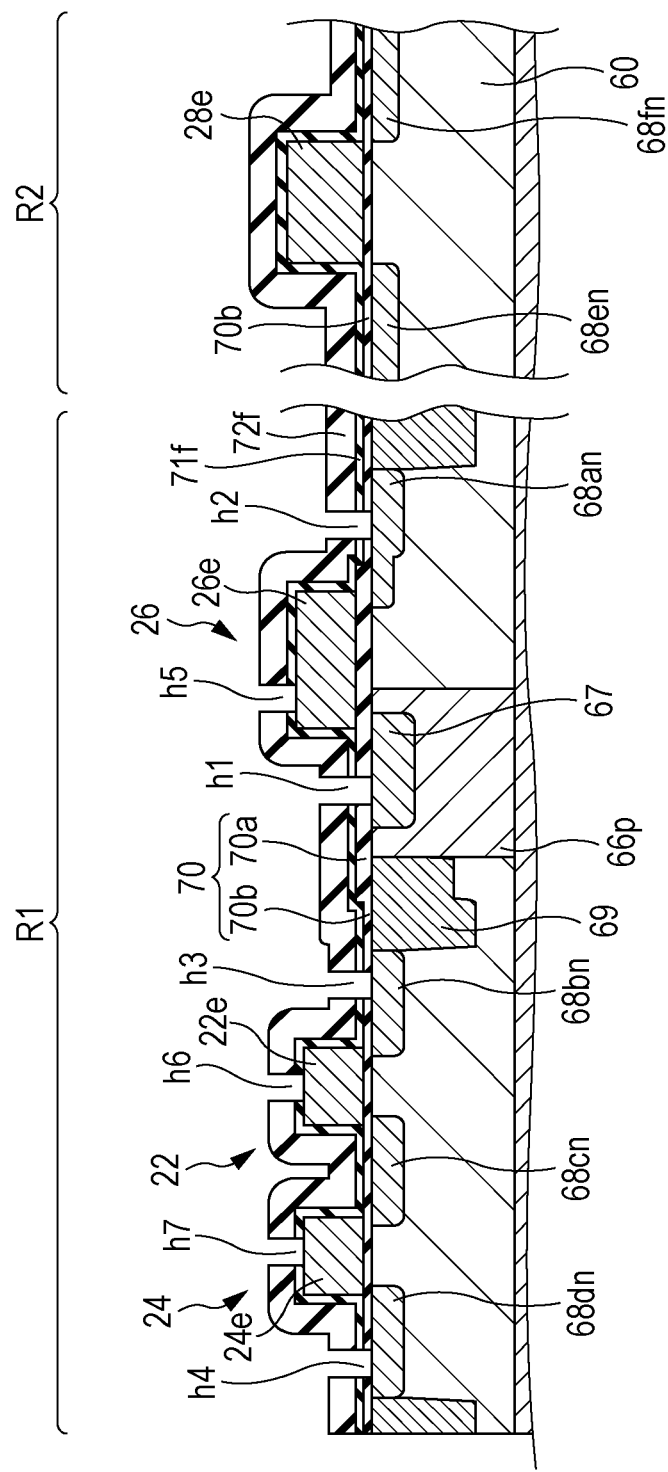
FIG. 18 is a schematic cross-sectional view for explaining the exemplary manufacturing method of an imaging device according to the first embodiment.

Next, the contact holes h1 to h4 reaching the surface of the semiconductor substrate 60 are formed on the n-type impurity region 67, on the n-type impurity region 68an, on the n-type impurity region 68bn, and on the n-type impurity region 68dn, respectively, by applying photolithography and dry etching (typically plasma etching) (FIG. 18). As shown in FIG. 18, the contact holes h5 to h7 are also provided at portions of the insulating film 71f and the insulating film 72f covering the gate electrodes 26e, 22e, and 24e, respectively. At this time, since the n-type impurity region 67 is covered with the relatively thick first portion 70a of the insulating layer 70, it is possible to reduce the damage on the n-type impurity region 67 during the etching as compared to damage on other regions covered with the second portion 70b.

Figure 19:
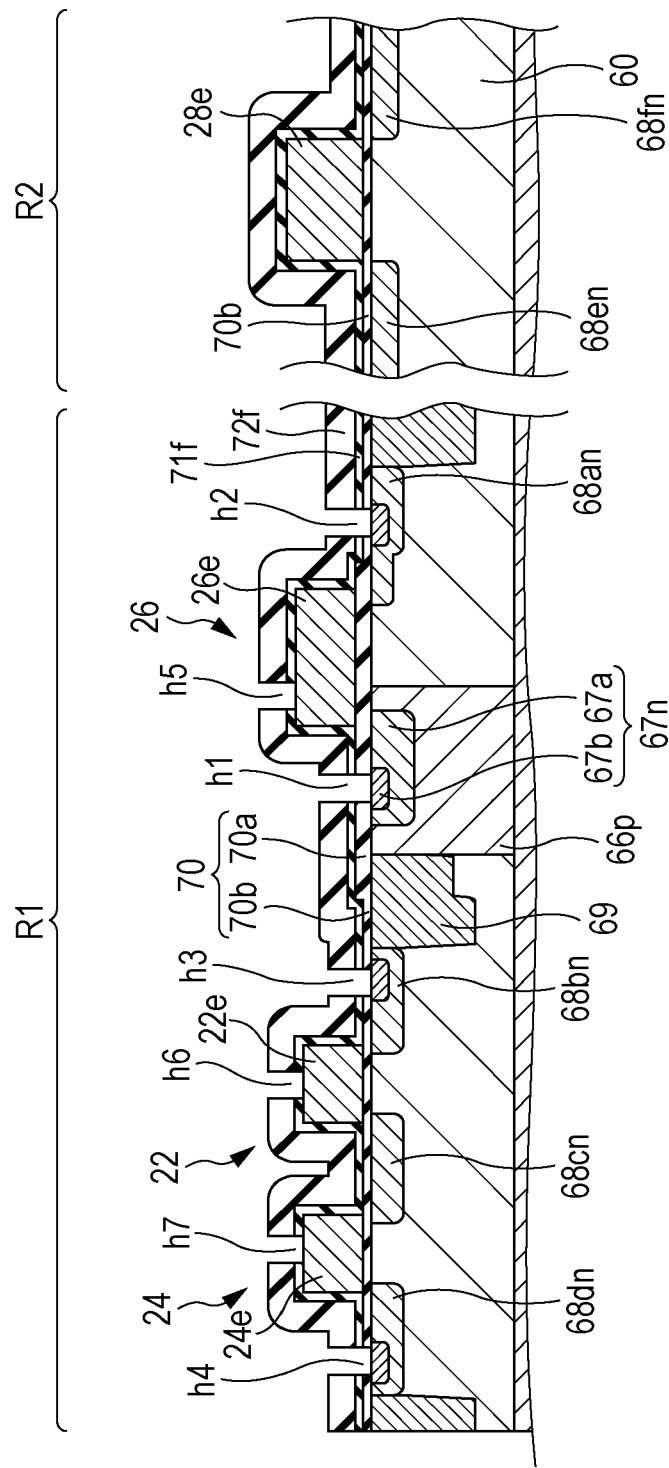
FIG. 19 is a schematic cross-sectional view for explaining the exemplary manufacturing method of an imaging device according to the first embodiment.

Next, ion implantation through the contact holes h1 to h4 is conducted (FIG. 19). In this way, it is possible to form the n-type impurity region 67n which includes the first region 67a and the second region 67b having the higher impurity concentration than that of the first region 67a. Here, the region having the relatively high impurity concentration is also formed in each of the n-type impurity regions 68an, 68bn, and 68dn by ion implantation through the contact holes h2 to h4.

Figure 20:
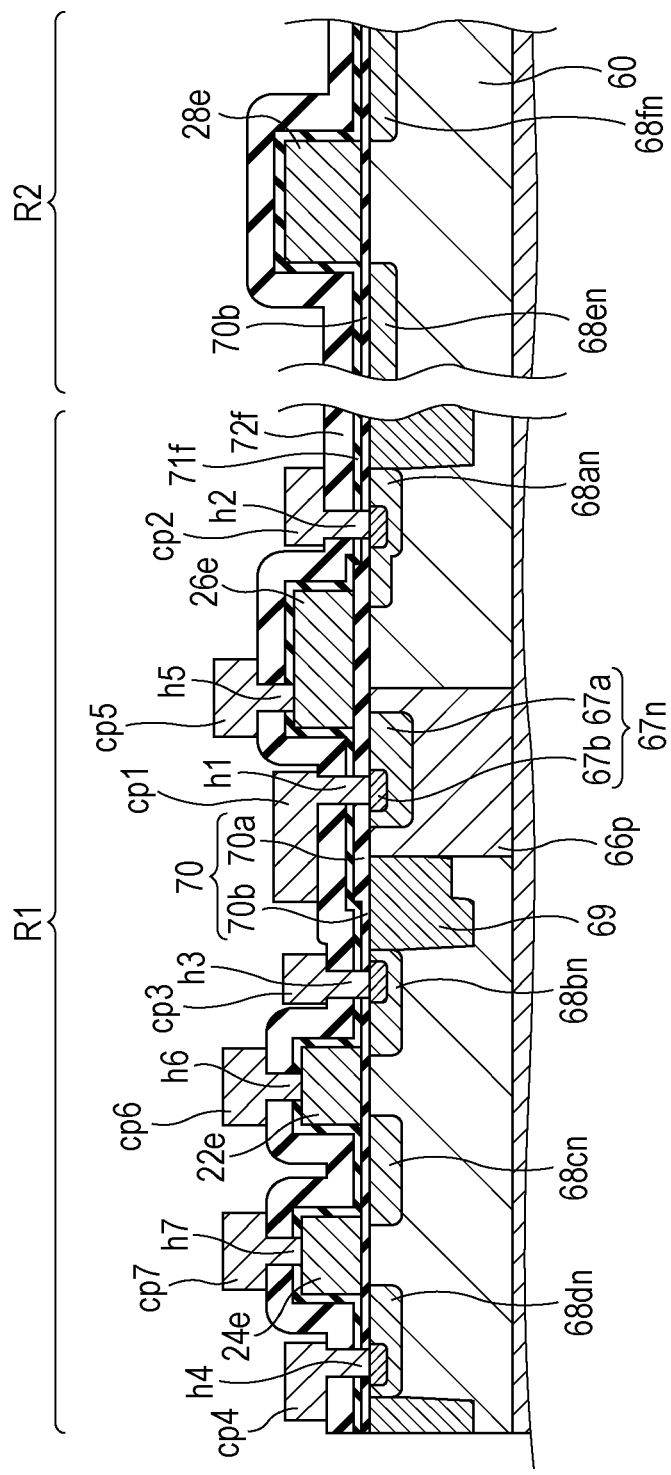
FIG. 20 is a schematic cross-sectional view for explaining the exemplary manufacturing method of an imaging device according to the first embodiment.

Next, polycrystalline silicon doped with P (phosphorus), for example, is deposited on the insulating layer 70 by applying the LP-CVD. Thereafter, an unnecessary portion of the polycrystalline silicon layer is removed by photolithography and dry etching. Thus, the contact plugs cp1 to cp7 are formed at the positions of the contact holes h1 to h7, respectively (FIG. 20). Of the contact plugs cp1 to cp7, the contact plug cp1 is connected to the second region 67b of the n-type impurity region 67n through the contact hole h1, for example. The contact plugs cp2 and cp3 are connected to the high-concentration doped regions of the n-type impurity regions 68an and 68bn through the contact holes h2 and h3, respectively. The contact resistance is reduced by connecting each contact plug to the region having the relatively high impurity concentration. For example, the contact plugs cp5 and cp6 are connected to the gate electrodes 26e and 22e through the contact holes h5 and h6, respectively.

Figure 21:
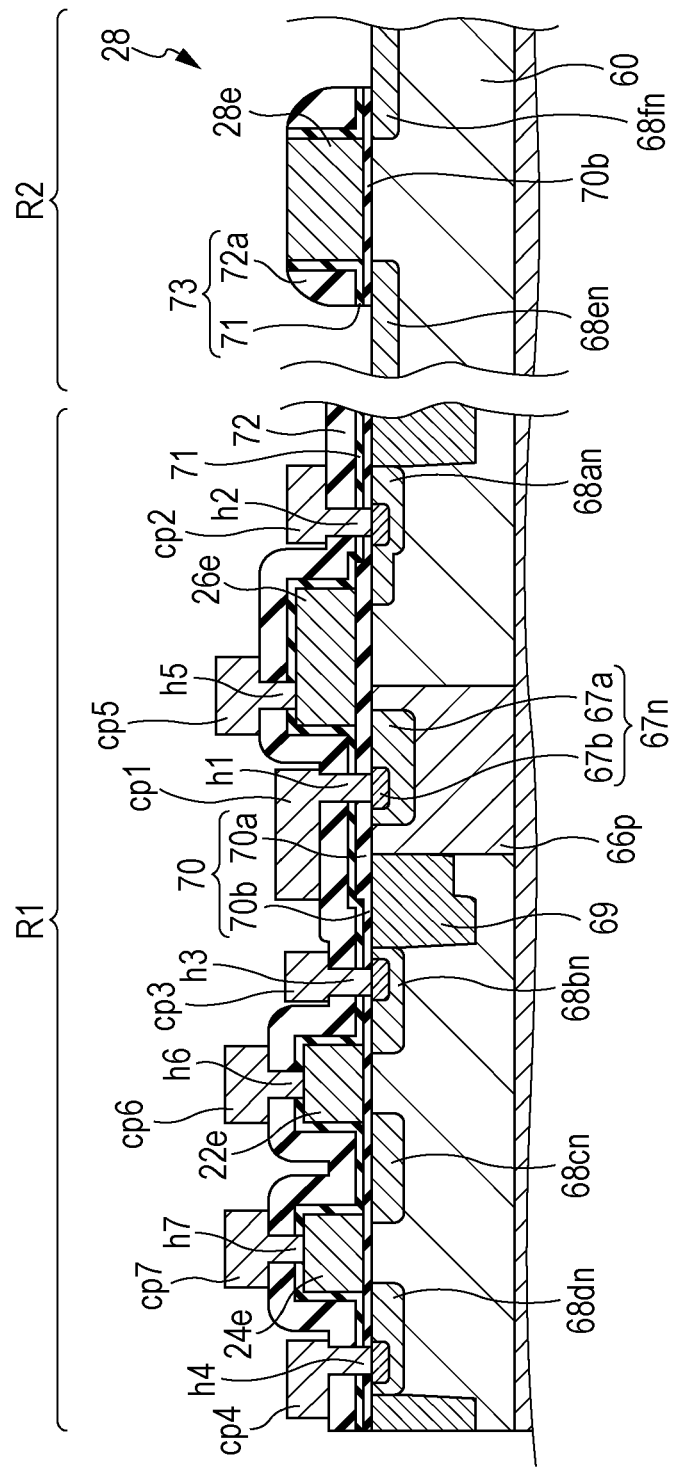
FIG. 21 is a schematic cross-sectional view for explaining the exemplary manufacturing method of an imaging device according to the first embodiment.

Regarding the peripheral region R2, the imaging region R1 is covered with a resist after the formation of the contact plugs cp1 to cp7, and then anisotropic etching is applied. Thus, it is possible to form the insulating structure 73 beside the gate electrode 28e (FIG. 21). For example, the insulating layer 70 (which is a part of its second portion 70b in this case), the insulating film 71f, and the insulating film 72f are selectively removed from above the n-type impurity regions 68en and 68fn, except the portion in the vicinity of the gate electrode 28e. Furthermore, the insulating film 71f and the insulating film 72f are selectively removed from above the gate electrode 28e. In this example, the insulating structure 73 includes a part of the insulating layer 71 (a portion having an L-shaped cross section in FIG. 21) and a part of the insulating layer 72 (the first portion 72a), and has overlap with a part of n-type impurity region 68en and a part of the n-type impurity region 68fn. According to the embodiment of the present disclosure, the contact plugs cp1 to cp4 are formed before the formation of the insulating structure 73. Thus, damage on the semiconductor substrate 60 associated with the etching for forming the insulating structure 73 is suppressed. As a consequence, the effect to suppress the leakage current attributed to crystal defects is obtained.

Figure 22:
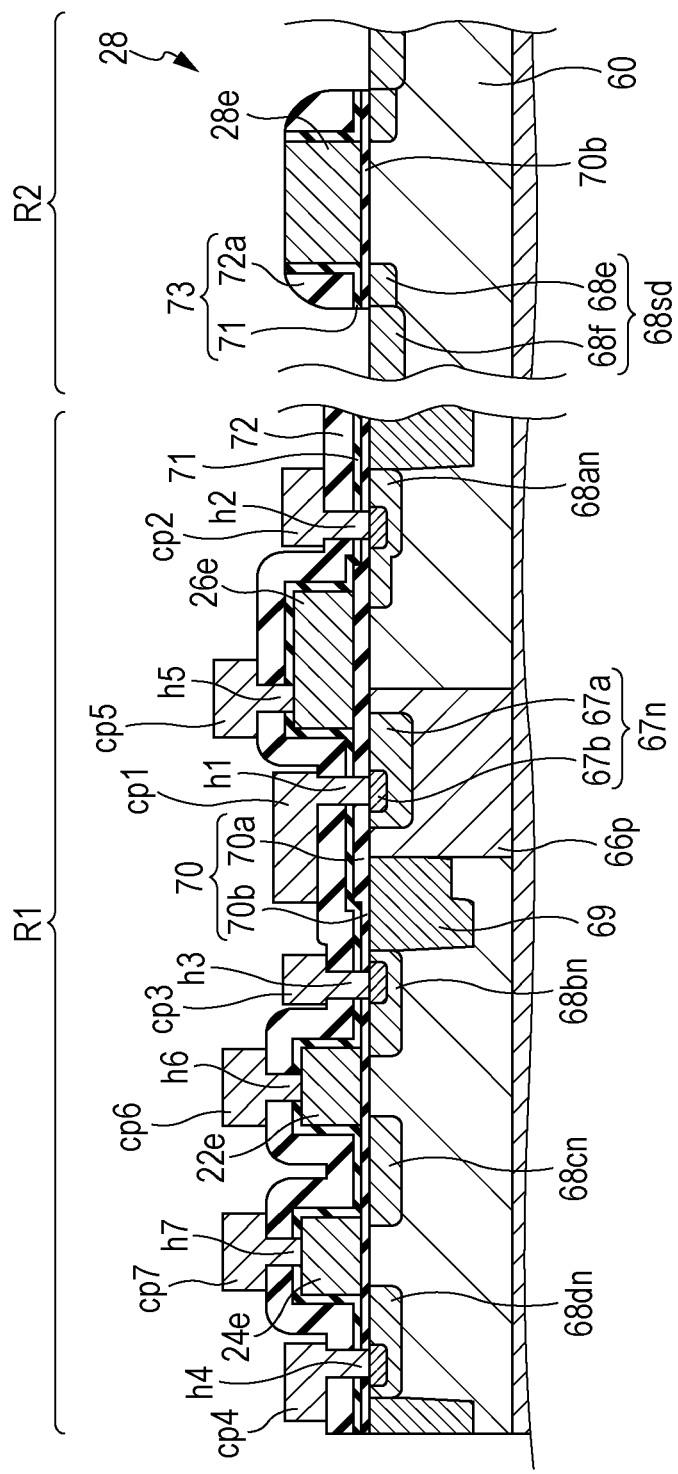
FIG. 22 is a schematic cross-sectional view for explaining the exemplary manufacturing method of an imaging device according to the first embodiment.

Thereafter, the impurity is implanted into the n-type impurity regions 68en and 68fn by using the gate electrode 28e and the insulating structure 73 (as well as the insulating layer 70) collectively as a mask. Thus, the n-type impurity region 68sd serving as the source region or the drain region can be placed on each of two sides of the gate electrode 28e (FIG. 22). The n-type impurity region 68sd includes the first region 68e and the second region 68f having a higher impurity concentration than that of the first region 68e. After the impurity implantation, annealing takes place for activation. As seen from FIG. 22, the transistor 28 in the peripheral region R2 includes a part of the second portion 70b of the insulating layer 70 as the gate insulating layer. It is to be noted that the second region 68f with the relatively high impurity concentration has a greater implantation depth than that of the first region 68e in the source/drain regions of the transistor 28 in the peripheral region R2, whereas the region having the higher impurity concentration (such as the second region 67b) is placed in the region having the relatively low impurity concentration (such as the first region 67a) in the case of the transistor (such as the reset transistor 26) in the imaging region R1.

Figure 23:
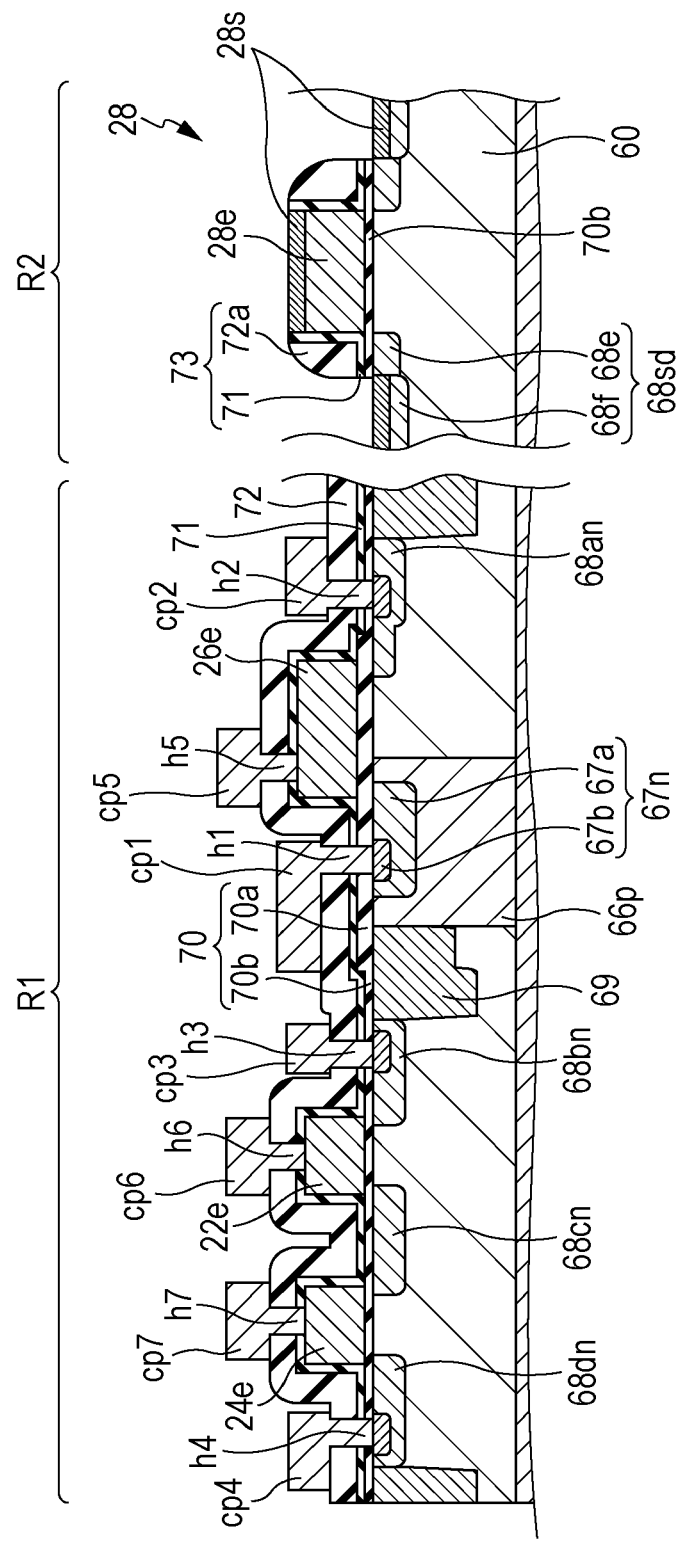
FIG. 23 is a schematic cross-sectional view for explaining the exemplary manufacturing method of an imaging device according to the first embodiment.

Here, a metal silicide layer 28s (such as a nickel silicide layer) is formed in a self-aligned manner on upper surfaces of the second region 68f of the impurity region 68sd and of the gate electrode 28e while using the gate electrode 28e and the insulating structure 73 (as well as the insulating layer 70) collectively as a mask (FIG. 23). The process to form the metal silicide layer 28s is typically executed after removing the resist formed at the time of the anisotropic etching off the imaging region R1 and then forming an oxide film, for instance, over the imaging region R1. By selectively forming the metal silicide layer 28s on the transistor 28 in the peripheral region R2, it is possible to place the transistor having a higher current driving capability in the peripheral circuitry 40. Meanwhile, in the source/drain regions (the n-type impurity region 67n functioning as a part of the charge accumulation region, in particular) of the transistor in the imaging region R1 in which the noise reduction is given priority, it is possible to prevent the diffusion of the metal that contributes to the noise.

Figure 24:
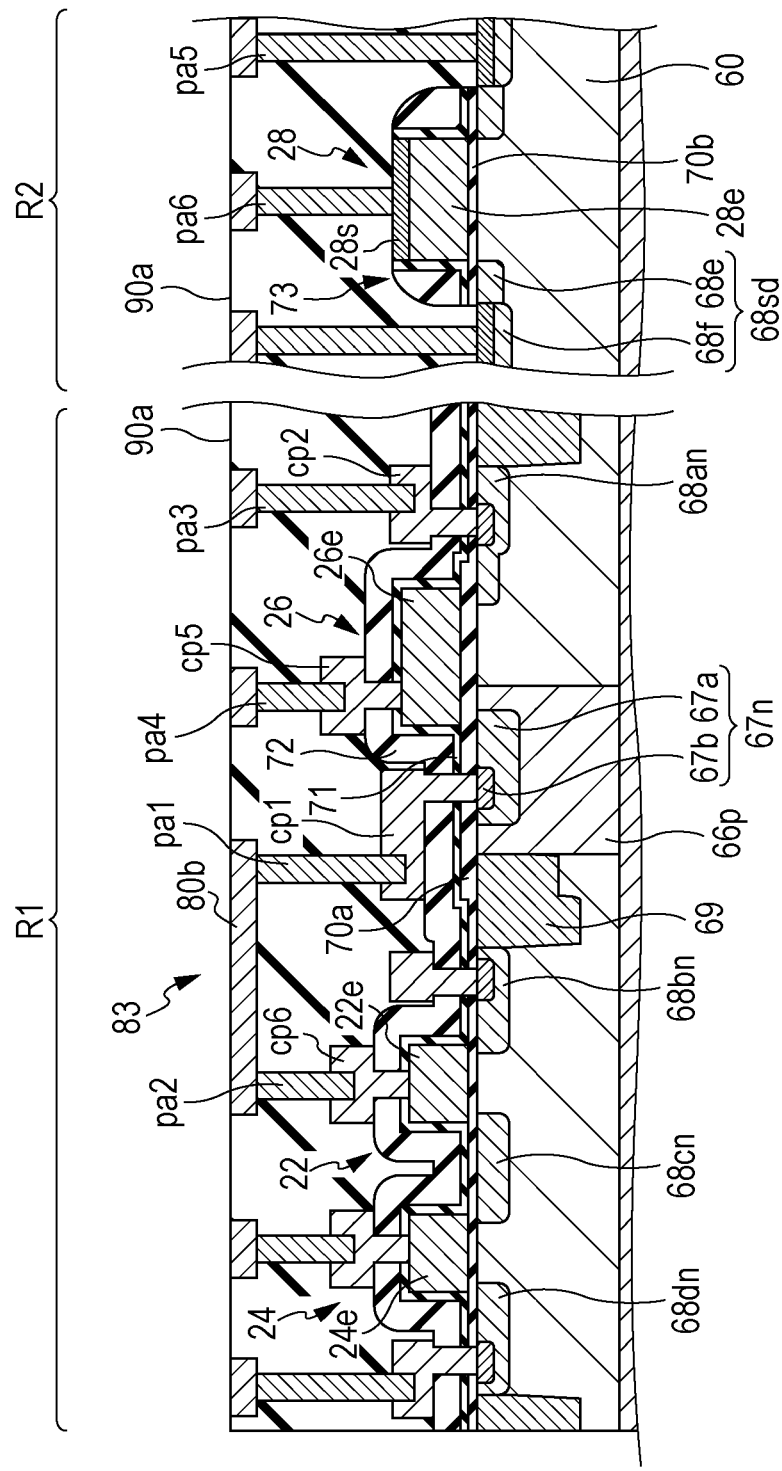
FIG. 24 is a schematic cross-sectional view for explaining the exemplary manufacturing method of an imaging device according to the first embodiment.

Next, the insulating layer 90a to cover the circuits (the signal detection circuit 14 and the peripheral circuitry 40) formed on the semiconductor substrate 60 is formed by using the CVD, for example. Moreover, the insulating layer 90a is provided with contact holes, and the plugs each of which is connected to the corresponding one of the contact plugs or the metal silicide layer 28s are placed in the insulating layer 90a together with the wiring layer 80b (FIG. 24). For example, the plugs pa1 and pa2 are connected to the contact plug cp1 and the contact plug cp6, respectively. The other end of the plug pa1 and the other end of the plug pa2 are connected to a part of the wiring layer 80b. The contact plugs cp1 and cp6, the plugs pa1 and pa2, and a part of the wiring layer 80b collectively constitute a connecting portion 83 electrically connecting the gate electrode 22e of the amplification transistor 22 to the n-type impurity region 67n. Likewise, the plug pa3 placed in the insulating layer 90a electrically connects the contact plug cp2 to the wiring layer 80b, and the plug pa4 electrically connects the contact plug cp5 to the wiring layer 80b. One end of each of the plugs pa5 and pa6 formed in the peripheral region R2 is connected to the metal silicide layer 28s formed on the upper surface of the gate electrode 28e of the transistor 28 and to the metal silicide layer 28s provided in the second region 68f of the n-type impurity region 68sd, respectively.

Figure 25:
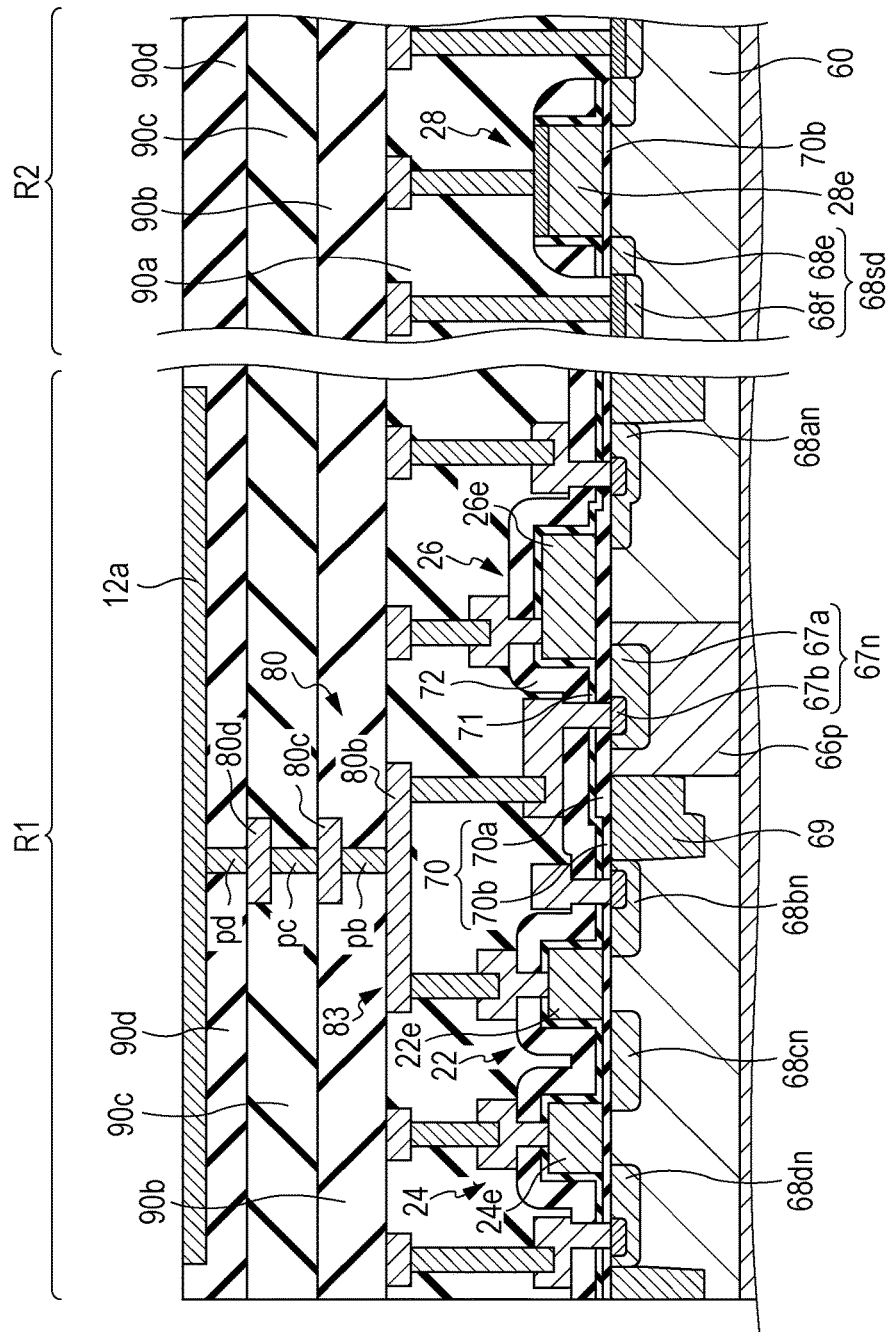
FIG. 25 is a schematic cross-sectional view for explaining the exemplary manufacturing method of an imaging device according to the first embodiment.

Next, the insulating layer 90b, the plug pb as well as the wiring layer 80c, the insulating layer 90c, the plug pc as well as the wiring layer 80d, the insulating layer 90d, and the plug pd are sequentially formed (FIG. 25). Moreover, the pixel electrode 12a connected to the plug pd is formed. The pixel electrode 12a is electrically connected to the above-mentioned connecting portion 83 through the plugs pd, pc, and pb as well as the wiring layers 80d and 80c. Thereafter, the photoelectric conversion layer 12b and the transparent electrode 12c are sequentially formed. Thus, the structure described with reference to FIG. 5 is obtained in which the photoelectric converter 12 is placed on the insulating layer 90d.

In the above-described embodiment, in the insulating layer 70 on the semiconductor substrate 60, the portion covering the depleted layer emerging in the vicinity of the surface of the impurity region formed in the semiconductor substrate 60 is selectively formed thicker. In this example, the relatively thick first portion 70a of the insulating layer 70 is formed to cover a portion of the depleted layer that is formed by the p-n junction between the first region 67a of the n-type impurity region 67n and the p-type impurity region 66p, the portion emerging on the surface of the semiconductor substrate 60. As a consequence, it is possible to suppress damage at the time of etching (plasma etching in particular) in the process after the formation of the insulating layer 70, and to suppress crystal defects around the contact (around the second region 67b, for example) on the surface of the semiconductor substrate 60. According to the above-described embodiment, crystal defects in the vicinity of the depleted layer of the surface of the semiconductor substrate 60 are suppressed, and the effect to reduce a leakage current attributed to the crystal defects is thus obtained.

Second Embodiment

Figure 26:
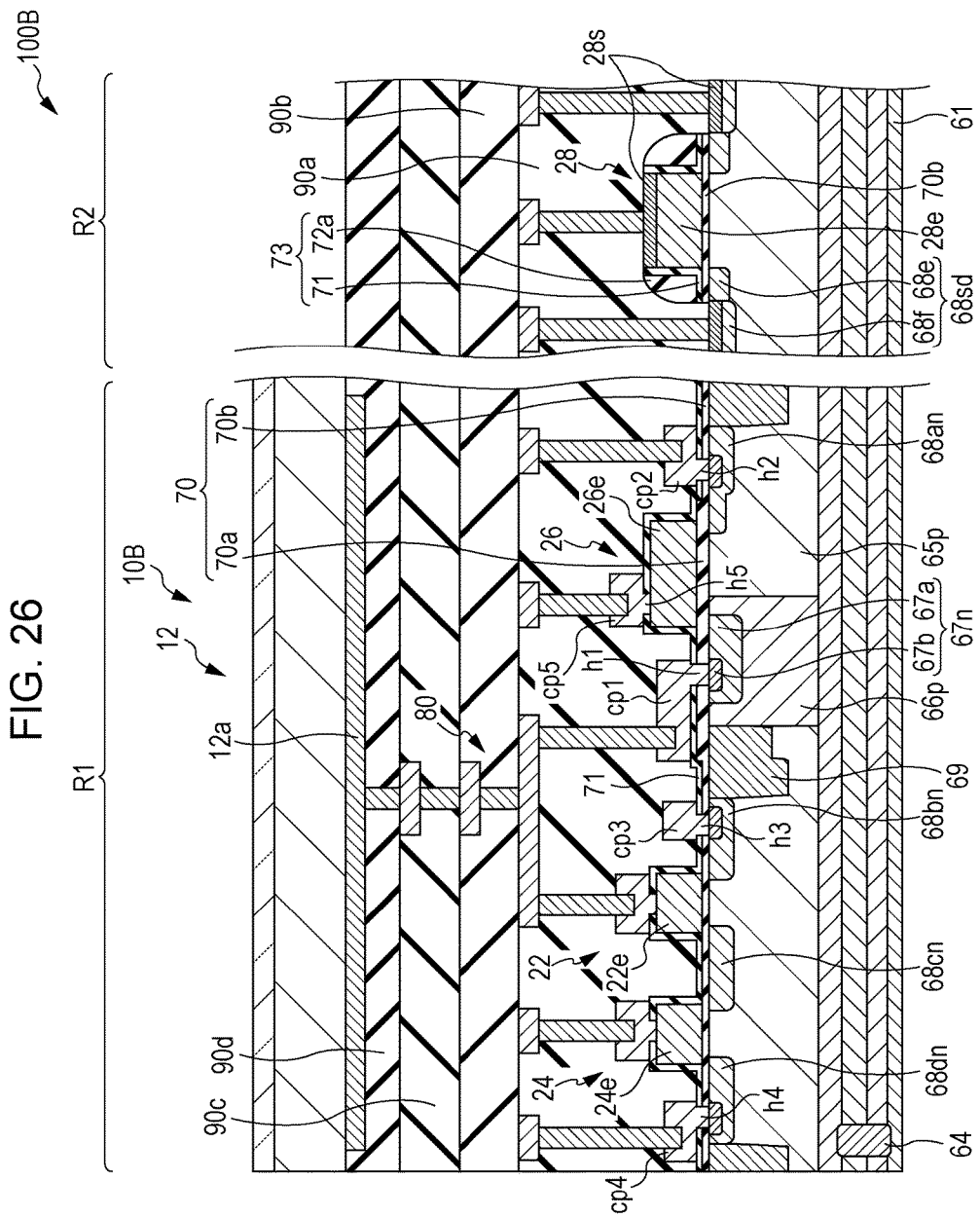
FIG. 26 is a schematic cross-sectional view showing an exemplary configuration of an imaging device according to a second embodiment of the present disclosure.

FIG. 26 shows an exemplarity configuration of an imaging device according to a second embodiment of the present disclosure. An imaging device 100B shown in FIG. 26 includes an imaging cell 10B instead of the imaging cell 10A of the imaging device 100A. As with the above-described imaging device 100A, the imaging device 100B includes the insulating layer 71 to cover the gate electrode 26e of the reset transistor 26, and the like. However, in the imaging device 100B, the insulating layer 72 (typically the SiN layer) is not formed in the imaging region R1. Accordingly, in this example, when focusing on the gate electrode 26e of the reset transistor 26, for instance, the insulating layer 71 is formed on the surface of the gate electrode 26e except a portion to which the contact plug cp5 is connected and a portion facing the gate insulating layer (which is a part of the first portion 70a of the insulating layer 70 in this case) of the reset transistor 26. The contact plug cp5 is directly connected to the gate electrode 26e via the contact hole h5 provided in the insulating layer 71.

In the meantime, regarding the peripheral region R2, the imaging device 100B may have a similar structure to that of the above-described imaging device 100A. As shown on the right side in FIG. 26, the insulating structure 73 is placed beside the gate electrode 28e of the transistor 28 provided in the peripheral region R2. As described later in detail, in this embodiment, after the formation of the insulating layer 71 (typically the SiO$_2$ layer), a different insulating material from the insulating material constituting the insulating layer 71 is deposited on the insulating layer 71. Thus, an insulating film (such as a SiN film) is formed on the insulating layer 71. Thereafter, the insulating material deposited on the insulating layer 71 is removed except a portion on the semiconductor substrate 60 to be formed into the first region 68e of the n-type impurity region 68sd. Accordingly, the insulating structure 73 of this embodiment may have the structure similar to the insulating structure 73 in the first embodiment which includes the first portion 72a of the insulating layer 72 and a part of the first insulating layer 71. The insulating layer 71 may have a stacked structure including two or more insulating layers.

(Manufacturing Method)

An exemplary manufacturing method of an imaging device according to the second embodiment will be described with reference to FIGS. 27 to 33.

Figure 27:
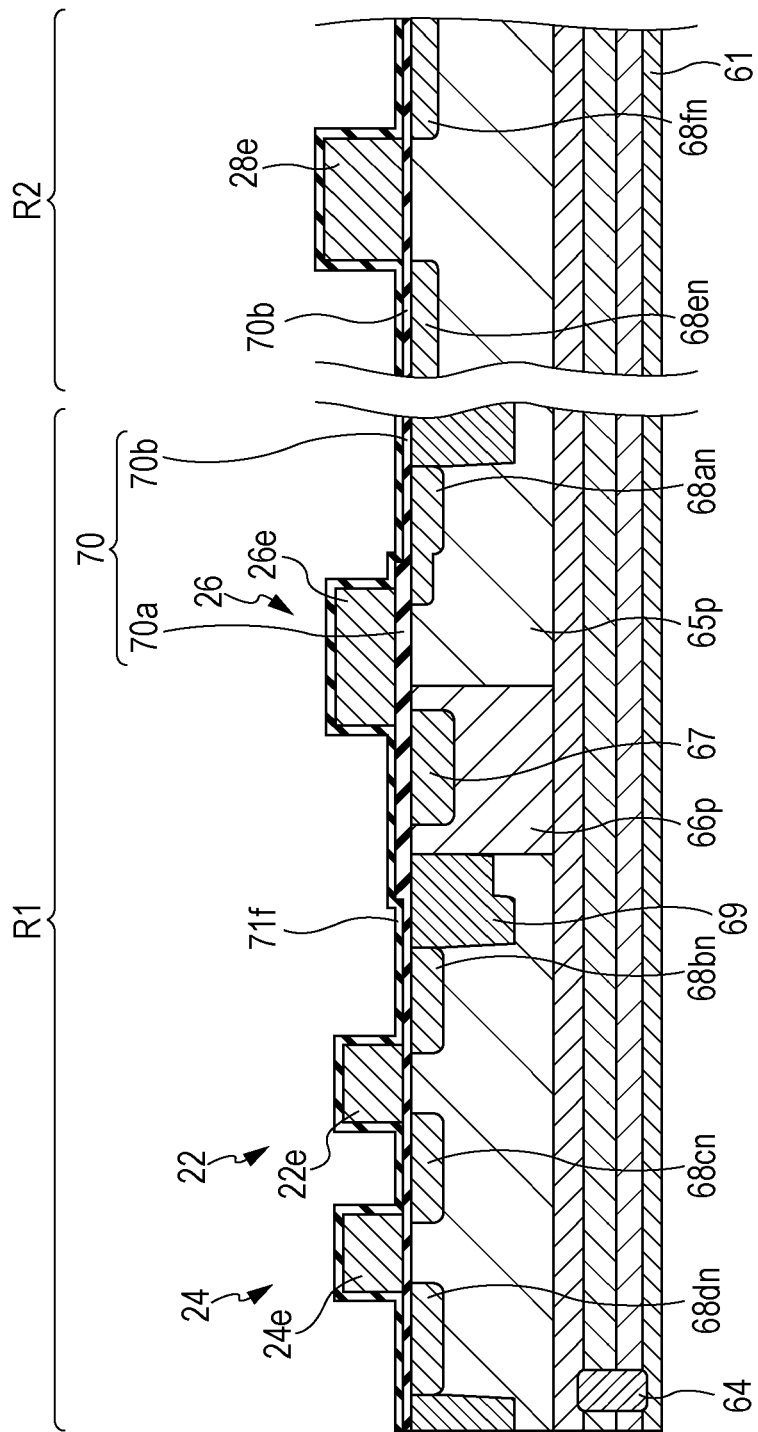
FIG. 27 is a schematic cross-sectional view for explaining an exemplary manufacturing method of an imaging device according to the second embodiment.

The processes from after the formation of the gate electrodes 26e, 22e, 24e, and 28e to the formation of the n-type impurity regions 68an, 68bn, 68cn, 68dn, 68en, and 68fn as well as the element isolation regions 69 may be substantially the same as those in the first embodiment (see FIGS. 9 to 16). Here, as shown in FIG. 27, the insulating film 71f to cover the insulating layer 70 as well as the gate electrodes 22e, 24e, 26e, and 28e on the insulating layer 70 is formed after the formation of the respective impurity regions and the element isolation regions 69. For example, a SiO$_2$ film is formed as the insulating film 71f by using the LP-CVD. Unlike the first embodiment, no SiN film is stacked in this case.

Figure 28:
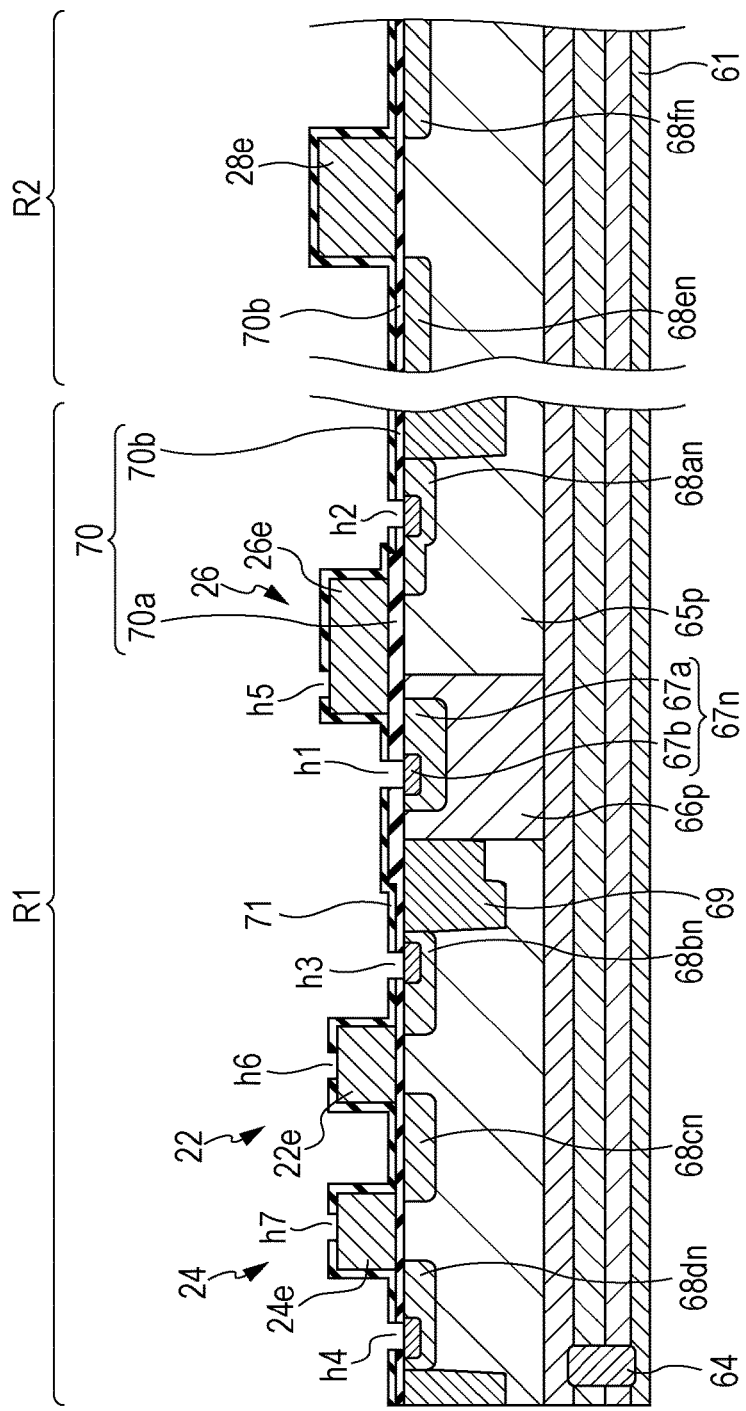
FIG. 28 is a schematic cross-sectional view for explaining the exemplary manufacturing method of an imaging device according to the second embodiment.

Next, the contact holes h1 to h7 are formed in the insulating film 71f by photolithography and dry etching (typically plasma etching) (FIG. 28). As with the first embodiment, since the n-type impurity region 67 is covered with the relatively thick first portion 70a of the insulating layer 70, the damage on the n-type impurity region 67 is reduced during the etching as compared to damage on other regions covered with the second portion 70b.

Here, the contact holes h1 to h4 reaching the surface of the semiconductor substrate 60 are formed without further depositing the insulating film (such as the SiN film) on the insulating film 71f. For this reason, as compared to the first embodiment, it is possible to reduce etching time required for the formation of the contact holes to establish contact. According to the second embodiment, it is possible to reduce the etching time corresponding to margins in consideration of non-uniform thickness of the insulating film 72f (see FIG. 17) on the insulating film 71f, and thus to reduce the total time required for the etching. As a consequence, it is possible to further reduce the damage caused by the etching on the impurity regions (such as the n-type impurity region 67n) formed in the semiconductor substrate 60 and to further suppress the increase in crystal defects attributed to the etching.

Figure 29:
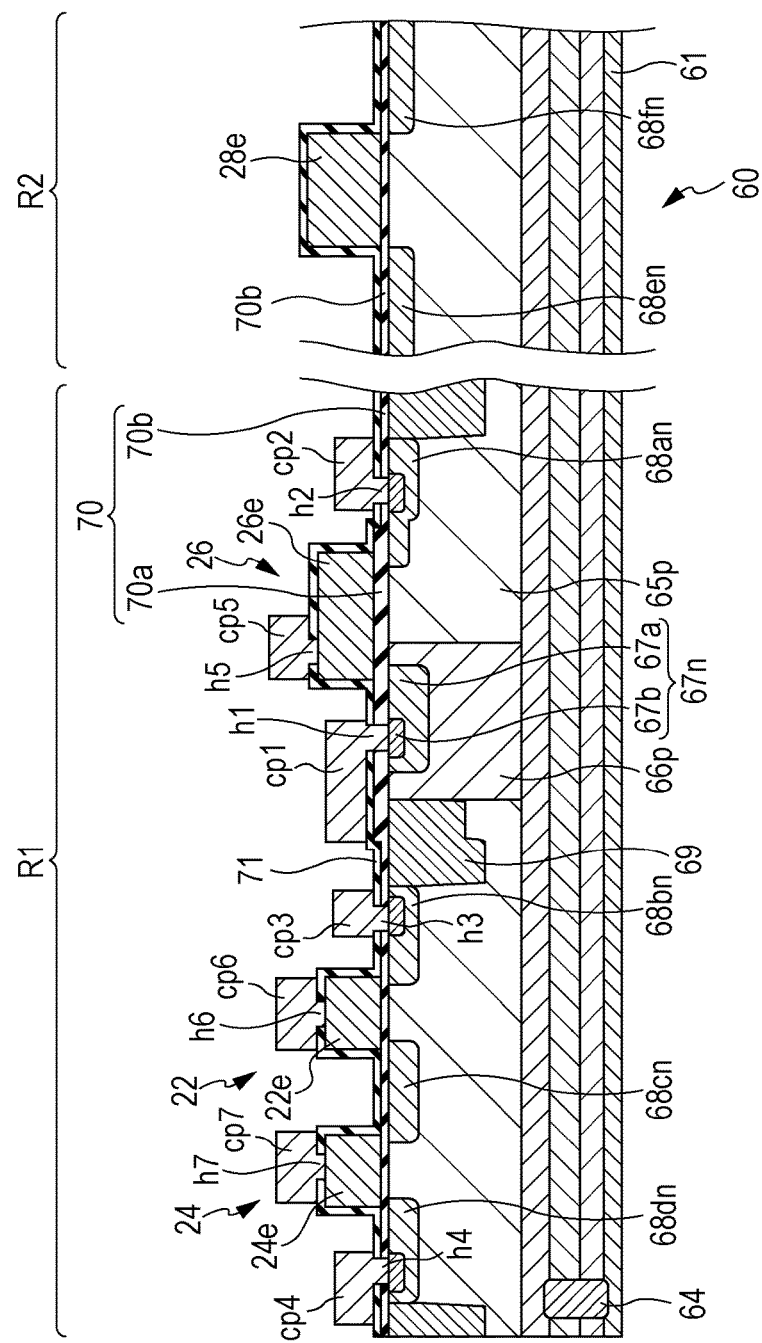
FIG. 29 is a schematic cross-sectional view for explaining the exemplary manufacturing method of an imaging device according to the second embodiment.

Moreover, in this case, ion implantation is performed while using the insulating film 71f as a mask, and the regions having the relatively high impurity concentration are formed in the n-type impurity regions 67, 68an, 68bn, and 68dn. Thereafter, as with the first embodiment, the contact plugs cp1 to cp7 are formed at the positions of the contact holes h1 to h7, respectively (FIG. 29).

Figure 30:
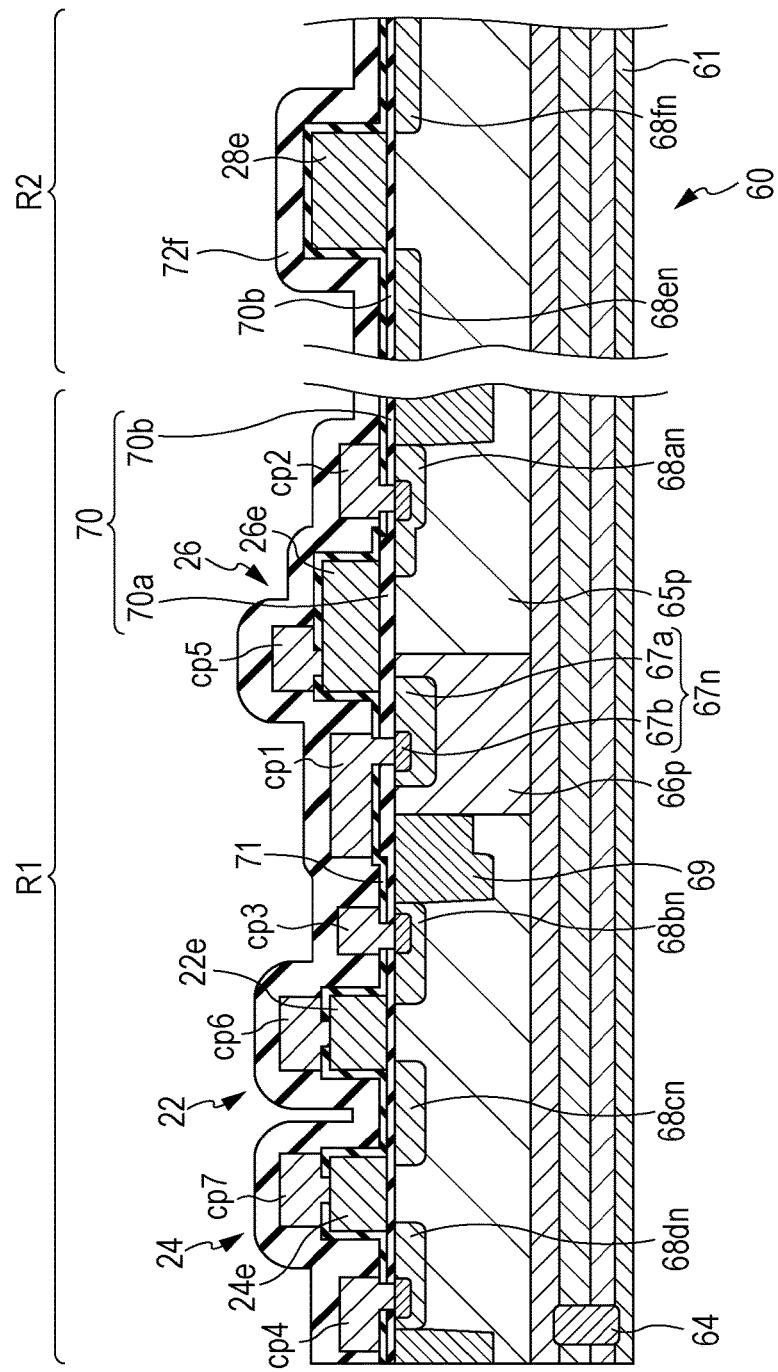
FIG. 30 is a schematic cross-sectional view for explaining the exemplary manufacturing method of an imaging device according to the second embodiment.
Figure 31:
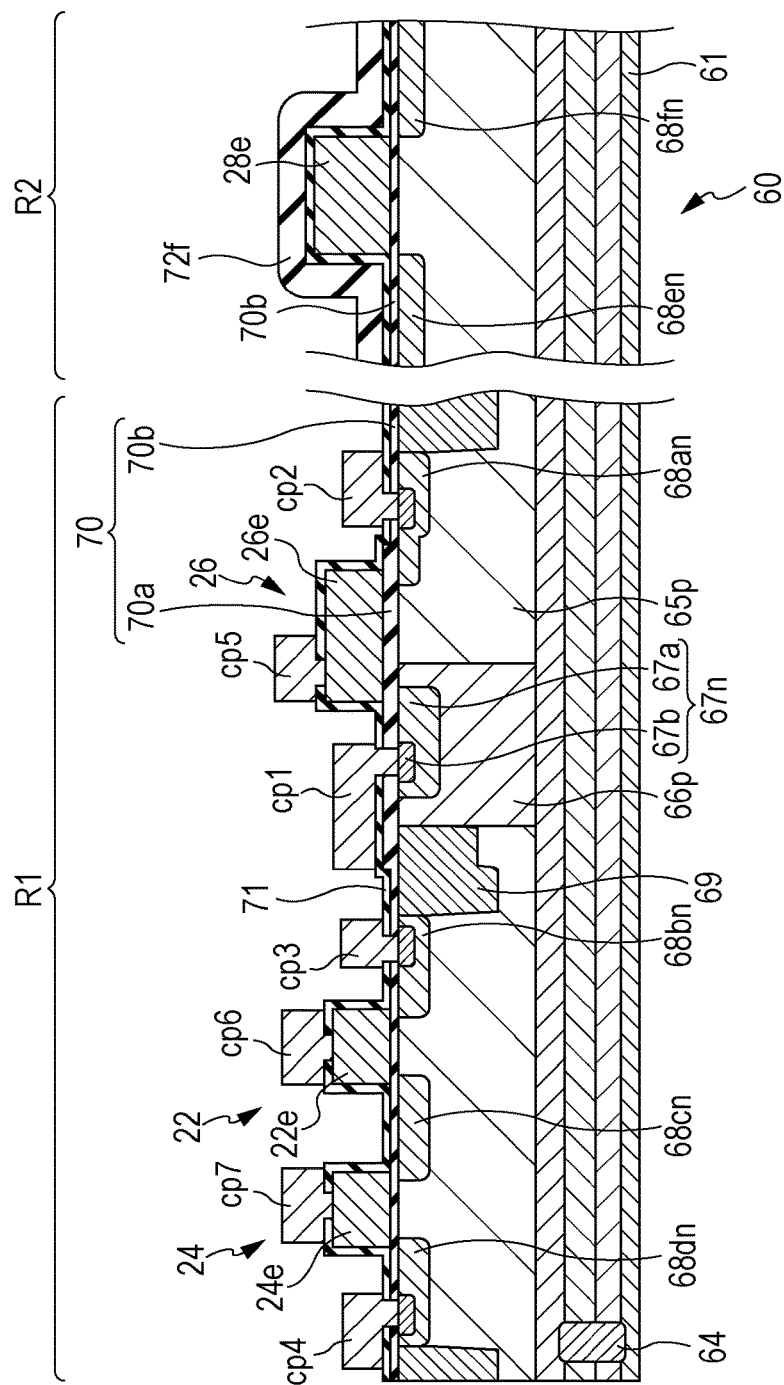
FIG. 31 is a schematic cross-sectional view for explaining the exemplary manufacturing method of an imaging device according to the second embodiment.

Next, the insulating film 72f is formed on the entire surface of the semiconductor substrate 60 (FIG. 30). The insulating film 72f is the SiN film formed by the LP-CVD, for example, which covers the gate electrodes 26e, 22e, 24e, and 28e on the insulating layer 70 as well as a portion of the insulating layer 71 not covered with the contact plugs as schematically shown in FIG. 30. A SiO$_2$ film, for instance, may be formed prior to the formation of the insulating film 72f. Next, the insulating film 72f is selectively removed from the region other than the peripheral region R2 by wet etching and/or dry etching (FIG. 31).

Figure 32:
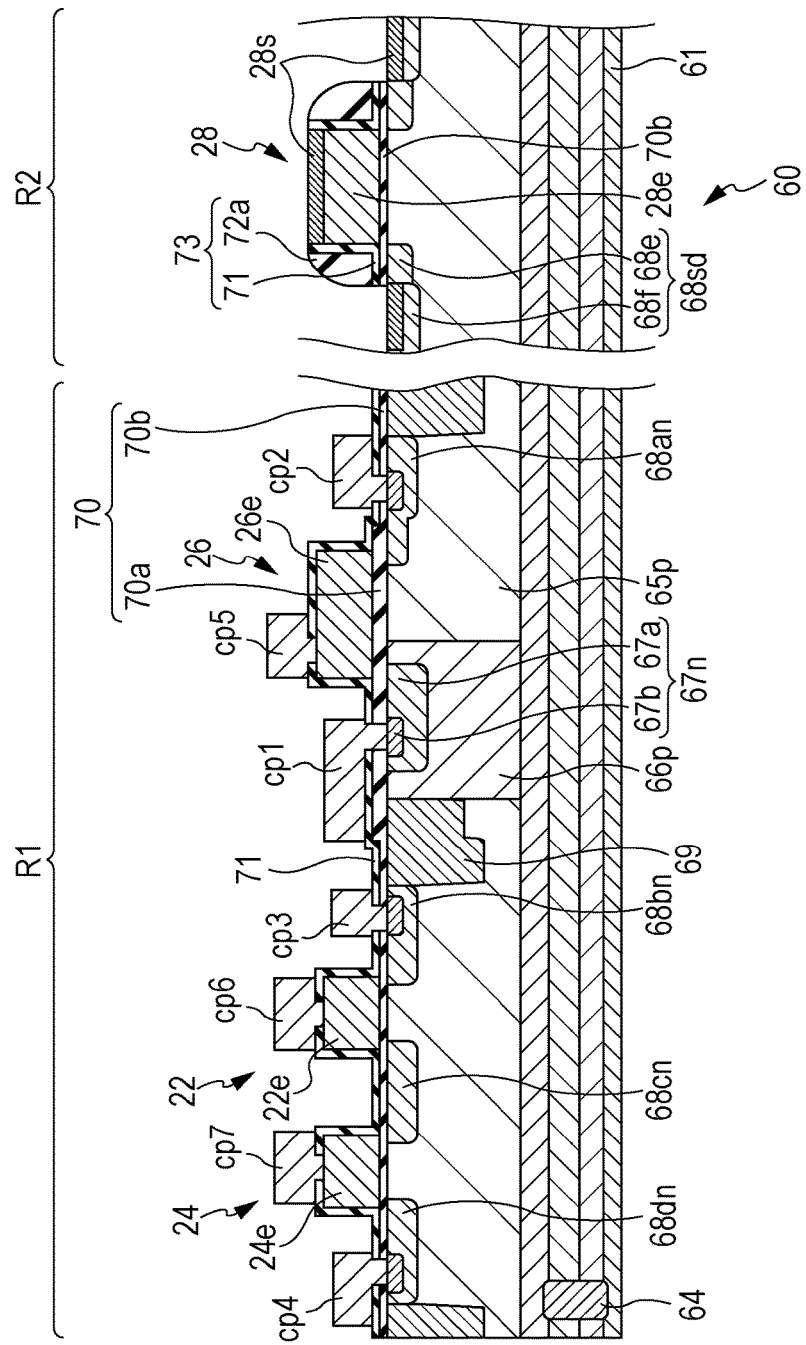
FIG. 32 is a schematic cross-sectional view for explaining the exemplary manufacturing method of an imaging device according to the second embodiment.

Next, the imaging region R1 is covered with a resist and then anisotropic etching is applied. Thus, the insulating structure 73 is formed beside the gate electrode 28e (FIG. 32). Here, the insulating layer 70 (which is a part of its second portion 70b in this case), the insulating layer 71, and the insulating film 72f are selectively removed from above the n-type impurity regions 68en and 68fn, except the portion in the vicinity of the gate electrode 28e. Furthermore, the insulating layer 71 and the insulating film 72f are selectively removed from above the gate electrode 28e.

Thereafter, the impurity is implanted into the n-type impurity regions 68en and 68fn by using the gate electrode 28e and the insulating structure 73 (as well as the insulating layer 70) collectively as a mask. Thus, the n-type impurity regions 68sd including the first region 68e and the second region 68f are formed on two sides of the gate electrode 28e. Annealing takes place after the impurity implantation. Moreover, the metal silicide layer 28s is formed in a self-aligned manner on upper surfaces of the second region 68f of the impurity region 68sd and of the gate electrode 28e.

Figure 33:
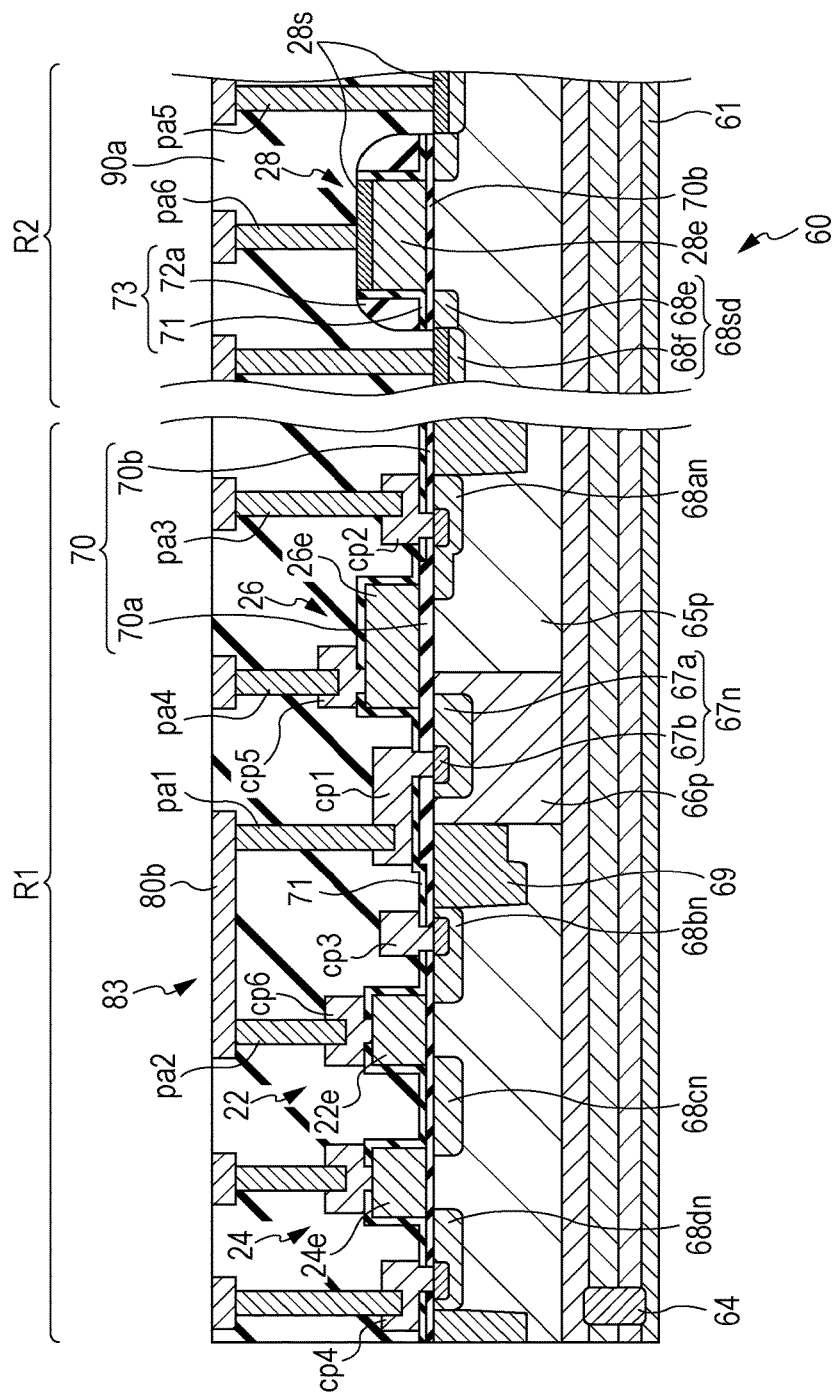
FIG. 33 is a schematic cross-sectional view for explaining the exemplary manufacturing method of an imaging device according to the second embodiment.

Next, the insulating layer 90a is formed by using the CVD, for example. Then, plugs (typically metal plugs) connected to the contact plugs, and the wiring layer are formed in the insulating layer 90a (FIG. 33). The subsequent processes are substantially the same as those in the first embodiment, and description thereof will be omitted. After the above-described processes, the structure shown in FIG. 26 is obtained.

Third Embodiment

Figure 34:
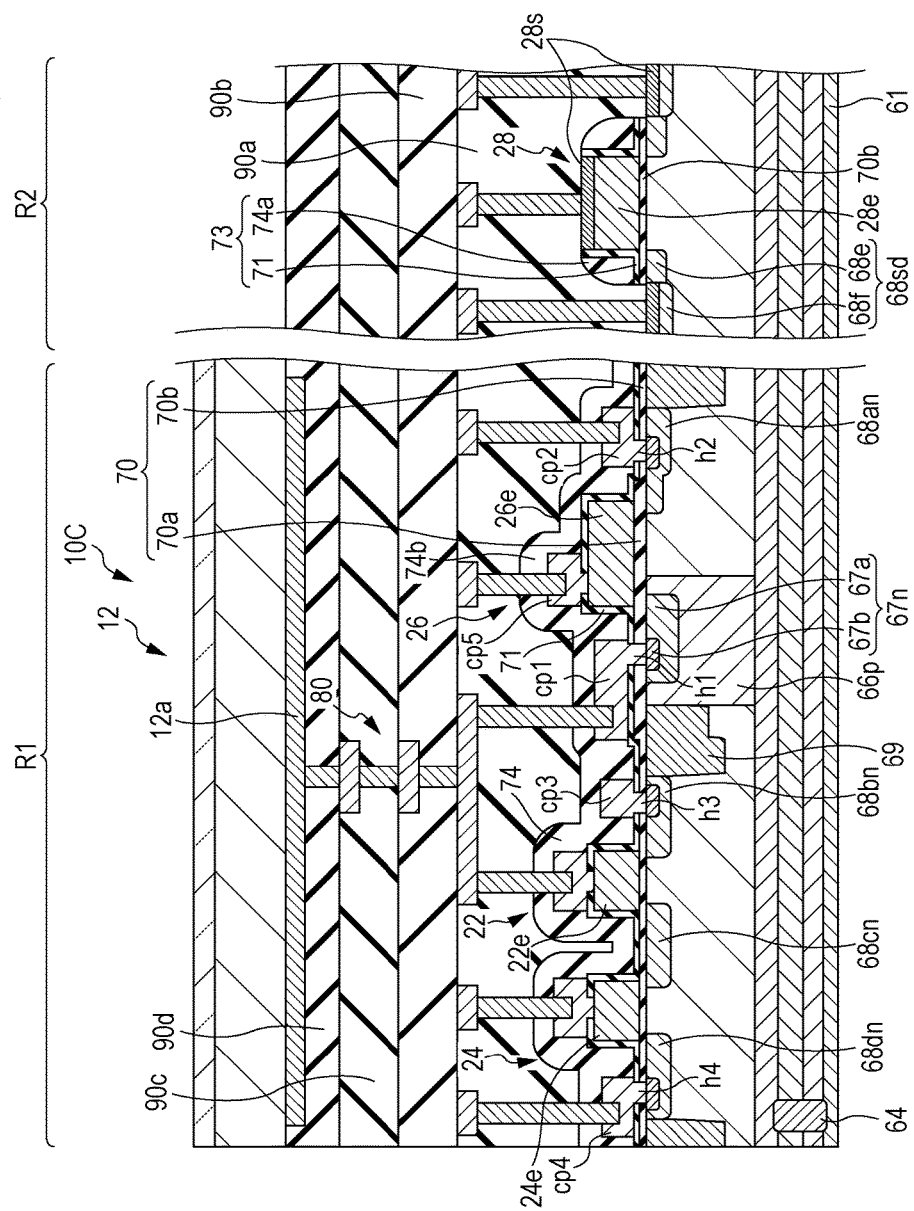
FIG. 34 is a schematic cross-sectional view showing an exemplary configuration of an imaging device according to a third embodiment of the present disclosure.

FIG. 34 shows an exemplarity configuration of an imaging device according to a third embodiment of the present disclosure. An imaging device 100C shown in FIG. 34 includes an imaging cell 10c instead of the imaging cell 10A of the imaging device 100A. Generally, the imaging cell 10C of the imaging device 100C includes an insulating layer 74 (typically a SiN layer) formed to cover the insulating layer 71, which is the same as the insulating layer 71 in the imaging cell 10B of the imaging device 100B described with reference to FIG. 26, as well as the contact plugs cp1 to cp5. As with the first and second embodiments, the insulating layer 71 may have a stacked structure including two or more insulating layers.

Attention is drawn to a portion around the gate electrode 26e of the reset transistor 26. The insulating layer 74 includes a portion 74b which covers at least lateral parts of the gate electrode 26e and lateral parts of the contact plug cp5 connected to the gate electrode 26e. As with the first and second embodiments, the contact plug cp5 is directly connected to the gate electrode 26e.

As shown on the right side in FIG. 34, the peripheral region R2 of the imaging device 100C has substantially the same structure as the imaging device 100A and the imaging device 100B mentioned above. Here, the insulating structure 73 includes a portion 74a of the insulating layer 74. The portion 74a in the insulating structure 73 may have the same shape and the same layout as the portion 72b of the insulating layer 72 mentioned above.

Variation of Third Embodiment

Figure 35:
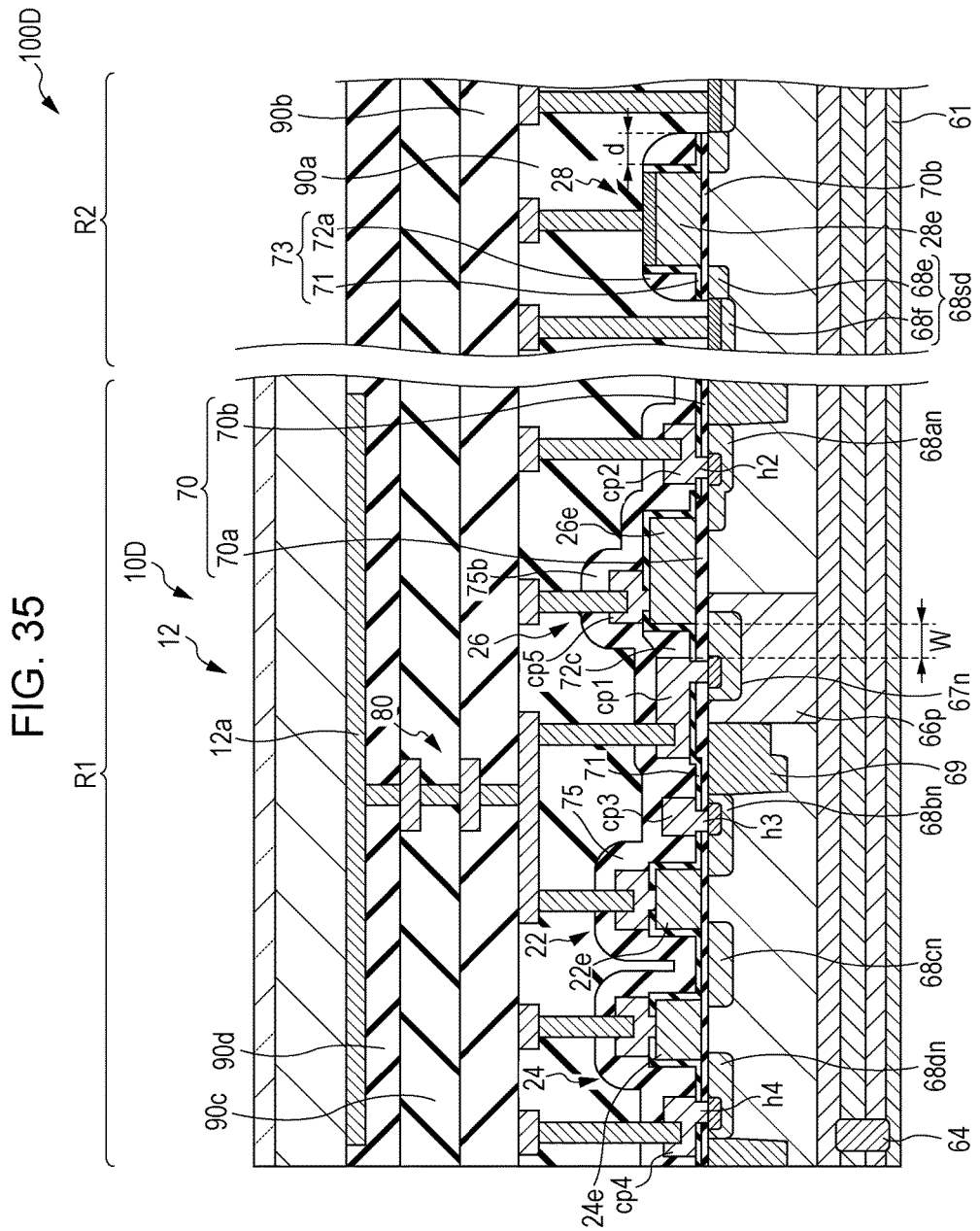
FIG. 35 is a view schematically showing a cross section of a variation of the imaging device according to the third embodiment of the present disclosure.

FIG. 35 shows a variation of the imaging device according to the third embodiment of the present disclosure. An imaging cell 10D of an imaging device 100D shown in FIG. 35 includes an insulating structure 72c located between the gate electrode 26e of the reset transistor 26 and the contact plug cp1. As with the first portion 72a of the insulating layer 72 in the insulating structure 73 placed in the peripheral region R2, this insulating structure 72c is a part of the insulating layer 72. The imaging cell 10D includes an insulating layer 75 formed to cover the insulating layer 71 and the contact plugs cp1 to cp5. The insulating layer 75 includes a portion 75b which covers at least lateral parts of contact plug cp5.

In this example, a distance W between the gate electrode 26e of the reset transistor 26 and the contact plug cp1 is equal to or below twice a deposition thickness of the insulating layer 72 along the normal direction of the semiconductor substrate 60. Here, the deposition thickness of the insulating layer 72 represents an average thickness of a portion of the insulating layer 72 spreading substantially parallel to the surface of the semiconductor substrate 60, the portion being exclusive of parts of the insulating layer 72 which are erected along side surfaces of the gate electrode and the contact plugs. Note that a width d of the first portion 72a parallel to the surface of the semiconductor substrate 60 is proportional to a deposition thickness of the insulating film 72f, and is typically in a range from equal to or above 60% to equal to or below 100% of the deposition thickness.

Regarding the example shown in FIG. 35, no part of the insulating layer 72 is shown between each gate electrode other than the gate electrode 26e and the corresponding contact plug other than the contact plug cp1 in the imaging region R1. However, an insulating structure similar to the insulating structure 72c may be present between a certain gate electrode other than the gate electrode 26e and the corresponding contact plug other than the contact plug cp1. As described later, it is possible to form such an insulating structure relatively easily between a gate electrode and a contact plug by setting a distance between the gate electrode and the contact plug equal to or below a predetermined distance.

(Manufacturing Method)

Now, an exemplary manufacturing method of an imaging device according to the third embodiment will be described with reference to FIGS. 36 to 42.

Figure 36:
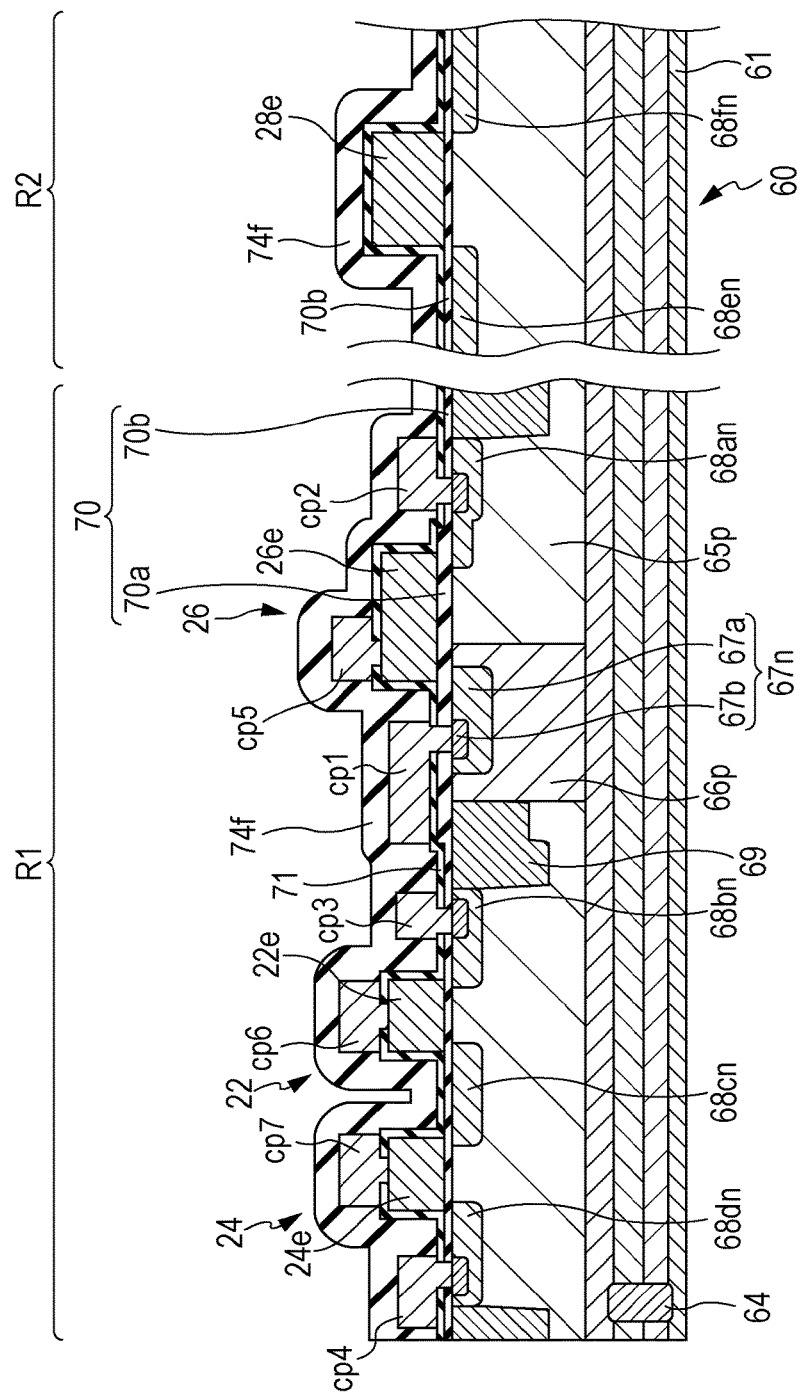
FIG. 36 is a schematic cross-sectional view for explaining an exemplary manufacturing method of an imaging device according to the third embodiment.

The processes to be performed to form the contact plugs cp1 to cp7 may be substantially the same as those in the second embodiment (see FIGS. 27 to 29). After the formation of the contact plugs cp1 to cp7, an insulating film 74f is formed on the entire surface of the semiconductor substrate 60 (FIG. 36). The insulating film 74f is formed to cover the gate electrodes 26e, 22e, 24e, and 28e, the contact plugs cp1 to cp7, as well as the portion of the insulating layer 71 not covered with the contact plugs cp1 to cp7. Here, as with the above-described insulating film 72f, the insulating film 74f is a SiN film formed by the LP-CVD, for example.

Figure 37:
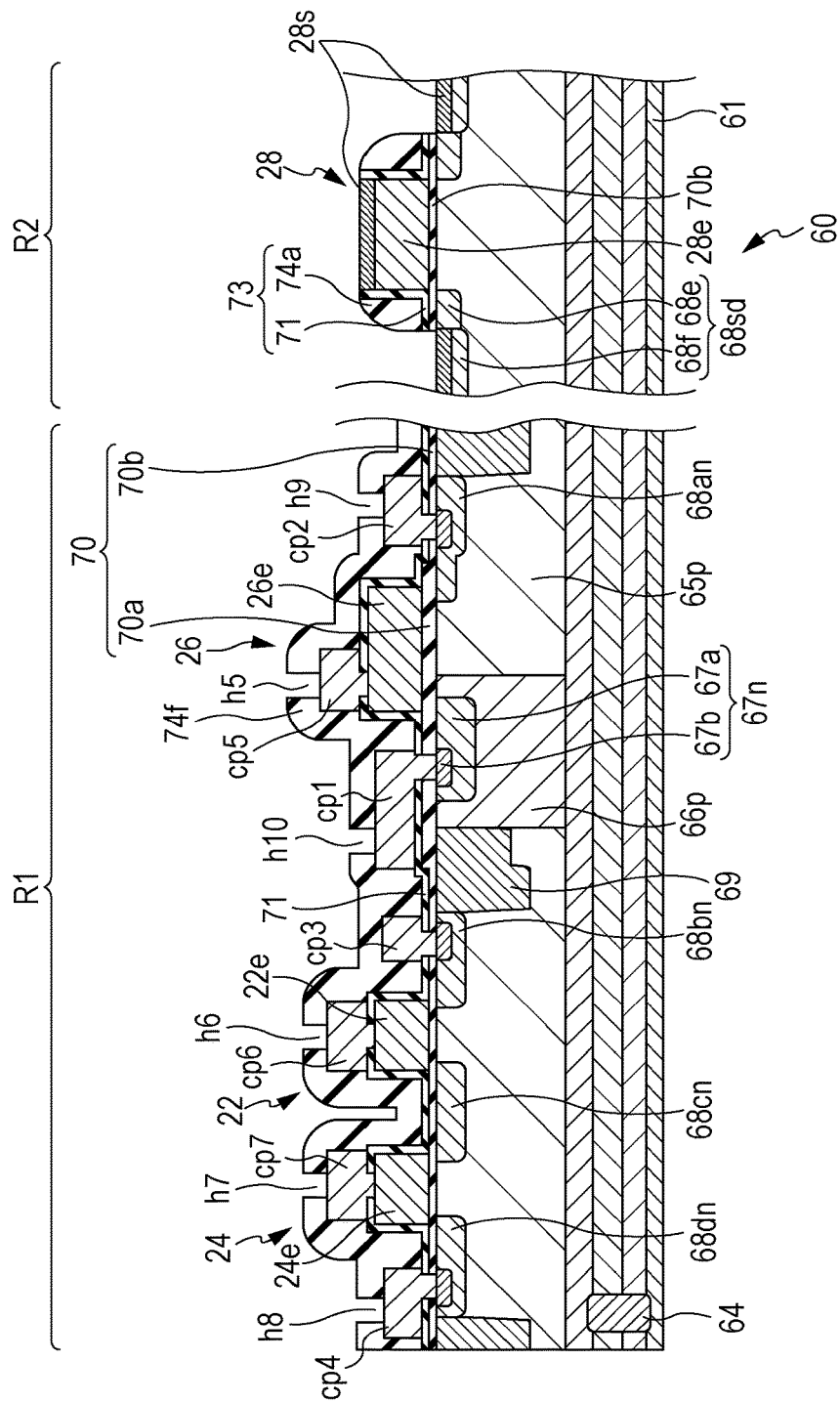
FIG. 37 is a schematic cross-sectional view for explaining the exemplary manufacturing method of an imaging device according to the third embodiment.

After the formation of the insulating film 74f, a resist pattern is formed on a portion of the insulating film 74f located in the imaging region R1, and portions of the insulating film 74f above the respective contact plugs are selectively removed by dry etching (typically plasma etching) (FIG. 37). Thus, contact holes are formed on the respective contact plugs. FIG. 37 shows contact holes h10, h9, h8, h5, h6, and h7, which reach the contact plugs cp1, cp2, cp4, cp5, cp6, and cp7, respectively.

After removing the resist pattern on the imaging region R1, a resist mask is formed to cover the imaging region R1. Thereafter, the insulating layer 70 (which is a part of its second portion 70b in this case), the insulating layer 71, and the insulating film 74f are selectively removed from above the n-type impurity regions 68en and 68fn placed in the peripheral region R2, except the portion in vicinity of the gate electrode 28e. Furthermore, the insulating layer 71 and the insulating film 74f are selectively removed from above the gate electrode 28e. Thus, the insulating structure 73 is formed beside the gate electrode 28e (FIG. 37).

Thereafter, the impurity is implanted into the n-type impurity regions 68en and 68fn by using the gate electrode 28e and the insulating structure 73 (as well as the insulating layer 70) collectively as a mask. Thus, the n-type impurity regions 68sd including the first region 68e and the second region 68f are formed on the two sides of the gate electrode 28e. Annealing takes place after the impurity implantation. Moreover, the metal silicide layer 28s is formed in a self-aligned manner on the upper surfaces of the second region 68f of the impurity region 68sd and of the gate electrode 28e.

Figure 38:
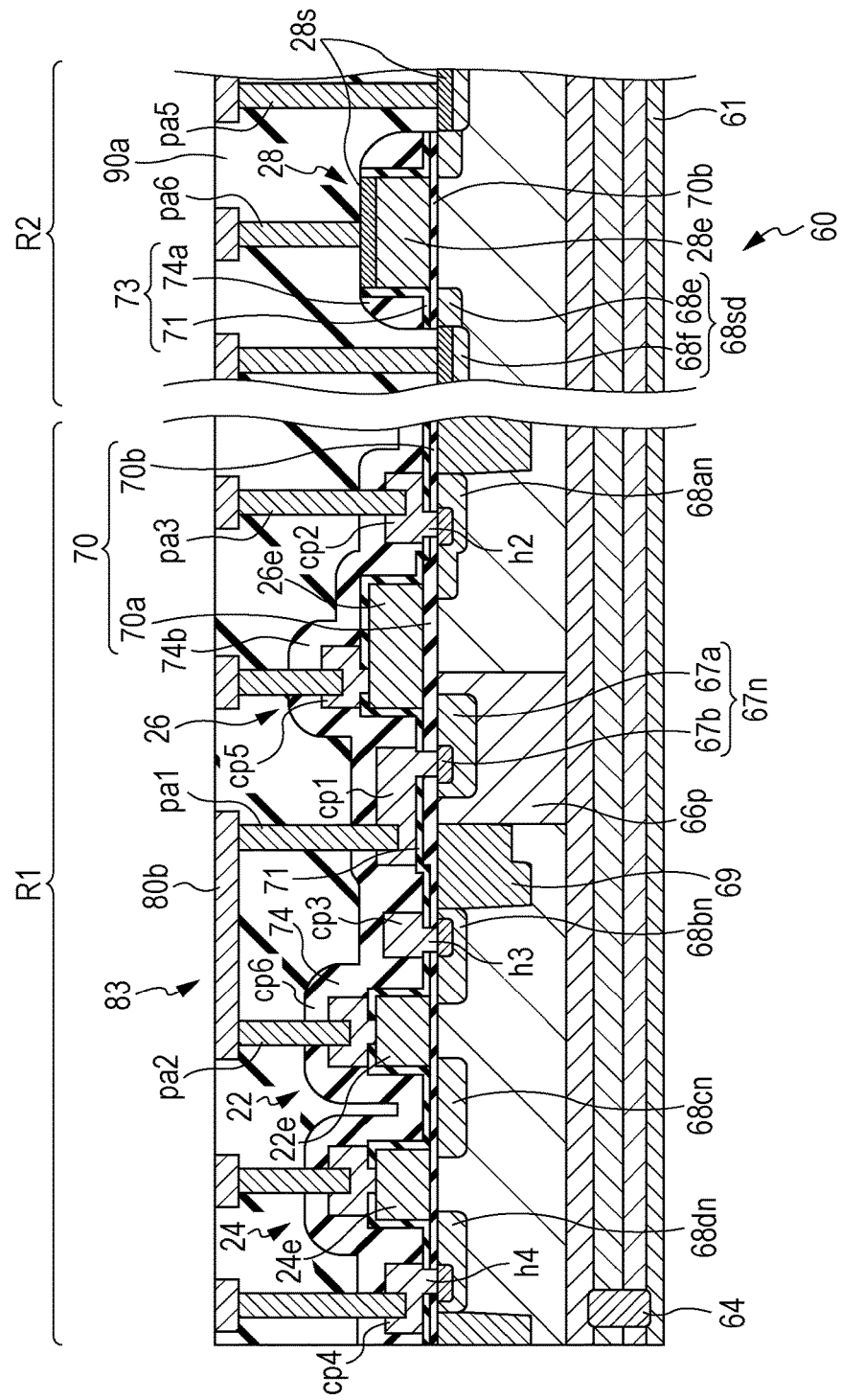
FIG. 38 is a schematic cross-sectional view for explaining the exemplary manufacturing method of an imaging device according to the third embodiment.

Next, the insulating layer 90a is formed by using the CVD, for example. Then, the plugs (typically the metal plugs) connected to the contact plugs, and the wiring layer are formed in the insulating layer 90a (FIG. 38). Although the example of forming the contact holes h10, h9, h8, h5, h6, and h7 in the insulating film 74f prior to the formation of the insulating layer 90a is explained herein, the contact holes reaching the contact plugs may be formed in the insulating layer 90a and the insulating film 74f after the formation of the insulating layer 90a. The subsequent processes are substantially the same as those in the first and second embodiments, and description thereof will be omitted. After the above-described processes, the structure shown in FIG. 34 is obtained.

As with the second embodiment, according to the above-described manufacturing method, it is possible to reduce the etching time required for the formation of the contact holes to establish contact as compared to the first embodiment.

Moreover, it is possible to reduce the etching time required for the etching corresponding to the margins in consideration of non-uniform thickness of the insulating film 72f (see FIG. 17) on the insulating film 71f, thus to reduce the damage caused by the etching and to suppress the increase in crystal defects attributed to the etching.

Figure 39:
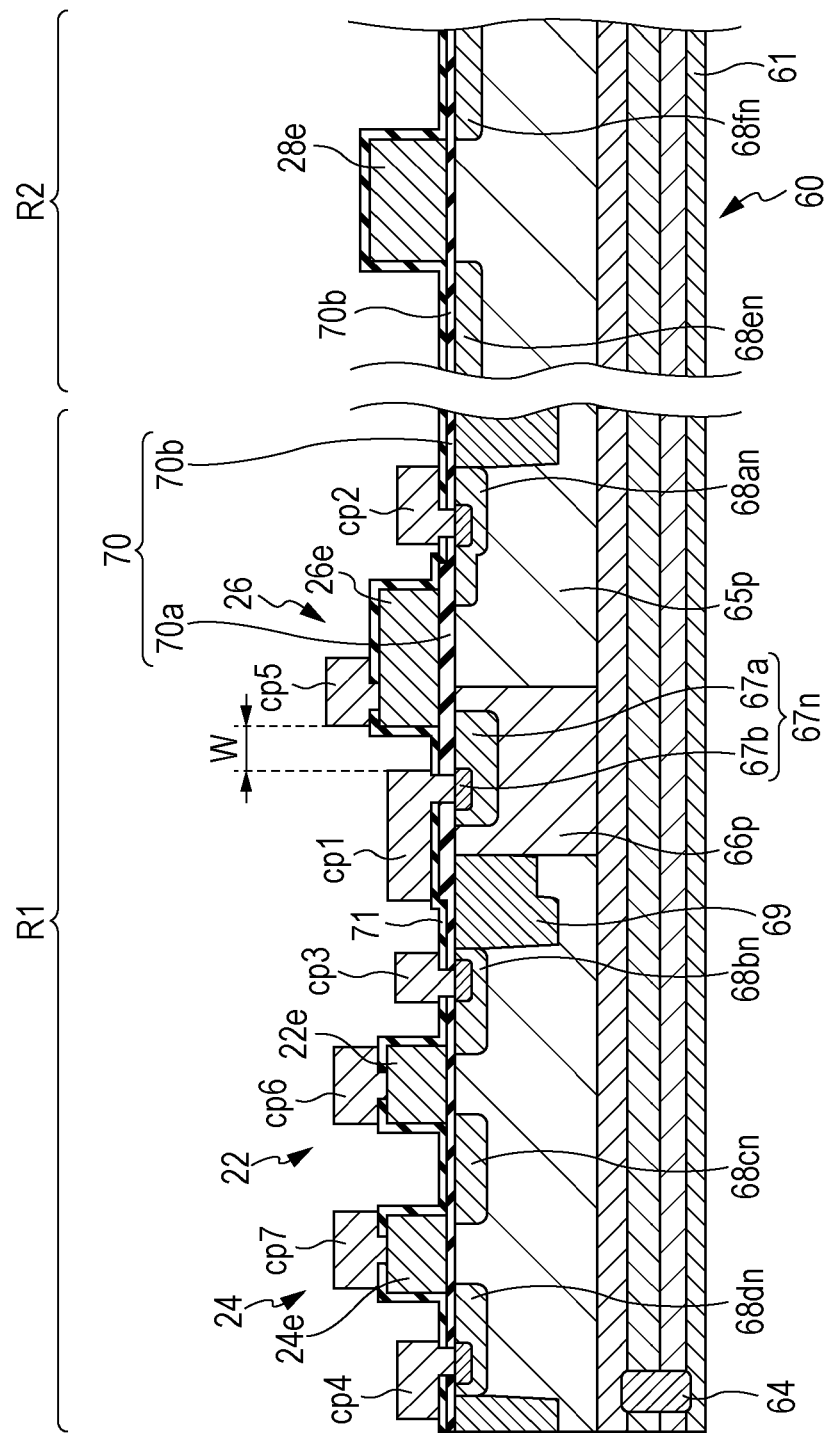
FIG. 39 is a schematic cross-sectional view for explaining an exemplary manufacturing method of an imaging device according to a variation of the third embodiment.
Figure 40:
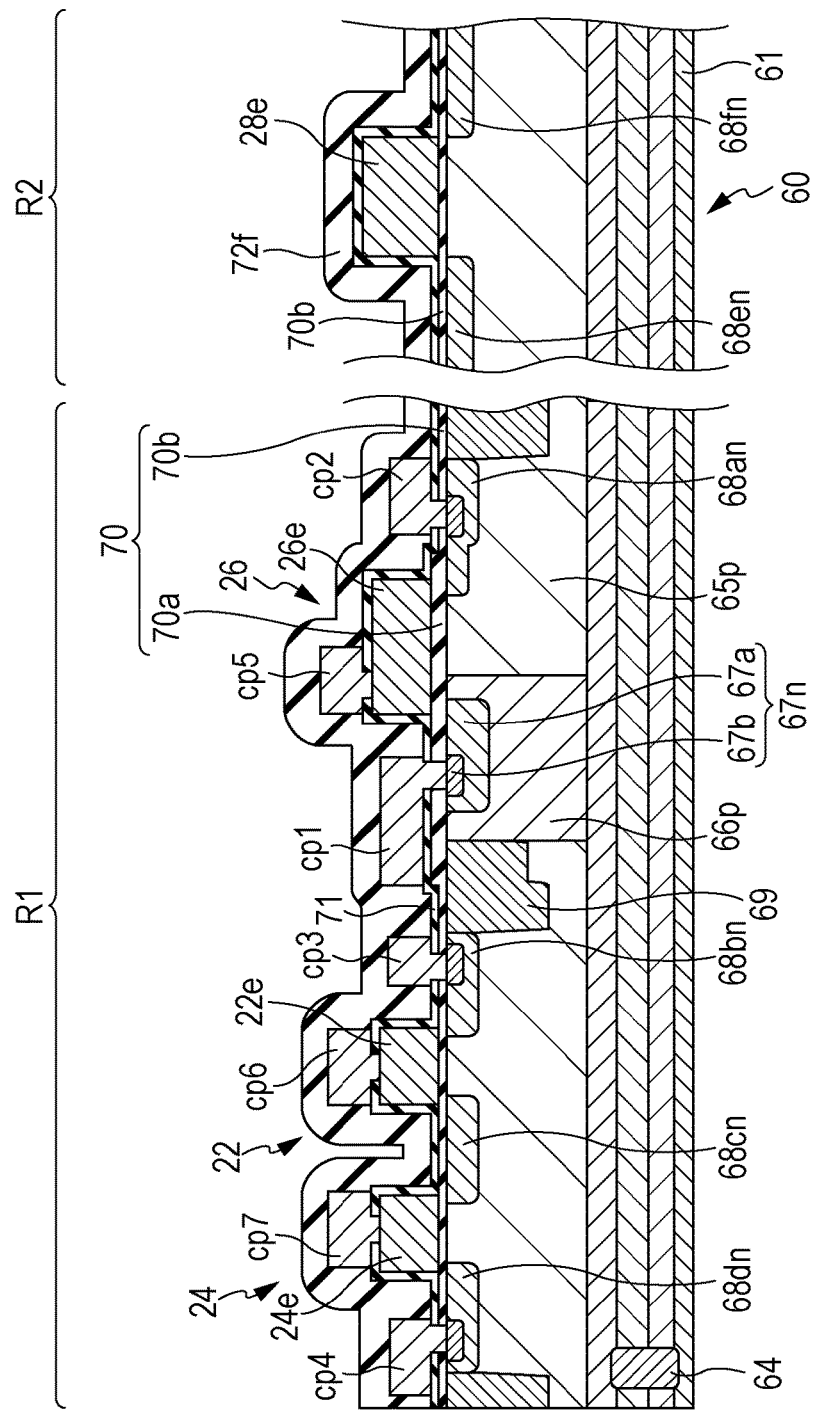
FIG. 40 is a schematic cross-sectional view for explaining the exemplary manufacturing method of an imaging device according to the variation of the third embodiment.

The structure explained with reference to FIG. 35 can be obtained as described below, for example. First, the contact plugs cp1 to cp7 are formed at the positions of the contact holes h1 to h7 in the same manner as the second embodiment (FIG. 39). However, at this time, the contact plug cp1 is formed on the insulating layer 71 such that the distance W between the gate electrode 26e of the reset transistor 26 and the contact plug cp1 becomes equal to or below twice a target thickness of the insulating film 72f to be formed subsequently.

Figure 41:
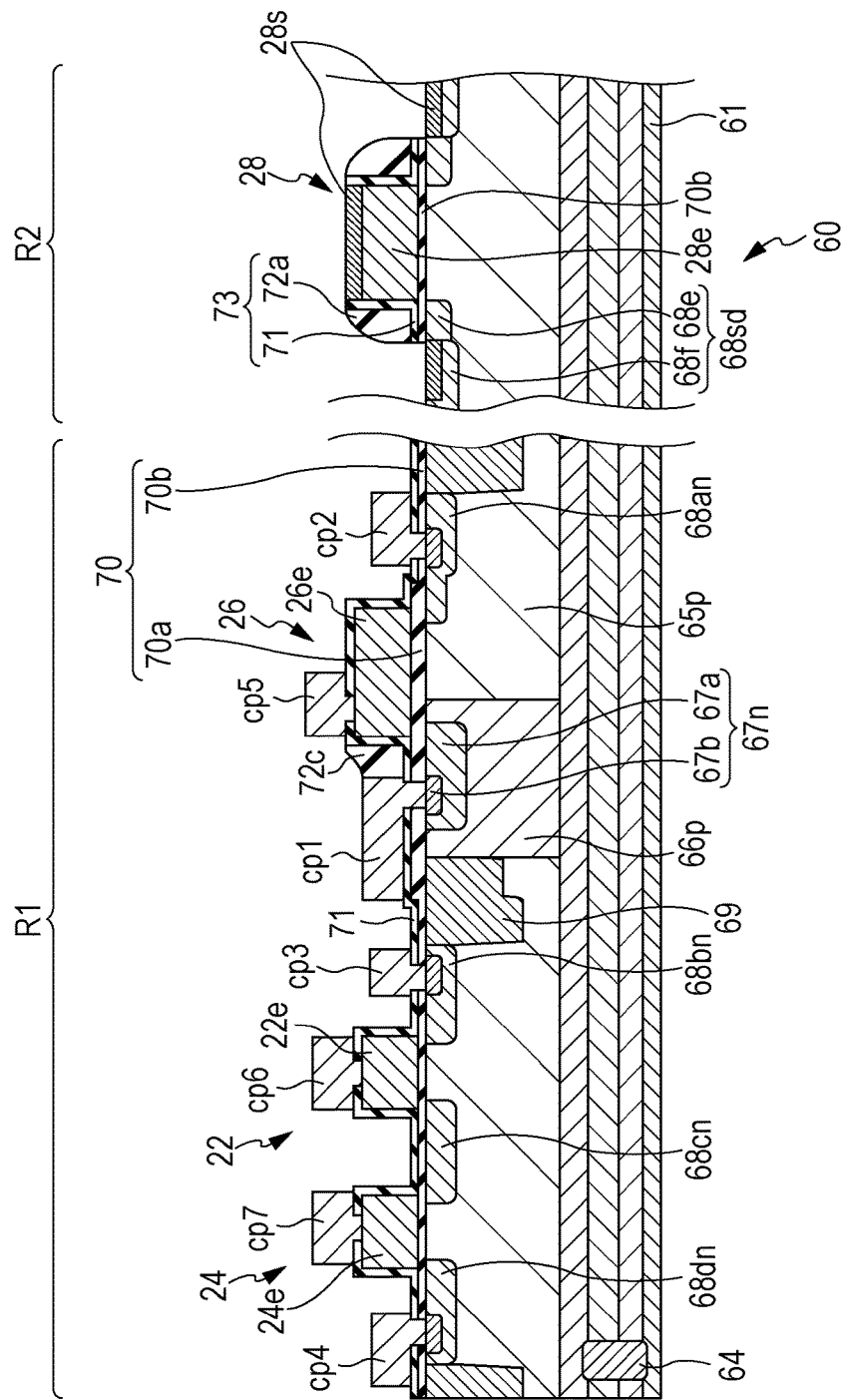
FIG. 41 is a schematic cross-sectional view for explaining the exemplary manufacturing method of an imaging device according to the variation of the third embodiment.

After the formation of the contact plugs cp1 to cp7, the insulating film 72f is formed on the entire surface of the semiconductor substrate 60 (FIG. 40) as with the second embodiment. Thereafter, anisotropic etching is executed on both the imaging region R1 and the peripheral region R2. Regarding the peripheral region R2, the processes are the same as those explained with reference to FIG. 37. Hence, the insulating structure 73 can be formed beside the gate electrode 28e by the anisotropic etching (FIG. 41). On the other hand, in the imaging region R1, a major part of the insulating film 72f is removed. For example, the insulating film 72f can be removed from the upper surface of the contact plug cp1 and the upper surface of the gate electrode 26e of the reset transistor 26. However, since a gap between the gate electrode 26e and the contact plug cp1 is equal to or below a predetermined size, a portion of the insulating film 72f between the gate electrode 26e and the contact plug cp1 is left over, and the insulating structure 72c is formed as a consequence. Here, regarding the imaging region R1, all of the insulating film 72f except the portion between the gate electrode 26e and the contact plug cp1 is removed. However, the insulating film 72f may also be partially left over at a portion between another one of the electrodes and the corresponding contact plug. By adjusting the distance between the electrode and the contact plug so as to be equal to or below twice the target thickness of the insulating film 72f, it is possible to form the insulating structure while partially leaving the insulating film 72f between the electrode and the contact plug which are arranged with the given gap therebetween.

As described above, by setting the gap between the gate electrode 26e and the contact plug cp1 equal to or below the predetermined size, it is possible to selectively leave the insulating film 72f between the gate electrode 26e and the contact plug cp1. As seen with reference to FIG. 42, the insulating structure 72c is located above the n-type impurity region 67n which functions as a part of the charge accumulation region. Accordingly, it is possible to suppress damage on the surface of the n-type impurity region 67n by the etching to take place later. In the meantime, as compared to the above-described manufacturing method explained with reference to FIGS. 36 to 38, this manufacturing method can reduce a lithographic process, so that an advantage of reduction in manufacturing cost can also be obtained.

Thereafter, the impurity is implanted by using the gate electrode 28e and the insulating structure 73 (as well as the insulating layer 70) collectively as a mask. Thus, the n-type impurity regions 68sd are formed on the two sides of the gate electrode 28e. Moreover, the metal silicide layer 28s is formed in a self-aligned manner on the upper surfaces of the second region 68f of the impurity region 68sd and of the gate electrode 28e.

Figure 42:
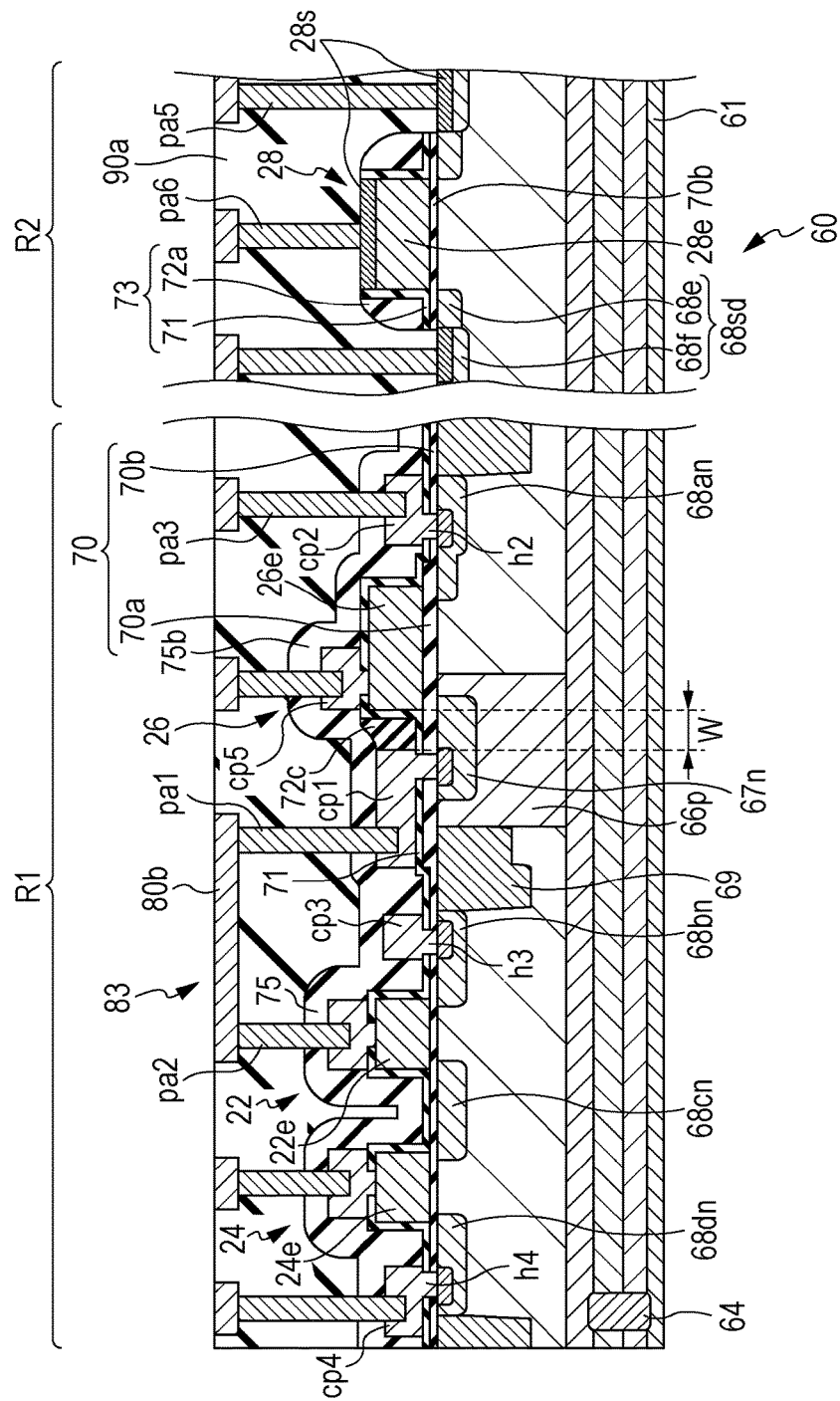
FIG. 42 is a schematic cross-sectional view for explaining the exemplary manufacturing method of an imaging device according to the variation of the third embodiment.

Next, the insulating layer 75 to cover the respective contact plugs is formed selectively on the imaging region R1 (FIG. 42). The insulating layer 75 is a $SiO_2$ layer formed by the CVD, for example. Moreover, the insulating layer 90a is formed by using the CVD, for example. Then, the plugs (typically the metal plugs) connected to the contact plugs, and the wiring layer are formed in the insulating layer 90a. The subsequent processes are substantially the same as those in the above-described embodiments, and description thereof will be omitted. After the above-described processes, the structure shown in FIG. 35 is obtained. The contact holes may be formed in the insulating layer 75 at the positions of the respective contact plugs after the formation of the insulating layer 75 and before the formation of the insulating layer 90a.

(Other Variations)

In the device structures of the respective embodiments described above, the contact hole h2 is formed at the second portion 70b of the insulating layer 70. However, the contact hole h2 may be formed at the first portion 70a of the insulating layer 70. In other words, the relatively thick first portion 70a may cover a greater part of the n-type impurity region 68an.

Figure 43:
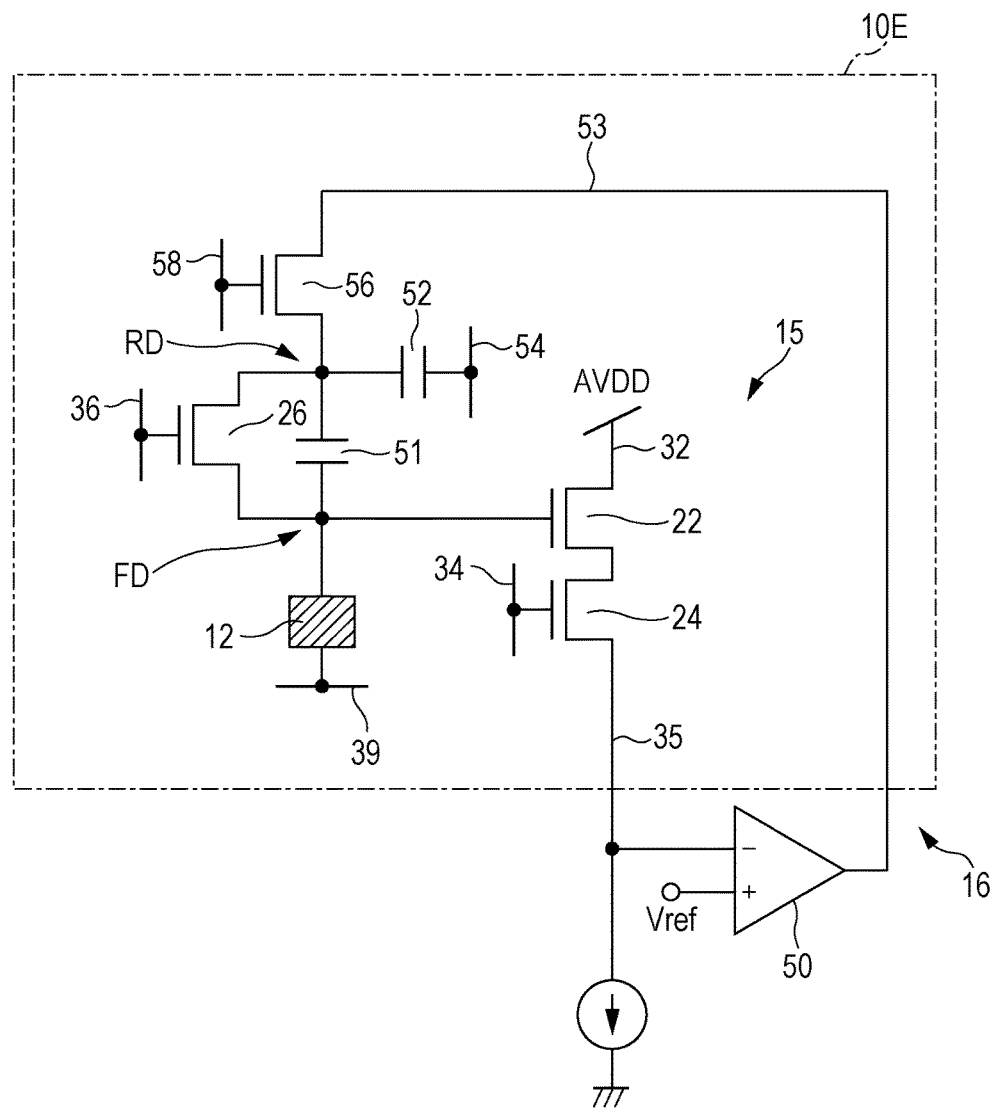
FIG. 43 is a diagram showing a circuit configuration in still another variation of one of the embodiments of the present disclosure.

FIG. 43 shows a circuit configuration of still another variation of one of the embodiments of the present disclosure. For the sake of simplification, FIG. 43 representatively shows one of the imaging cells. An imaging cell 10E shown in FIG. 43 is different from the imaging cell 10A shown in FIG. 2 mainly in that a signal detection circuit 15 in the imaging cell 10E further includes a first capacitance element 51, a second capacitance element 52, and a feedback transistor 56.

In the configuration exemplarily shown in FIG. 43, the signal detection circuit 15 includes the feedback transistor 56 connected between the source of the reset transistor 26 and the feedback line 53. As described later, a feedback path that includes the amplification transistor 22 and the feedback transistor 56 on its path is formed by turning on the feedback transistor 56. Accordingly, the feedback transistor 56 may be regarded as being electrically connected between the source of the reset transistor 26 and the source of the amplification transistor 22. A feedback control line 58 is connected to a gate of this feedback transistor 56. The feedback control line 58 is connected to the vertical scanning circuit 46 (see FIG. 1), for example, and a gate voltage of the feedback transistor 56 is controlled by the vertical scanning circuit 46 when the imaging device is in operation.

In the configuration exemplarily shown in FIG. 43, the signal detection circuit 15 includes the first capacitance element 51 connected between the source and the drain of the reset transistor 26. The first capacitance element 51 has a relatively small capacitance value. In addition, the signal detection circuit 15 includes the second capacitance element 52. Here, one of electrodes of the second capacitance element 52 is connected to a node between reset transistor 26 and the feedback transistor 56. The second capacitance element 52 has a greater capacitance value than that of the first capacitance element 51. The second capacitance element 52 and the feedback transistor 56 can collectively function as an RC filter circuit.

As shown in FIG. 43, the other electrode of the second capacitance element 52 is connected to a sensitivity adjustment line 54. The sensitivity adjustment line 54 is connected to the vertical scanning circuit 46 (see FIG. 1), for example.

An electric potential of the sensitivity adjustment line 54 is set to 0 V (a reference potential), for example, when the imaging device is in operation. In the following, a node between the reset transistor 26 and the second capacitance element 52 may be referred to as a "reset drain node RD" as appropriate.

The feedback path to negatively feed back an output of the imaging cell 10E is formed by controlling the gate voltage on the feedback transistor 56. As described later, the formation of the feedback path makes it possible to cancel kTC noise accompanied by an operation to turn off the reset transistor 26.

The circuit configuration in which the feedback transistor 56 is connected between the reset transistor 26 and the feedback line 53 is beneficial in the light of noise reduction if it is possible to reduce a leakage current on the reset drain node RD. By applying the connection structure similar to that of the charge accumulation node FD to the reset drain node RD as well, the leakage current on the reset drain node RD can be reduced.

Figure 44:
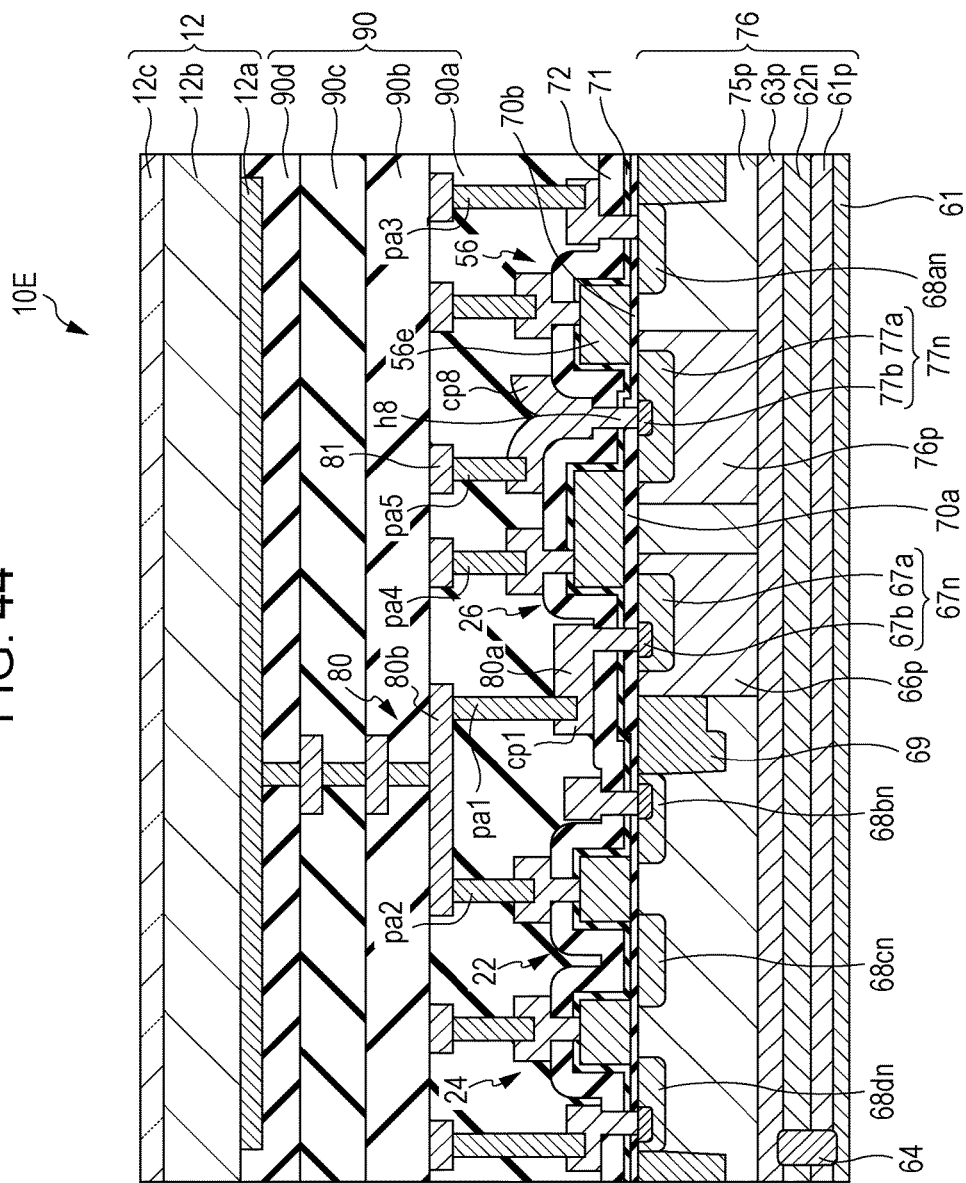
FIG. 44 is a schematic cross-sectional view showing an example of a device structure of an imaging cell shown in FIG. 43.

FIG. 44 shows an example of a device structure of the imaging cell 10E illustrated in FIG. 43. The device structure exemplarity shown in FIG. 44 is substantially the same as that of the first embodiment except for the feedback transistor 56. It is needless to say that the device structure similar to that of the second or third embodiment is also applicable. Note that the structure in the peripheral region R2 may be similar to the structure described with reference to FIG. 5 and the like, and illustration and explanation thereof will be omitted herein.

A semiconductor substrate 76 shown in FIG. 44 includes a p-type semiconductor layer 75p formed on the p-type semiconductor layer 63p. The p-type semiconductor layer 75p includes a p-type impurity region 66p and a p-type impurity region 76p. An impurity concentration of the p-type impurity region 76p may be about the same as that in the p-type impurity region 66p. An n-type impurity region 77n is formed in the p-type impurity region 76p. The n-type impurity region 77n functions as the source region of the reset transistor 26.

The feedback transistor 56 shares the n-type impurity region 77n with the reset transistor 26. The n-type impurity region 77n functions as one of the source region and the drain region of the feedback transistor 56. Here, the n-type impurity region 68an functions as the other one of the source region and the drain region of the feedback transistor 56.

The feedback transistor 56 further includes a gate electrode 56e placed on the insulating layer 70. In this example, the gate electrode 56e is located on a part of the second portion 70b of the insulating layer 70. The gate electrode 56e is typically a polycrystalline silicon layer, which is a layer of the same type as the gate electrode 22e of the amplification transistor 22, the gate electrode 24e of the address transistor 24, and the gate electrode 26e of the reset transistor 26. Of the second portion 70b of the insulating layer 70, a portion sandwiched between the gate electrode 56e and the semiconductor substrate 76 has a function as a gate insulating layer of the feedback transistor 56.

In the example shown in FIG. 44, the n-type impurity region 77n includes a first region 77a and a second region 77b as with the n-type impurity region 67n. The second region 77b is placed in the first region 77a, and has a higher impurity concentration than that of the first region 77a. An impurity concentration of the first region 77a of the n-type impurity region 77n is either about the same as the impurity concentration of the first region 67a of the n-type impurity region 67n or higher than the impurity concentration of the first region 67a. A leakage current tolerance at the reset drain node RD can be set greater than that at the charge accumulation node FD. This is why the impurity concentration of the first region 77a of the n-type impurity region 77n can be set higher than the impurity concentration of the first region 67a. By setting the impurity concentration of the first region 77a higher than the impurity concentration of the first region 67a, it is possible to reduce parasitic capacitance on the source side of the reset transistor 26 and to improve the current driving capability of the reset transistor 26.

In this example, the second region 77b of the n-type impurity region 77n is covered with the relatively thick first portion 70a of the insulating layer 70. The contact hole h8 is formed in the first portion 70a of the insulating layer 70 on the n-type impurity region 77n and at a position overlapping the second region 77b, and the contact plug cp8 is directly connected to the second region 77b of the n-type impurity region 77n via the contact hole h8. Although the formation of the second region 77b having the high impurity concentration in the n-type impurity region 77n is not essential, an effect to reduce contact resistance is obtained by forming the second region 77b in the n-type impurity region 77n.

The contact plug cp8 is the layer of the same type as the other contact plugs cp1 and the like, and is typically made of polycrystalline silicon. The contact plug cp8 is electrically connected to a line 81 through the plug pa5. The line 81 is connected to one of electrodes of the second capacitance element 52 (not shown in FIG. 44, see FIG. 43), the one of the electrodes not being connected to the sensitivity adjustment line 54 (not shown). Here, the line 81 is a part of the wiring layer 80b. Note that the first capacitance element 51 and the second capacitance element 52 may have a metal-insulator-semiconductor (MIS) structure or a metal-insulator-metal (MIM) structure. Adoption of the MIM structure makes it easier to obtain a greater capacitance value.

An upper surface of the contact plug cp8 is not provided with a metal silicide layer, so that the plug pa5 is directly connected to the upper surface of the contact plug cp8. By connecting the plug pa5 directly to the contact plug cp8 without the interposition of the metal silicide layer, it is possible to prevent diffusion of the metal (diffusion of nickel in particular) into the n-type impurity region 77n through the contact plug cp8. In other words, noise in the imaging cell 10E can be suppressed by curbing the occurrence of a leakage current in the reset drain node RD.

Figure 45:
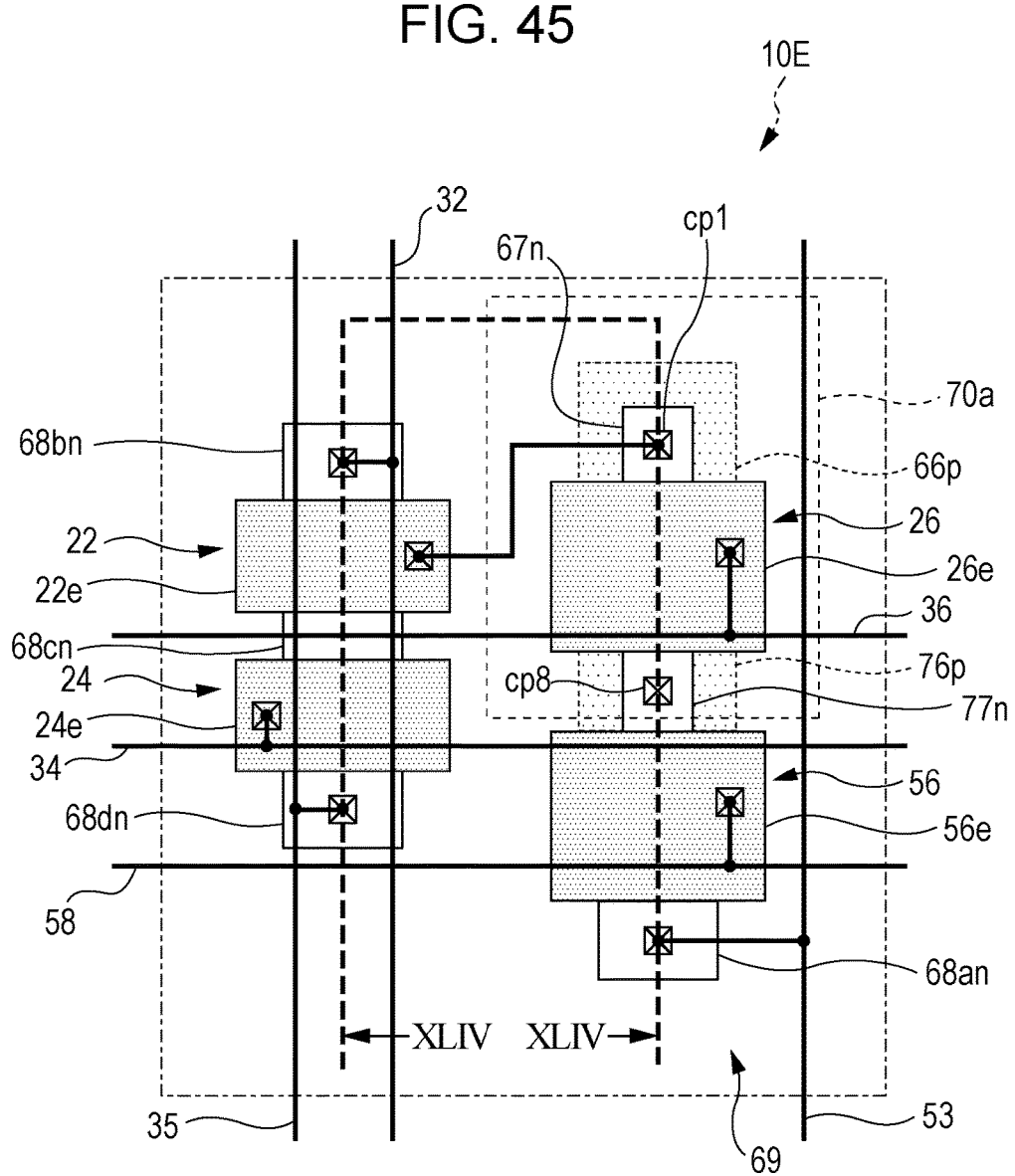
FIG. 45 is a plan view showing an example of a layout of elements in the imaging cell.

FIG. 45 shows an example of a layout of the respective elements in the imaging cell 10E. A cross section shown in FIG. 44 is obtained by cutting and developing the imaging cell 10E along the XLIV-XLIV line in FIG. 45.

In this example, the reset transistor 26 and the feedback transistor 56 are linearly arranged in a vertical direction of the sheet surface. Accordingly, a connecting part (which is the second region 77b of the n-type impurity region 77n in this case) between the contact plug cp8 and the semiconductor substrate 76 is located between the gate electrode 26e of the reset transistor 26 and the gate electrode 56e of the feedback transistor 56 in this example. Note that FIG. 45 is merely a schematic plan view and the shapes and dimensions of the respective impurity regions and of the respective gate electrodes in FIG. 45 do not necessarily reflect their actual shapes and dimensions in a strict sense. The same applies to FIG. 4.

As shown in FIG. 45, here, the relatively thick first portion 70a of the insulating layer 70 placed on the semiconductor substrate 76 spreads to the vicinity of the gate electrode 56e of the feedback transistor 56, thus covering not only a portion above the n-type impurity region 67n and a portion immediately below the gate electrode 26e of the reset transistor 26, but also the n-type impurity region 77n. To be more precise, the first portion 70a of the insulating layer 70 is formed to cover a large part of a portion of a depleted layer emerging on a surface of the semiconductor substrate 76, the depleted layer being formed by a p-n junction between the first region 77a of the n-type impurity region 77n and the p-type impurity region 76p. In this example, the first portion 70a of the insulating layer 70 is formed wide to reach the outside of the n-type impurity region 77n so as to encompass a substantial part of the p-type impurity region 76p as well. The first portion 70a of the insulating layer 70 can be extended to the vicinity of the gate electrode 56e of the feedback transistor 56 to the extent that the first portion 70a does not interfere with the gate electrode 56e.

As described above, as with the charge accumulation node FD, the reset drain node RD can also adopt the structure in which the portion of the insulating layer 70 around the connecting part (which is the second region 77b of the n-type impurity region 77n in this case) between the contact plug cp8 and the semiconductor substrate 76 is formed in the relatively large thickness. By covering the n-type impurity region 77n with the relatively thick first portion 70a of the insulating layer 70 on the semiconductor substrate 76, it is possible to reduce damage on the surface of the semiconductor substrate 76 attributed to various etching processes to be executed after the formation of the insulating layer 70 and damage to a depth of about several hundred nanometers from the surface, as compared to damage in the region covered with the second portion 70b. In consequence, it is possible to obtain an effect to suppress a leakage current attributed to crystal defects in the vicinity of the surface of the n-type impurity region 77n, or in other words, an effect to suppress the leakage current at the reset drain node RD.

Here, an outline of noise cancellation using the formation of the feedback path will be described with reference to FIG. 43 again. In the imaging device having the circuit configuration exemplarily shown in FIG. 43, noise cancellation is executed on each imaging cell on the row basis.

In the circuit configuration exemplarily shown in FIG. 43, the voltage on the feedback line 53 is applied to the charge accumulation node FD by turning on the reset transistor 26 and the feedback transistor 56, whereby the electric potential at the charge accumulation node FD is reset. Next, the reset transistor 26 is turned off.

The kTC noise is generated as a consequence of turning off the reset transistor 26. However, a state in which the feedback path is formed while including the charge accumulation node FD, the amplification transistor 22, the feedback transistor 56, and the first capacitance element 51 on the path continues as long as the feedback transistor 56 is turned on. For this reason, when the feedback path is formed (in other words, when the feedback transistor 56 is not turned off), a signal outputted from the feedback transistor 56 is attenuated by an attenuation circuit formed from the first capacitance element 51 and parasitic capacitance of the charge accumulation node FD. Assuming that capacitance values of the first capacitance element 51 and the parasitic capacitance of the charge accumulation node FD are C1 and Cfd, respectively, then an attenuation rate B in this case is expressed by B=C1/(C1+Cfd).

Next, the feedback transistor 56 is turned off. At this time, for example, a voltage level on the feedback control line 58 is gradually decreased from a high level to a low level so as to cross a threshold voltage for the feedback transistor 56. When the electric potential on the feedback control line 58 is gradually decreased from the high level to the low level, resistance of the feedback transistor 56 is gradually increased. As the resistance of the feedback transistor 56 is increased, an operating band of the feedback transistor 56 is narrowed down and a frequency domain of a signal to be fed back is narrowed down accordingly.

When the voltage on the feedback control line 58 reaches the low level, the feedback transistor 56 is turned off whereby the formation of the feedback path is dismissed. At this time, if the operating band of the feedback transistor 56 is a substantially lower band than the operating band of the amplification transistor 22, then thermal noise generated in the feedback transistor 56 is suppressed to $1/(1+AB)^{1/2}$ times by way of the feedback circuit 16. Here, a value A in the expression represents a gain of the feedback circuit 16. In this way, by turning off the feedback transistor 56 in the state where the operating band of the feedback transistor 56 is sufficiently lower than the operating band of the amplification transistor 22, it is possible to reduce the kTC noise remaining at the charge accumulation node FD. The operating band of the feedback transistor 56 may be appropriately set depending on time allowed for achieving the sufficient noise reduction.

As described above, according to the embodiments of the present disclosure, there is provided the imaging device capable of suppressing an effect caused by a leakage current and thus shooting an image at high image quality. Note that each of the amplification transistor 22, the address transistor 24, the reset transistor 26, the transistor 28 in the peripheral region R2, and the feedback transistor 56 may be either of n-channel MOS or of p-channel MOS. It is not always necessary to form all of these transistors by using either the n-channel MOS or the p-channel MOS only. When the respective transistors in the imaging cells are formed of the n-channel MOS and electrons are used as the signal charges, then the positions of the source and the drain of each transistor may be switched around.

According to the embodiments of the present disclosure, there is provided an imaging device capable of shooting an image at high image quality while suppressing an effect of a dark current. The imaging device of the present disclosure is useful, for example, in an image sensor, a digital camera, and the like. The imaging device of the present disclosure is applicable to a camera for medical use, a camera for a robot, a security camera, an on-board camera for a vehicle, and the like.

What is claimed is:
1. An imaging device comprising:
a semiconductor substrate;
a first insulating layer covering a surface of the semiconductor substrate, the first insulating layer including a first portion and a second portion, a thickness of the first portion being greater than a thickness of the second portion; and
an imaging cell including:
a first transistor including a first gate electrode and a first gate insulating layer, the first gate insulating layer being located between the first gate electrode and the surface of the semiconductor substrate, the first transistor further including a first impurity region in the semiconductor substrate as one of a source and a drain of the first transistor;
a second transistor including a second gate electrode and a second gate insulating layer, the second gate insulating layer being located between the second gate electrode and the surface of the semiconductor substrate; and a photoelectric converter electrically connected to the second gate electrode and the first impurity region, wherein the first portion covers a portion of the first impurity region, the portion being exposed to the surface of the semiconductor substrate, the portion not overlapping the first gate electrode in a plan view, the first gate insulating layer is a part of the first portion, the second gate insulating layer is a part of the second portion, the imaging cell includes, in the semiconductor substrate, a second impurity region adjacent to the first impurity region, a conductive type of second impurity region being different from a conductive type of the first impurity region, and the first portion covers a portion of the second impurity region, the portion being exposed to the surface of the semiconductor substrate.

2. The imaging device according to claim 1, wherein the imaging cell includes a first plug electrically connected to the photoelectric converter, the first plug penetrating the first portion and being directly connected to the first impurity region, the first impurity region includes a first region and a second region, an impurity concentration of the second region being greater than an impurity concentration of the first region, and the first plug is directly connected to the second region.

3. The imaging device according to claim 1, wherein the imaging cell includes a second impurity region in the semiconductor substrate, the first transistor includes the second impurity region as the other of the source and the drain of the first transistor, the first portion covers a portion of the second impurity region, and the second portion covers another portion of the second impurity region.

4. The imaging device according to claim 1, wherein the semiconductor substrate includes an imaging region where the imaging cell is located, and a peripheral region where a peripheral circuit is located, the peripheral circuit being electrically connected to the imaging cell, the peripheral circuit includes a third transistor including a third gate electrode and a third gate insulating layer, the third gate insulating layer being located between the third gate electrode and the surface of the semiconductor substrate, the third transistor further including a second impurity region in the semiconductor substrate as one of a source and a drain of the third transistor, and the third gate insulating layer is a part of the second portion.

5. The imaging device according to claim 1, wherein the imaging cell includes, in the semiconductor substrate, a second impurity region located between the first transistor and the second transistor, second impurity region functioning as an element isolation region, the first portion covers a portion of the second impurity region, the second portion covers another portion of the second impurity region, and an implantation depth of a portion of the second impurity region overlapping the first portion in the plan view is smaller than an implantation depth of a portion of the second impurity region overlapping the second portion in the plan view.

6. An imaging device comprising:

a semiconductor substrate;

a first insulating layer covering a surface of the semiconductor substrate, the first insulating layer including a first portion and a second portion, a thickness of the first portion being greater than a thickness of the second portion; and an imaging cell including:

a first transistor including a first gate electrode and a first gate insulating layer, the first gate insulating layer being located between the first gate electrode and the surface of the semiconductor substrate, the first transistor further including a first impurity region in the semiconductor substrate as one of a source and a drain of the first transistor;

a second transistor including a second gate electrode and a second gate insulating layer, the second gate insulating layer being located between the second gate electrode and the surface of the semiconductor substrate; and a photoelectric converter electrically connected to the second gate electrode and the first impurity region, wherein the first portion covers a portion of the first impurity region, the portion being exposed to the surface of the semiconductor substrate, the first gate insulating layer is a part of the first portion, the second gate insulating layer is a part of the second portion, the imaging cell includes a second impurity region in the semiconductor substrate, the first transistor includes the second impurity region as the other of the source and the drain of the first transistor, the first portion covers a portion of the second impurity region, and the second portion covers another portion of the second impurity region.

7. The imaging device according to claim 6, wherein an implantation depth of a portion of the second impurity region overlapping the first portion in a plan view is smaller than an implantation depth of a portion of the second impurity region overlapping the second portion in the plan view.

8. The imaging device according to claim 6, wherein the imaging cell includes a third impurity region in the semiconductor substrate, the second transistor includes the third impurity region as one of a source and a drain of the second transistor, and an implantation depth of the first impurity region is greater than implantation depths of the second impurity region and the third impurity region.

9. The imaging device according to claim 6, wherein the imaging cell includes a third transistor electrically connected between one of a source and a drain of the second transistor and the other of the source and the drain of the first transistor.

10. The imaging device according to claim 9, further comprising:

an inverting amplifier electrically connected between the third transistor and the other of the source and the drain of the first transistor.

11. The imaging device according to claim 9, wherein an implantation depth of the first impurity region is greater than an implantation depth of the second impurity region.

12. An imaging device comprising:
a semiconductor substrate;
a first insulating layer covering a surface of the semiconductor substrate, the first insulating layer including a first portion and a second portion, a thickness of the first portion being greater than a thickness of the second portion; and
an imaging cell including:
a first transistor including a first gate electrode and a first gate insulating layer, the first gate insulating layer being located between the first gate electrode and the surface of the semiconductor substrate, the first transistor further including a first impurity region in the semiconductor substrate as one of a source and a drain of the first transistor;
a second transistor including a second gate electrode and a second gate insulating layer, the second gate insulating layer being located between the second gate electrode and the surface of the semiconductor substrate; and
a photoelectric converter electrically connected to the second gate electrode and the first impurity region, wherein
the first portion covers a portion of the first impurity region, the portion being exposed to the surface of the semiconductor substrate,
the first gate insulating layer is a part of the first portion,
the second gate insulating layer is a part of the second portion,
the semiconductor substrate includes
an imaging region where the imaging cell is located, and
a peripheral region where a peripheral circuit is located, the peripheral circuit being electrically connected to the imaging cell,
the peripheral circuit includes a third transistor including a third gate electrode and a third gate insulating layer, the third gate insulating layer being located between the third gate electrode and the surface of the semiconductor substrate, the third transistor further including a second impurity region in the semiconductor substrate as one of a source and a drain of the third transistor, and
the third gate insulating layer is a part of the second portion.

13. The imaging device according to claim 12, wherein
at least one of the second impurity region and the third gate electrode includes a metal silicide layer, and
neither the first impurity region nor the first gate electrode includes a metal silicide layer.

14. The imaging device according to claim 12, further comprising: a second insulating layer covering the surface of the semiconductor substrate and the first insulating layer, wherein the second insulating layer includes a third portion spaced from the other portion of the second insulating layer, the third portion covering a side surface of the third gate electrode,
the second impurity region includes a first region and a second region, an impurity concentration of the second region being greater than an impurity concentration of the first region,
the first region is located between the second region and the third gate electrode in a plan view, and
the third portion overlaps the first region in the plan view, the third portion not overlapping the second region and the third gate electrode in the plan view.

15. The imaging device according to claim 14, wherein the second insulating layer includes a fourth portion covering an upper surface and a side surface of the first gate electrode.

16. The imaging device according to claim 15, wherein the imaging cell includes a first plug directly connected to the first gate electrode of the first transistor, wherein
the fourth portion covers an upper surface and a side surface of the first plug.

17. The imaging device according to claim 14, wherein the imaging cell further includes a first plug penetrating the first portion and being directly connected to the first impurity region, wherein
a distance between the first gate electrode and the first plug is equal to or less than twice a thickness of the second insulating layer in a direction perpendicular to the surface of the semiconductor substrate, and
the second insulating layer includes a fourth portion located between the first gate electrode and the first plug in the plan view.

18. The imaging device according to claim 14, further comprising:
an intermediate insulating layer located between the first insulating layer and the second insulating layer, wherein
the intermediate insulating layer is located between the third portion and the third gate electrode, and between the third portion and the first insulating layer.

19. The imaging device according to claim 15, further comprising:
an intermediate insulating layer located between the first insulating layer and the second insulating layer, wherein
the intermediate insulating layer covers an upper surface and a side surface of the first gate electrode.

20. The imaging device according to claim 14, wherein an implantation depth of the second region is greater than an implantation depth of the first region.

* * * * *